United States Patent [19]

Saitoh et al.

[11] Patent Number: 4,572,882

[45] Date of Patent: Feb. 25, 1986

[54] PHOTOCONDUCTIVE MEMBER CONTAINING AMORPHOUS SILICON AND GERMANIUM

[75] Inventors: Keishi Saitoh, Ibaraki; Yukihiko Ohnuki, Kawasaki; Shigeru Ohno, Yokohama, all of Japan

[73] Assignee: Canon Kabushiki Kaisha, Tokyo, Japan

[21] Appl. No.: 647,693

[22] Filed: Sep. 6, 1984

[30] Foreign Application Priority Data

| Sep. 9, 1983 | [JP] | Japan | 58-167073 |
| Sep. 13, 1983 | [JP] | Japan | 58-170380 |
| Nov. 7, 1983 | [JP] | Japan | 58-208812 |
| Dec. 27, 1983 | [JP] | Japan | 58-244739 |
| Dec. 28, 1983 | [JP] | Japan | 58-245302 |
| Dec. 28, 1983 | [JP] | Japan | 58-245306 |

[51] Int. Cl.$^4$ ............................................. G03G 5/082
[52] U.S. Cl. ...................................... 430/57; 430/65; 430/84
[58] Field of Search ................ 430/57, 58, 65, 63, 430/60, 84

[56] References Cited

U.S. PATENT DOCUMENTS 4,452,874  6/1984  Ogawa ............................. 430/63 X

*Primary Examiner*—John D. Welsh
*Attorney, Agent, or Firm*—Fitzpatrick, Cella, Harper & Scinto

[57] ABSTRACT

A photoconductive member is provided which comprises a substrate and a photoconductive light receiving layer made up of an amorphous material containing silicon atoms and germanium atoms, the light receiving layer containing nitrogen atoms and having a first layer region (1), a third layer region (3), and a second layer region (2) of nitrogen atom distribution concentrations C(1), C(3), and C(2), respectively, in the thickness direction, in that order from the substrate side to the opposite side, wherein C(3) is higher than any of C(2) and C(1) and one of C(1) and C(2) is not zero.

74 Claims, 29 Drawing Figures

PHOTOCONDUCTIVE MEMBER CONTAINING AMORPHOUS SILICON AND GERMANIUM

BACKGROUND OF THE INVENTION

1. Field of the Invention

The present invention relates to a photoconductive member which is sensitive to electromagnetic waves such as light (the light herein is in a broad sense including ultraviolet rays, visible rays, infrared rays, X-ray, γ-rays, etc.).

2. Description of the Prior Art

Photoconductive materials forming photoconductive layers in solid-state image pickup devices and in image forming devices, e.g. electrophotographic image forming members and original-reading devices, are required to have characteristics such as high sensitivity, high S/N ratio [photo-current (Ip)/dark current (Ia)], absorption spectral characteristics fitting the spectrum of the electromagnetic waves to be irradiated, quick photoresponsiveness, desired dark resistivity, and safety to human body during use, and further in solid-state pickup devices, easiness of afterimage treatment in a given time. In particular the safety to human body during service is important to the photoconductive materials to be incorporated into electrophotographic appliances for office purposes.

A photoconductive material recently found which possess the above points is amorphous silicon (hereinafter designated as a-Si), which is described for Example, in German Pat. Offen. Nos. 2,746,967 and 2,855,718 as an electrophotographic image forming member and in German Pat. Offen. No. 2,933,411 as applicable to reading devices utilizing a photoelectric conversion type of reader.

However, the prior art photoconductive member having a photoconductive layer formed of a-Si still needs an overall improvement of characteristics including electrical, optical, and photoconductive properties such as dark resistivity, photosensitivity, and photoresponsiveness, environment resistances such as humidity resistance, and stability during passage of time.

For instance, when photoconductive members of a-Si type were used as electrophotographic image forming members, attempts in the past of simultaneous enhancements of photosensitivity and dark resistance often brought about undesirable effects such that; residual potential was frequently observed during service; fatigue accumulated in repeated operations continued for long hours and this led to the appearance of a so-called ghost phenomenon that is the occurrence of an afterimage; and the responsiveness gradually deteriorated in high-speed repeated operations.

In addition, a-Si has a relatively low absorption coefficient for light waves longer than short-side visible light waves. Accordingly, the prior art photoconductive layer made of a-Si is ineffective in utilizing the energy of semiconductor lasers which are in practical use or the longer-wave energy of halogen lamps or fluorescent lamps, when these light sources are used for the irradiation thereof. This is one of the still remaining problems to solve.

Meanwhile, when a large portion of the illuminating light arrives at the substrate (support) of a photoconductive member without being absorbed in the photoconductive layer, light interference due to multiple reflection will take place in the photoconductive layer if the substrate has a high reflectance for the light incident thereupon through the photoconductive layer. This interference is a factor in causing the "unfocused image".

As the irradiation spot is made smaller for the purpose of improving the resolution, the above effect becomes more remarkable. This is a significant problem in particular when a semiconductor laser is employed as a light source.

Moreover, when the photoconductive layer is constituted of a-Si, hydrogen atoms or halogen atoms such as fluorine or chlorine atoms are usually incorporated thereinto for the purpose of improving the electrical and photoconductive properties, and boron atoms, phosphorus atoms, or some other atoms are also incorporated for the purpose of controlling the conduction type, where a problem arises occasionally in the electrical or photoconductive properties of the resulting layer depending upon the manner of the incorporation. For instance, the problem is that photocarriers produced by light irradiation in the resulting photoconductive layer are inadequate in lifetime in this layer or that the injection of electric charge from the substrate side in the dark area is not sufficiently impeded.

Furthermore, in the formation of the photoconductive layer thicker than ten and several mμ, a phenomenon such as the lifting or peeling of the layer from the substrate or cracking in the layer is liable to develop with the time of leaving the product in the air after withdrawal thereof from the vapor-deposition chamber used for the layer formation. This phenomenon is remarkable in particular when the substrate is of a drum type commonly used in the field of electrophotography. Thus the photoconductive member involves problems to be solved with respect to durability.

Accordingly, it is necessary to improve characteristics of a-Si material itself and, on the other hand, to design photoconductive members employing it so as to solve all the problems noted above.

The present invention has been made in view of the above various problems. That is, as a result of intensive studies continued from the general point of view on the adaptability and utility of a-Si for photoconductive members used in electrophotographic image forming members, solid-state image pickup devices, readout devices, etc., it has been found that a photoconductive member provided, according to a specified design as will be described later, with a photoconductive light receiving layer which comprises an amorphous material containing a silicon atom (Si)-germanium atom (Ge) mixture as matrix and hydrogen atoms (H) or/and halogen atoms (X), i.e. a so-called hydrogenated amorphous silicon-germanium, halogenated amorphous silicon-germanium, or halogen-containing hydrogenated amorphous silicon-germanium (hereinafter these materials are generically designated as "a-SiGe(H,X)"), exhibits excellent characteristics for practical use, supasses the prior art photoconductive member in all respects, and in particular has excellent characteristics suitable for electrophotography and exhibits an absorption spectrum favorable for longer waves of light. Based on this finding, the invention has been accomplished.

SUMMARY OF THE INVENTION

The primary object of the invention is to provide a photoconductive member of environment-proof type which has stable electrical, optical, and photoconductive properties scarcely affected by environmental service conditions, superior photosensitivity to longer wavelength of light, and outstanding resistance to light-caused fatigue, does not degrade during repeated service operations, and shows no or little residual potential.

Another object of the invention is to provide a photoconductive member which has high sensitivity to all visible rays and specially to rays from semiconductor lasers, and exhibits quick photo-response.

Another object of the invention is to provide a photoconductive member which has a high quality laminate structure compact and stable wherein all the layers are bonded together with strong adhesion.

Another object of the invention is to provide a photoconductive member which has such good electrophotographic characteristics, exhibiting adequate charge retaining characteristics when charged for electrostatic image formation and almost no deterioration of these characteristics even in a high humidity atmosphere, as to be used very effectively for usual electrophotography.

Another object of the invention is to provide a photoconductive member for electrophotography with which high quality images of high density can be readily obtained with good expression of halftone and with high resolution.

Another object of the invention is to provide a photoconductive member which has high photosensitivity, high S/N ratio, and good electrical contact between the substrate and the photoconductive layer.

According to one aspect of the present invention there is provided a photoconductive member comprising a substrate and a photoconductive light receiving layer comprising an amorphous material containing silicon atoms and germanium atoms, the light receiving layer containing nitrogen atoms and having a first layer region (1), a third layer region (3), and a second layer region (2) of nitrogen atom distribution concentrations C(1), C(3), and C(2), respectively, in the thickness direction, in that order from the substrate side to the opposite side, wherein C(3) is higher than any of C(2) and C(1) and one of C(1) and C(2) is not zero.

According to another aspect of the present invention, there is provided a photoconductive member comprising a substrate and a light receiving layer composed of a layer (G) which, laid on the substrate, comprises an amorphous material containing germanium atoms and a photoconductive layer (S), which, provided on the layer (G), comprises an amorphous material containing silicon atoms, the light receiving layer containing nitrogen atoms and having a first layer region (1), a third layer region (3), and a second layer region (2) of nitrogen atom distribution concentrations C(1), C(3) and C(2), respectively, in the thickness direction, in that order from the substrate side to the opposite side, wherein C(3) is higher than any of C(2) and C(1) and one of C(1) and C(2) is not zero.

According to a further aspect of the present invention, there is provided a photoconductive member comprising a substrate and a light receiving layer consisting of a first layer (I) which comprises an amorphous material containing silicon atoms and germanium atoms and has photoconductivity and a second layer (II) which comprises an amorphous material containing silicon atoms and at least one species of carbon atoms and oxygen atoms, the first layer (I) containing nitrogen atoms and having a first layer region (1), a third layer region (3), and a second layer region (2) of nitrogen atom distribution concentrations C(1), C(3), and C(2), respectively, in the thickness direction, in that order from the substrate side to the opposite side, wherein C(3) is higher than any of C(2) and C(1) and one of C(1) and C(2) is not zero.

According to still another aspect of the present invention, there is provided a photoconductive member comprising a substrate and a light receiving layer comprising a first layer (I) laid on the substrate and a second layer (II) laid on the first layer, the first layer (I) comprises a first layer region (G) which, laid on the substrate, comprises an amorphous material containing germanium atoms and a second layer region (S) which, provided on the first layer region (G), comprises an amorphous material containing silicon atoms and has photoconductivity, the second layer (II) comprising an amorphous material containing silicon atoms and at least one species of carbon atoms and oxygen atoms, the first layer (I) containing nitrogen atoms and having a first layer region (1), a third layer region (3), and a second layer region (2) of nitrogen atom distribution concentrations C(1), C(3), and C(2), respectively, in the thickness direction, in that order from the substrate side to the opposite side, wherein C(3) is higher than any of C(2) and C(1) and at least one of C(1) and C(2) is not zero.

DETAILED DESCRIPTION OF THE PREFERRED EMBODIMENTS

Figure 1:
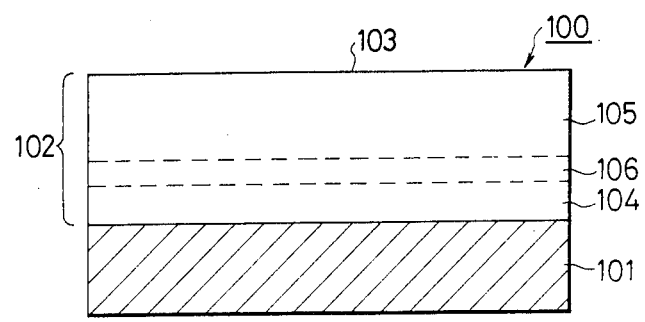
FIGS. 1 and 21-24 are schematic views for illustrating the layer structure of photoconductive members of the invention.

Referring now to the drawings, the photoconductive member of the invention is described in detail.

FIG. 1 is a schematic view for illustrating the layer structure of a photoconductive member as a preferred embodiment of the invention.

The photoconductive member 100 shown in FIG. 1 consists of a substrate 101 for photoconductive member purposes and a photoconductive light receiving layer 102 which is constituted of a-SiGe(H,X) on the substrate 101 and contains nitrogen atoms.

The distribution of germanium atoms in the light receiving layer 102 may be either uniform over the entire region of the layer or nonuniform with respect to the thickness direction though contained in the entire region of the layer. In any case, however, uniform distribution thereof with respect to the directions parallel to the substrate surface is necessary in order to make the properties uniform in those directions. In particular when the distribution nonuniform with respect to the thickness direction is adopted, germanium atoms are incorporated at any concentration in the entire region of the layer and desirably distributed more to either the substrate 101 side or the opposite side (the free surface 103 side).

In the photoconductive member of the invention, the distribution of germanium atoms in the light receiving layer is desirably as stated above with respect to the thickness direction and uniform with respect to the directions parallel to the substrate surface.

The light receiving layer 102 of the photoconductive member 100 shown in FIG. 1 consists of a first layer region (1) 104 wherein the nitrogen distribution concentration C(N), with respect to the layer thickness direction, is C(1), a second layer region (2) 105 wherein the C(N) is C(2), and a third layer region (3)106 wherein the C(N) is C(3).

In the invention, it is unnecessary that nitrogen atoms are contained in all the above first, second, and third layer region, but it is necessary that the distribution concentration C(3) is higher than each of C(1) and C(2) and one of C(1) and C(2) is not zero.

When either the distribution concentration C(1) or C(2) is zero, the light receiving layer 102 has the first layer region (1)104 or the second layer region (2)105 as the nitrogen-free layer region and the third layer region (3)106 as the layer region wherein the distribution concentration C is higher than in the other nitrogen-containing layer region.

When either C(1) or C(2) is zero, the light receiving layer 102 needs to be designed so that the first layer region (1)104 will not contain nitrogen atoms, in order to obtain the effect of impeding the charge injection of from the free surface 103 into the light receiving layer 102 by incorporating a relatively high concentration of nitrogen atoms; on the contrary, the light receiving layer 102 needs to be designed so that the second layer region (2)105 will not contain nitrogen atoms, in order to impede the charge injection from the substrate 101 side into the light receiving layer 102 and improve the adhesion between the substrate 101 and the light receiving layer 102.

When the dark resistance of the light receiving layer 102 is intended to improve while maintaining good photosensitive characteristics thereof, it is desirable that the third layer region (3)106, which has a maximum distribution concentration C(3) among the three layer regions, be set to have a relatively low distribution concentration C(3) and a thickness sufficient for needs.

When the effect of impeding the charge injection is expected chiefly for the third layer region (3)106 by setting the distribution concentration C(3) to a relatively high value, it is desirable that the thickness of the third layer region (3)106 be reduced to such an extent as to achieve the effect of impeding the charge injection sufficiently and at the same time the third layer region (3)106 be formed as close as possible to the free surface 103 of the light receiving layer 102 or to the substrate 101 side thereof.

When the third layer region (3)106 is formed closely to the substrate 101 side, the first layer region (1)104 is formed to be sufficiently thin within the range of needs for the purpose mainly of improving the adhesion between the substrate 101 and the light receiving layer 102.

When the third layer region (3)106 is formed, more closely to the free surface 103, the second layer region (2)105 serves mainly to prevent the third layer region (3)106 from exposing to a high humidity atmosphere.

In the invention, the thickness of each of the first layer region (1) and the second layer region (2) is suitably chosen depending upon the relation thereof to the distribution concentrations C(1) and C(2), respectively. In general, the thickness is desirably 0.003–100$\mu$, preferably 0.004–80$\mu$, particularly preferably 0.005–50$\mu$.

The thickness of the third layer region (3) is also suitably chosen depending upon the relation thereof to the distribution concentration C(3), and is desirably 0.003–80$\mu$, preferably 0.004–50$\mu$, particularly preferably 0.005–40$\mu$.

For providing mainly the function of a charge-injection impeding layer to the third layer region (3), this region is formed closely to the substrate side or to free surface of the light receiving layer and the thickness of the section is controlled not to exceed desirably 30$\mu$, preferably 20$\mu$, particularly preferably 10$\mu$. The thickness of the first layer region (1) when the third layer region (3) is formed closely to the substrate side or the thickness of the second layer region (2) when the third layer region (3) is formed closely to the free surface side is suitably chosen in view of the nitrogen atom distribution concentration C(3) in the third layer region (3) and of the production efficiency, and is controlled not to exceed desirably 5$\mu$, preferably 3$\mu$, particularly preferably 1$\mu$.

In the invention, the maximum value of the nitrogen atom distribution concentration C(3) is desirably 67 atomic %, preferably 50 atomic %, particularly preferably 40 atomic %, based on the total quantity of silicon, germanium and nitrogen atoms contained in the third layer region (3) (hereinafter the total quantity is designated as "T(SiGeN)").

The minimum value of the distribution concentration C(3) is desirably 10 atomic ppm, preferably 15 atomic ppm, particularly preferably 20 atomic ppm, based on the T(SiGeN).

When both the distribution concentrations C(1) and C(2) are higher than zero, the minimum values thereof are each desirably 1 atomic ppm, preferably 3 atomic ppm, particularly preferably 5 atomic ppm, based on the T(SiGeN) contained therein.

FIGS. 2–10 show typical examples of the distribution of germanium atoms, when nonuniform with respect to the thickness direction in the light receiving layer of the photoconductive member according to the invention.

In FIGS. 2 through 10, the abscissa indicates the content C of germanium atoms and the ordinate the layer thickness of the photoconductive light receiving layer, $t_B$ showing the position of the surface of the light receiving layer on the substrate side and $t_T$ the position of the surface of the light receiving layer on the side opposite to the substrate side. That is, layer formation of the light receiving layer containing germanium atoms proceeds from the $t_B$ side toward the $t_T$ side.

Figure 2:
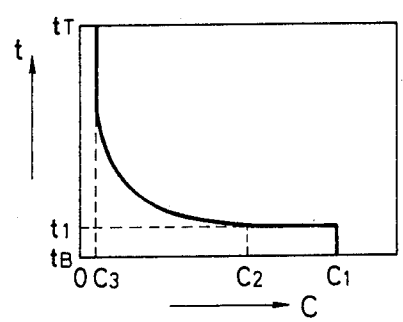
FIGS. 2-10 are illustrations of the distribution of germanium atoms in the light receiving layer and FIGS. 11-20 are those of nitrogen atoms.

In FIG. 2, there is shown a first typical embodiment of the depth profile of germanium atoms in the layer thickness direction in the light receiving layer.

In the embodiment as shown in FIG. 2, from the interface position $t_B$ at which the surface, on which the light receiving layer containing germanium atoms is to be formed, is in contact with the surface of said light receiving layer to the position $t_1$, germanium atoms exist in the formed light receiving layer, while the content C of germanium atoms at a constant value of $C_1$, and the content gradually decreases from the content $C_2$ continuously from the position $t_1$ to the interface position $t_T$. At the interface position $t_T$, the content C of germanium atoms reaches $C_3$.

Figure 3:
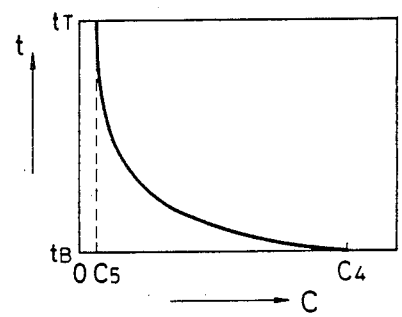

In an embodiment shown in FIG. 3, the content C of germanium atoms decrease gradually and continuously from the position $t_B$ to the position $t_T$ from the content $C_4$ until it reaches the content $C_5$ at the position $t_T$.

Figure 4:
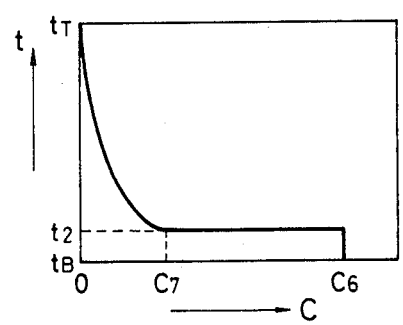

In case of FIG. 4, the content C of germanium atoms is kept at a constant $C_6$ from the position $t_B$ to the position $t_2$, gradually decreases continuously from the position $t_2$ to the position $t_T$, and the content C is substantially zero at the position $t_T$ (substantially zero herein means the content below the detectable limit).

Figure 5:
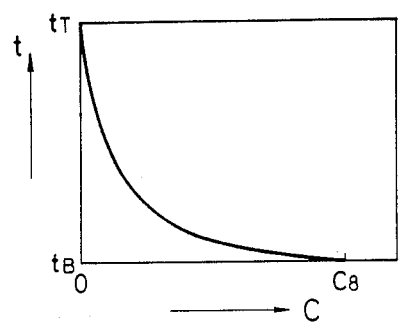

In case of FIG. 5, the content C of germanium atoms decreases gradually and continuously from the position $t_B$ to the position $t_T$ from the content $C_8$, until it reaches substantially zero at the position $t_T$.

Figure 6:
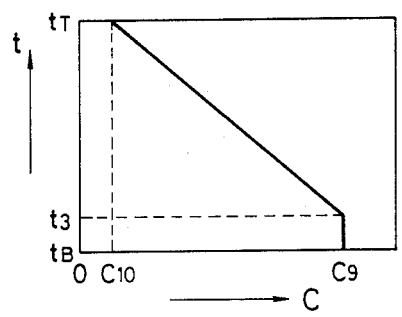

In an embodiment shown in FIG. 6, the content C of germanium atoms is kept at constant $C_9$ between the position $t_B$ and the position $t_3$, and it reaches $C_{10}$ at the position $t_T$. Between the position $t_3$ and the position $t_T$, the content decreases as a first order function from the position $t_3$ to the position $t_T$.

Figure 7:
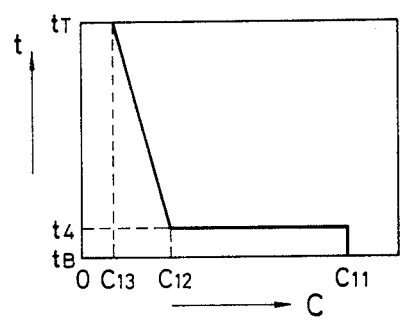

In an embodiment shown in FIG. 7, there is formed a depth profile such that the content C takes constant $C_{11}$ from the position $t_B$ to the position $t_4$, and decreases as a first order function from the content $C_{12}$ to the content $C_{13}$ from the position $t_4$ to the position $t_T$.

Figure 8:
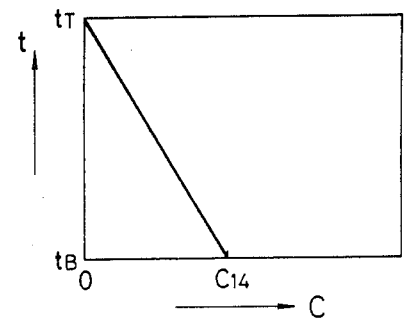

In an embodiment shown in FIG. 8, the content C of germanium atoms decreases as a first order function from the content $C_{14}$ to substantially zero from the position $t_B$ to the position $t_T$.

Figure 9:
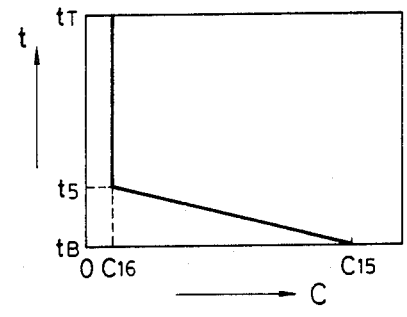

In FIG. 9, there is shown an embodiment, where the content C of germanium atoms decreases as a first order function from the content $C_{15}$ to $C_{16}$ from the position $t_B$ to $t_5$ and is kept at constant content $C_{16}$ beteen the position $t_5$ and $t_T$.

Figure 10:
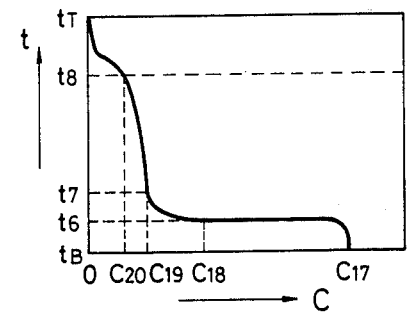

In an embodiment shown in FIG. 10, the content C of germanium atoms is kept at the content $C_{17}$ at the position $t_B$, whose content $C_{17}$ initially decreases gradually and abruptly near the position $t_6$, until it reaches the content $C_{18}$ at the position $t_6$.

Between the position $t_6$ and the position $t_7$, the content C initially decreases abruptly and thereafter gradually, until it reaches the content $C_{19}$ at the position $t_7$. Between the position $t_7$ and the position $t_8$, the content decreases very gradually to the content $C_{20}$ at the position $t_8$. Between the position $t_8$ and the position $t_t$, the content decreases along the curve having a shape as shown in the Figure from the content $C_{20}$ to substantially zero.

As described above about some typical examples of depth profiles of germanium atoms in the light receiving layer in the layer thickness direction by referring to FIGS. 2 through 10, in the preferred embodiment of the present invention, the light receiving layer shown in FIG. 1 has a depth profile so as to have a portion rich in content C of germanium atoms on the substrate side and a portion considerably poor in content C of germanium atoms on the interface $t_T$ side as compared with the substrate side.

The light receiving layer for the photoconductive member in the present invention desirably has a localized region (A) containing germanium atoms preferably in a relatively higher content on the substrate side or on the free surface side to the contrary as described above.

For example, the localized region (A), as explained in terms of the symbols shown in FIG. 2 through FIG. 10, may be desirably provided within the depth of $5\mu$ from the interface position $t_B$.

Said localized region (A) may be made to be identical with the whole layer region ($L_T$) up to the depth of $5\mu$ from the interface position $t_B$, or alternatively a part of the layer region ($L_T$).

Whether the localized region (A) is made a part or whole of the layer region ($L_T$) depends on the characteristics required for the amorphous layer to be formed.

The localized region (A) may preferably be formed according to such a layer formation that the maximum value Cmax of the content of germanium atoms existing in the layer thickness direction may preferably be 1000 atomic ppm or more, more preferably 5000 atomic ppm or more, and most preferably $1 \times 10^4$ atomic ppm or more on the basis sum total with silicon atoms and germanium atoms.

That is, the light receiving layer containing germanium atoms is formed so that the maximum value Cmax of the content C may exist within a layer thickness of $5\mu$ from the substrate side (the layer region within the depth of $5\mu$ from $t_B$).

The content of germanium atoms in the light receiving layer 102 of the photoconductive member 100 shown in FIG. 1 is suitably chosen so that objects of the invention will be achieved effectively. In general, the content is desirably $1-9.5 \times 10^5$ atomic ppm, preferably $100-8 \times 10^5$ atomic ppm, particularly preferably $500-7 \times 10^5$ atomic ppm, based on the total quantity of silicon atoms and germanium atoms.

When germanium atoms are distributed continuously over the entire region of the light receiving layer and the concentration thereof decreases in the direction from the substrate side to the free surface side of the layer or in the reverse direction, the light receiving layer having required characteristics can be obtained as desired by suitable design of the germanium distribution curve in the thickness direction.

For instance, with a design of the distribution curve such that the germanium distribution concentration C in the light receiving layer is elevated sufficiently on the substrate side and lowered as far as possible on the free surface side, it becomes possible to improve the sensitivity to light, including visible rays, of from relatively short to relatively long wavelengths and additionally to prevent coherent rays such as laser light effectively from interference.

Moreover, by increasing the germanium distribution concentration C extremely in the substrate-side interfacial part of the light receiving layer, as will be described later, a laser beam of longer wavelength, when used for irradiation, which cannot sufficiently be absorbed in the region on the layer beam incident side of the light receiving layer can be absorbed almost completely in said substrate-side region to achieve the effective prevention of the interference which will be caused by the reflection from the interface between the substrate and the light receiving layer.

In the photoconductive member of the invention, nitrogen atoms are incorporated into the light receiving layer 102 for the purpose of impeding the charge injection from the free surface of the light receiving layer 102 as well as enhancing the photosensitivity and the dark resistance. Nitrogen atoms may be contained either in the entire region of the light receiving layer 102 or only in some of the layer regions thereof, so long as it satisfies the requirements described above.

In the invention, the nitrogen atom distribution concentration C(N), although nonuniform throughout the whole thickness of the light receiving layer, is uniform through the thickness of each of the first, second, and third layer regions. FIGS. 11-20 show typical examples of the distribution of nitrogen atoms through the whole thickness of the light receiving layer 102. In these figures, the nitrogen atom distribution concentration C(N) is plotted as abscissa and the distance from the substrate 101-side surface of the light receiving layer 102 is plotted as ordinate. On the ordinate, the point $t_B$ denotes the position of the substrate 101-side surface of the light receiving layer 102 and the point $t_T$ denotes the position of the surface opposite to $t_B$, of the light receiving layer 102. That is, the light receiving layer 102 has been grown from the $t_B$ side toward the $t_T$ side.

Figure 11:
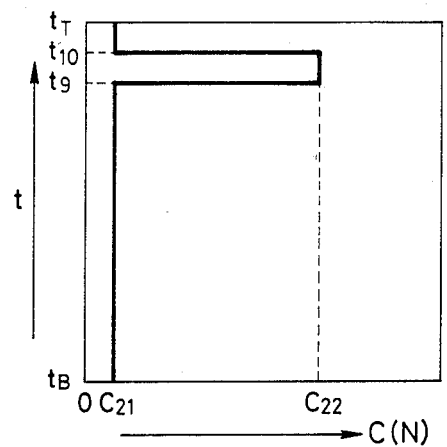

In the case of FIG. 11, the nitrogen atom distribution concentration C(N) is kept at $C_{21}$ from to $t_9$, increased there to $C_{22}$, kept as such to $t_{11}$, decreased there to the initial value of $C_{21}$, and kept as such to $t_T$.

Figure 12:
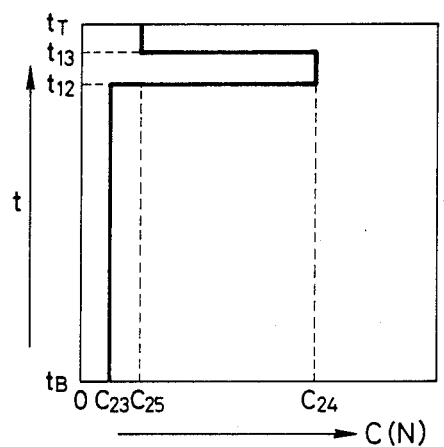

In the case of FIG. 12, the concentration C(N) is kept at $C_{23}$ from $t_B$ to $t_{12}$, increased there to $C_{24}$, kept as such to $t_{13}$, decreased there to $C_{25}$, and kept as such to $t_T$.

Figure 13:
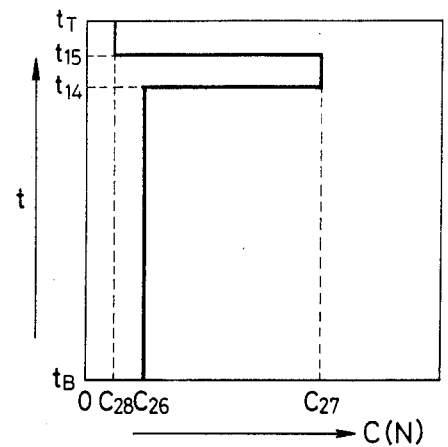

In the case of FIG. 13, the concentration C(N) is kept at $C_{26}$ from $t_B$ to $t_{14}$, increased there to $C_{27}$ kept as such to $t_{15}$, decreased there to $C_{28}$, which is lower than the initial value $C_{26}$, and kept as such to $t_T$.

Figure 14:
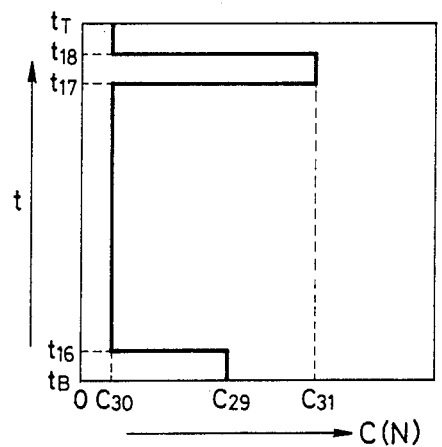

In the case of FIG. 14, the concentration C(N) is kept at $C_{29}$ from $t_B$ to $t_{16}$, decreased there to $C_{30}$, kept as such to $t_{17}$, increased there to $C_{31}$, kept as such to $t_{18}$, decreased there to the second stage value of $C_{30}$, and kept as such to $t_B$.

Figure 15:
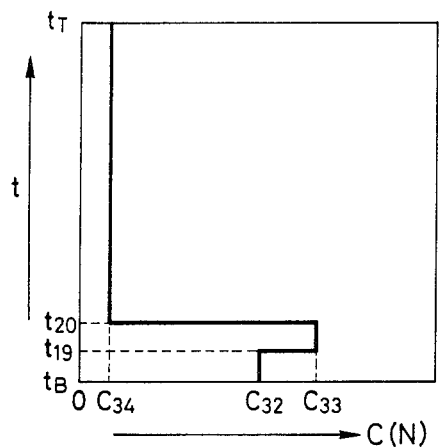
Figure 17:
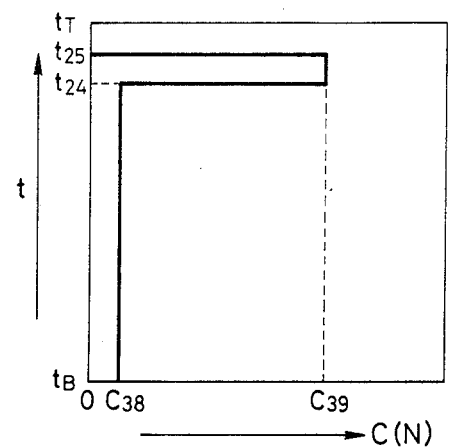
Figure 16:
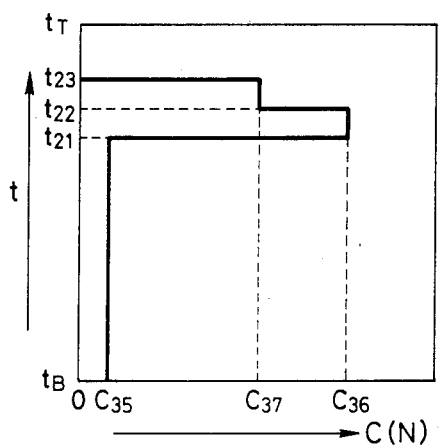
Figure 18:
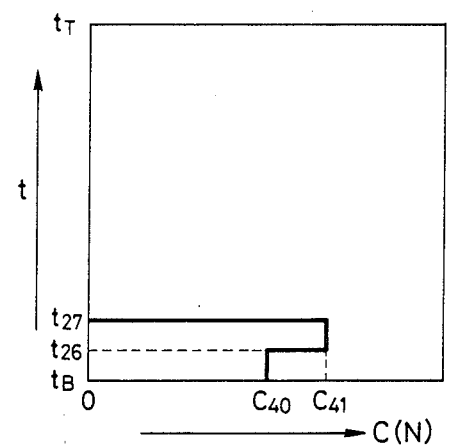
Figure 19:
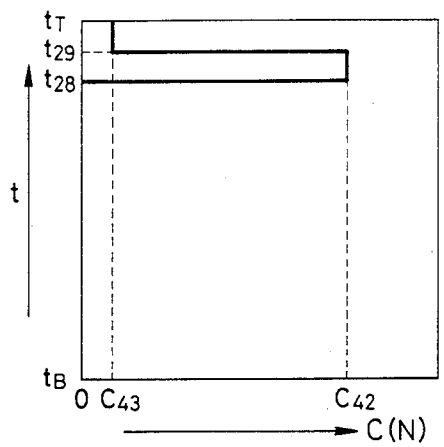
Figure 20:
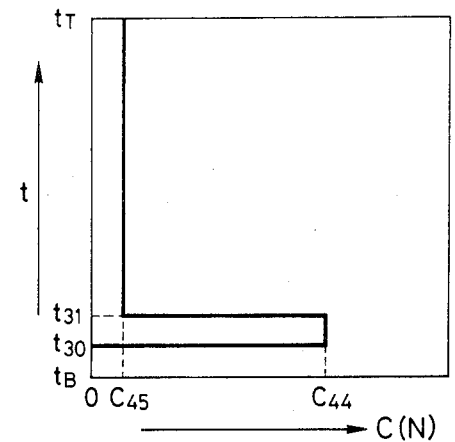

In the case of FIG. 15, layer regions of high concentrations C(N) are formed in the light receiving layer 102 on the substrate 101 side. With such distribution of nitrogen atoms, the charge injection from the substrate 101 side, in the case of the charging treatment, can be impeded effectively and at the same time the adhesion between the substrate 101 and the light receiving layer 102 can be improved.

Moreover, in the case of FIG. 15, nitrogen atoms are incorporated at a lower concentration in the layer region between $t_{20}$ and $t_T$ to more improve the dark resistance without deteriorating the photosensitivity.

In the cases of FIGS. 16–20, a nitrogen-free layer region is formed in the light receiving layer 102 on the substrate 101 side or on the opposite side.

In the invention, the nitrogen-containing layer region (N) (at least two layer regions of the above-said first, second and third layer regions) is formed to occupy the entire region of the light receiving layer 102 when improvements of the photosensitivity and dark resistance are main objects, to occupy the neighborhood of the free surface of the light receiving layer 102 when the empediment of the charge injection of from the free surface is the main object, and to occupy the substrate 101-side interfacial part in the light receiving layer 102 when the enhancement of the adhesion between substrate 101 and the light receiving layer 102 is the main object.

It is desirable that the nitrogen atom content in said layer region (N) in the above first case be controlled on a relatively low level so as to maintain a high photosensitivity, said content in the second case be on a relatively high level so as to impede the charge injection of from the free surface of the light receiving layer 102, and said content in the last case be on the relatively high level so as to ensure the strong adhesion to the substrate 101.

Simultaneous achievements of the above three can be accomplished by distributing nitrogen atoms at a relatively high concentration in the substrate 101 side, at a relatively low concentration in the middle layer region, and at a high concentration in the superficial region on the free surface side of the light receiving layer 102.

For the purpose of impeding the charge injection of from the free surface, it is desirable as stated above to form a layer region (N) of high nitrogen distribution concentration C(N) in the free surface side.

In the invention, the nitrogen atom content in a layer region (N) formed in the light receiving layer 102 can be suitably chosen by considering the organic relation with such characteristics as those required for the layer region itself and those on the contact interface when the layer region (N) is formed to contact the substrate 101 directly.

When some other layer region is formed to contact said layer region (N) directly, the nitrogen atom content therein is suitably chosen by considering also the relations to characteristics of this other layer region and to characteristics of the layer region (N) on the interface between the two layer regions.

In brief, the nitrogen atom content in the layer region (N) is suitably chosen according to characteristics required for the photoconductive member. In general, the content is desirably 0.001–50 atomic %, preferably 0.002–40 atomic %, particularly preferably 0.003–30 atomic %, based on the T(SiGeN).

In this invention, when the layer region (N) occupies the entire light receiving layer 102, or when the proportion of the thickness $T_o$ of the layer region (N) is sufficiently large relative to the thickness of light receiving layer 102, the maximum content of nitrogen atoms contained in the layer region (N) is desired to be sufficiently lower than the above mentioned value.

In this invention, when the thickness $T_o$ of the layer region (N) is more than 2/5 of the thickness of the light receiving layer, the upper limit of the nitrogen atom content is preferably not more than 30 atomic %, more preferably not more than 20 atomic %, and most preferably 10 atomic %.

In the invention, the nitrogen-containing layer region (N) in the light receiving layer is desirably formed as a localized region (B) that contains nitrogen atoms in a relatively high concentration, on the substrate 101 side or in the neighborhood of the free surface as stated above. In the former case, it is possible to further improve the adhesion between the substrate 101 and the light receiving layer 102, and the acceptable potential.

Illustrating by using notations shown in FIGS. 11–20, the localized region (B) is desirably formed within the distance of 5μ from the interface $t_B$ or the free surface $t_T$.

In the invention, the localized region (B) may be all or a part of the layer region ($L_T$) 5μ thick from the interface $t_B$ or the free surface $t_T$. The choice of whether all or a part of the layer region ($L_T$) is occupied by the localized region (B) depends upon characteristics required for the light receiving layer 102 to be formed.

The light receiving layer 102 is formed desirably so that the maximum value $C_{max}$ of the thickness-directional distribution concentration C(N) of nitrogen atoms in the localized region (B) will become at least desirably 500 atomic ppm, preferably 800 atomic ppm, particularly preferably 1000 atomic ppm.

Thus it is desirable to form the nitrogen-containing layer region (N) so that the maximum distribution concentration $C_{max}$ will be placed within the distance of 5μ from the substrate 101-side surface or the free surface (within a layer region 5μ thick from $t_B$ to $t_T$).

In the invention, examples of the halogen atoms (X), if necessary, incorporated into the light receiving layer 102 are fluorine, chlorine, bromine, and iodine atoms, among which fluorine and chlorine atoms are preferred.

In the photoconductive member 100 shown in FIG. 1, electroconductive properties of the light receiving layer 102 can be controlled as desired by incorporating thereinto a substance (C) which controls electroconductive properties.

Such substances (C) are "impurities" so-called in the field of semiconductors. The impurities in the invention include p-type impurities that give p-type semiconductor characteristics to the a-SiGe(H, X) constructing the light receiving layer 102 and n-type impurities that give n-type semiconductor characteristics thereto. Suitable p-type impurities for use in the invention include elements of group III of the periodic table (group III atoms), e.g. B(boron), Al(aluminum), Ga(gallium), In-(indium), and Tl(thallium), among which B and Ga are particularly suited.

Suitable n-type impurities for use in the invention include elements of group V of the periodic table, e.g. P(phosphorus), As(arsenic), Sb(antimony), and Bi(bismuth), among which P and As are particularly suited.

The content of the substance (C) controlling electroconductive properties in the light receiving layer 102 is suitably chosen by considering the organic relation with characteristics such as electroconductive properties requested for the light receiving layer 102 and characteristics of the layer on the interface where the layer contacts the substrate 101.

When a substance (C) controlling electroconductive properties is localized in an intended layer region of the light receiving layer 102, particularly in the substrate 101-side interfacial part of the light receiving layer 102, the content of the substance (C) therein is suitably chosen by considering also the relation to characteristics of the other layer region formed to be in direct contact with said layer region and the relation to characteristics thereof on this contact interface.

In the invention, the content of the substance (C) controlling electroconductive properties in the light receiving layer is desirably $0.01-5\times10^4$ atomic ppm, particularly preferably $1-5\times10^3$ atomic ppm.

It is desirable to locally incorporate the substance (C) controlling electroconductive properties in some layer region particularly in the substrate 101-side interfacial region, of the light receiving layer 102 in an amount of at least desirably 30 atomic ppm, preferably 50 atomic ppm, particularly preferably 100 atomic ppm.

In particular, by incorporating the substance (C) in at least the above quantity in said substrate 101-side interfacial region (E), it become possible to impede effectively, when the incorporated substance (C) is a p-type of impurity, the injection of electrons from the substrate 101-side into the light receiving layer 102 where the free surface 103 of the layer 102 is positively charged, and when the incorporated substance (C) is an n-type of impurity, the injection of holes from the substrate 101 side into the light receiving layer 102 where the free surface 103 of the layer is negatively charged.

When a substance (C) of p- or n-type is thus incorporated in the substrate side interfacial region (E), the other layer region (Z) of the light receiving layer 102 is allowed to contain another substance (C) of the reverse polarity type or a substance (C) of the same polarity type in a far less amount than in the interfacial region (E).

In such cases, the content of the substance (C) in the other region (Z) is suitably chosen depending upon the polarity and content of the substance (C) contained in the superficial region (E), and is desirably 0.001–1000 atomic ppm, preferably 0.05–500 atomic ppm, particularly preferably 0.1 to 200 atomic ppm.

When substances (C) of the same polarity type are incorporated in the interfacial region (E) and the other layer region (Z) respectively, the content in the layer region (Z) is desired to be not more than 30 atomic ppm. Another example of mode of distributing the substance (C) is that a layer region containing a substance (C) and another layer region containing a substance (C) of the reverse polarity type are arranged in the light receiving layer 102 so as to contact each other directly, thereby forming a so-called depletion layer on the contact interface. For instance, a layer region containing the above cited p-type impurity and another layer region containing the above cited n-type impurity are laid to contact each other directly, thereby forming a so-called p-n junction to provide a depletion layer.

In the invention, the light receiving 102 consisting of a-SiGe(H,X) is formed according to a vacuum deposition method, for example, glow discharge method, sputtering method, or ion plating method, which utilizes an electric discharge phenomenon. For instance, the formation of the light receiving layer 102 consisting of a-SiGe(H,X) can be accomplished by; feeding a silicon atom (Si)-supplying gas and a germanium atom (Ge)-supplying gas as basic raw material and if necessary, a hydrogen atom (H)-supplying gas or/and a halogen atom (X)-supplying gas into a deposition chamber that can be evacuated, to an intended pressure; and generating a glow discharge in the deposition chamber to deposit a-SiGe(H,X) on the prescribed substrate placed in advance on a definite position. For incorporating germanium atoms in a nonuniform distribution state, the layer consisting of a-SiGe(H,X) is formed while controlling the distribution concentration of germanium atoms according to an intended distribution curve. With a sputtering method, the light receiving layer 102 is formed by setting a target made of Si, two targets made of Si and Ge respectively, or a target made of Si-Ge mixture in a sputtering deposition chamber; feeding a Ge-supplying gas diluted if necessary with an inert gas, e.g. Ar or He, and if necessary a hydrogen-introducing gas or/and a halogen-introducing gas into the deposition chamber; and forming an intended gas plasma. The light receiving layer 102 having an intended distribution state of germanium atoms can be formed by sputtering the target while controlling the flow of Ge-supplying gas feed according to a predetermined concentration distribution curve.

With the ion plating method, the light receiving layer 102 can be formed in the same manner as with the sputtering method except that a polycrystalline or single-crystalline silicon and a polycrystalline or single-crystalline germanium are placed as vapour sources in vapor-deposition purpose boats, respectively and the vapor sources are heated and evaporated by resistance heating or the electron beam method (EB method) to pass the resulting vapor through an intended plasmic atmosphere.

Suitable materials for the Si-supplying gas used in the invention are hydrogenated silicons (silanes) gaseous or gasifiable, for example, $SiH_4$, $Si_2H_6$, $Si_3H_8$, and $Si_4H_{10}$. In particular, $SiH_4$ and $Si_2H_6$ are preferred in that these are easy to handle for the layer formation and exhibit high efficiency for Si supply.

Suitable materials for the Ge-supplying gas are hydrogenated germaniums gaseous or gasifiable, for example, $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, and $Ge_9H_{20}$. In particular, $GeH_4$, $Ge_2H_6$, and $Ge_3H_8$ are preferred in that these are easy to handle for the layer formation and exhibit high efficiency for Ge supply.

Effective materials as the halogen-introducing gas used in the invention include various halogen compounds gaseous or gasifiable, for example, halogen gases, halogenated compounds, interhalogen compounds, and halogen-substitution derivatives of silanes.

Further, halogen-containing hydrogenated silicon compounds gaseous or gasifiable, which have silicon and halogen as constituent atoms, can also be used as effective halogen-introducing materials in the invention.

Individual examples of the halogen compounds suitable for use in the invention are halogen gases of fluorine, chlorine, bromine, and iodine and interhalogen compounds such as $BrF$, $ClF$, $ClF_3$, $BrF_5$, $BrF_3$, $IF_3$, $IF_7$, $ICl$, and $IBr$.

Suitable examples of the halogen-containing silicon compound, i.e. the halogen-substitution derivative of silane, are silicon halides such as $SiF_4$, $Si_2F_6$, $SiCl_4$, and $SiBr_4$.

When such a halogen-containing silicon compound is used together with a Ge-supplying gas for producing the photoconductive member characteristic of the invention by glow discharge, the light receiving layer consisting of a halogen-containing a-SiGe can be formed on an intended substrate without special use of hydrogenated silicon (silane) as an Si-supplying gaseous raw material.

The basic way to form the halogen-containing light receiving layer on an intended substrate by the glow discharge method comprises feeding, for example, a silicon halide as an Si-supplying gas, a hydrogenated germanium as a Ge-supplying gas, and a diluent gas such as Ar, $H_2$, or He in a predetermined mixing proportions and at predetermined flow rates into a deposition chamber, and generating a glow discharge to form a plasmic atmosphere of these gases. In this case, hydrogen gas or a hydrogen-atom-containing gaseous silicon compound can be added in a suitable proportion to the above gas mixture for easier control of the content of hydrogen atoms to be introduced in the light receiving layer.

Each of the above gaseous raw materials may be either a single compound or mixture of plural compounds.

According to either of the sputtering method and the ion plating method, the introduction of halogen atoms into the layer to be formed can be accomplished by feeding the above cited halogen compound or halogen-atom-containing silicon compound in gaseous form into a deposition chamber and forming a plasmic atmosphere of the gas.

The introduction of hydrogen atoms into the layer to be formed can be accomplished by feeding a hydrogen-atom-introducing gaseous material, e.g. $H_2$ or the above cited silane or/and hydrogenated germanium, into a deposition chamber for sputtering purposes, and forming a plasmic atmosphere of the gas.

While the above cited halogen compounds or halogen-containing silicon compounds can be effectively used in the invention, as halogen-atom introducing feed gas, the following gaseous or gasifiable compounds can also be exemplified as effective raw materials for the light receiving layer. That is; halogenated compounds containing at least one hydrogen atom as a constituent including; hydrogen halides such as $HF$, $HCl$, $HBr$, and $HI$; halogen-substituted silanes such as $SiH_2F_2$, $SiH_2I_2$, $SiH_2Cl_2$, $SiHCl_3$, $SiH_2Br_2$, and $SiHBr_3$; and hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, and $GeH_3I$; and germanium halides such as $GeF_4$, $GeCl_4$, $GeBr_4$, $GeI_4$, $GeF_2$, $GeCl_2$, $GeBr_2$, and $GeI_2$.

Of these compounds, the halogenated compounds containing at least one hydrogen atom can be used as favorable halogen-introducing raw materials in the invention, since these halogenated compounds serve to introduce hydrogen atoms, which are effective for controlling electrical or photoelectric properties of the light receiving layer, together with halogen atoms into the layer.

The introduction of hydrogen atoms as a constituent into the light receiving layer can also be performed by feeding; a silane such as $SiH_4$, $Si_2H_6$, $Si_3H_8$, or $Si_4H_{10}$; germanium, a germanium compound, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, or $Ge_9H_{20}$, for supplying Ge; and silicon or a silicon compound, for supplying Si; into a deposition, and generating therein an electric discharge.

In preferred embodiments of the invention, the content of hydrogen atoms (H), the content of halogen atoms (X), or the combined content of hydrogen atoms and halogen atoms (H+X), in the light receiving layer 102 of the photoconductive member is desirably 0.01–40 atomic %, preferably 0.05–30 atomic %, particularly preferably 0.1–25 atomic %.

The control of content of hydrogen atoms or/and halogen atoms in the light receiving layer 102 can be accomplished by controlling, for instance, the substrate temperature, the quantity of a starting material fed into the deposition chamber for incorporating hydrogen atoms or/and halogen atoms into the layer 102, and the electric discharge power.

In the invention, the formation of the layer region (N) containing nitrogen atoms in the light receiving layer 102 can be accomplished by feeding a nitrogen-atom-introducing raw material along with the above stated other raw materials, during the formation of the light receiving layer 102, while controlling the quantity of nitrogen atoms to be introduced in the layer.

When the glow discharge method is applied for the formation of the layer region (N), a nitrogen-atom-introducing starting material is added to the other starting material properly selected from the above cited materials suitable for the formation of the light receiving layer. For this nitrogen-atom-introducing raw material, there can be used most of the gaseous or gasifiable compounds containing at least one nitrogen atom as a constituent atom.

For the nitrogen atom introduction, it is possible to use, for example, (1) a starting gas containing silicon (Si) as a constituent atom, a starting gas containing nitrogen (N) as a constituent atom, and if necessary, a starting gas containing hydrogen (H) or/and halogen (X) as constituent atoms, in intended mixing proportions; or (2) a starting gas containing silicon (Si) as a constituent atom and a starting gas containing nitrogen (N) and hydrogen (H) as constituent atoms in intended mixing proportions; or (3) a starting gas containing silicon (Si) as a constituent atom and a starting gas containing silicon (Si), nitrogen (N), and hydrogen (H) as constituent atoms in intended proportions.

Alternatively, it is possible to use a mixture of a starting gas containing silicon (Si) and hydrogen (H) of constituent atoms and a starting gas containing nitrogen (N) as a constituent atom.

Effective starting materials for introducing nitrogen atoms (N) to form the layer region (N) are nitrogen compounds constituted of N atom or N and H atoms such as gaseous nitrogen and gaseous or gasifiable nitrides and azides, e.g. nitrogen ($N_2$), ammonia ($NH_3$), hydrazine ($H_2N.NH_2$), hydrogen azide ($HN_3$), and ammonium azide ($NH_4N_3$). Besides these compounds, nitrogen halides such as nitrogen trifluoride ($F_3N$) and dinitrogen tetrafluoride ($F_4N_2$) can be exemplified as starting materials which can introduce halogen atoms (X) in addition to nitrogen atoms (N).

In the invention, oxygen atoms in addition to nitrogen atoms can be incorporated into the layer region (N) for the purpose of further enhancement of the effect which can be obtained with nitrogen atoms. Suitable compounds for introducing oxygen atoms into the layer region (N) include, for example, oxygen ($O_2$), ozone ($O_3$), nitrogen monoxide (NO), nitrogen dioxide ($NO_2$), nitrogen suboxide ($N_2O$), dinitrogen trioxide ($N_2O_3$), dinitrogen tetraoxide ($N_2O_4$), dinitrogen pentoxide ($N_2O_5$), nitrogen trioxide ($NO_3$), and lower siloxanes, which contain silicon, oxygen, and hydrogen as constituent atoms, such as disiloxane ($H_3SiOSiH_3$) and trisiloxane ($H_3Si.O.SiH_2.O.SiH_3$).

The formation of the layer regin (N), according to the sputtering method, can be accomplished by using a wafer of single crystalline or polycrystalline silicon, a wafer of $Si_3N_4$, or a wafer of Si-$Si_3N_4$ mixture and sputtering the target material in a suitable atmosphere.

For instance, when an Si wafer is used as target, the sputtering is carried out as follows: Gaseous raw materials for introducing nitrogen atoms and if necessary, hydrogen atoms or/and halogen atoms, diluted with an inert gas as required, are fed into a suitable deposition chamber, and a plasma of these gases is formed there to sputter the Si wafer.

Alternatively, when Si and $Si_3N_4$ are used separately as targets or an Si-$Si_3N_4$ mixture is used as one target, the sputtering is carried out in an atmosphere or suitable diluent gas or of a gas containing hydrogen (H) or/and halogen (X) as constituent atoms.

In the case of sputtering, the above cited gaseous starting materials suitable, in the case of glow discharge, for introducing nitrogen atoms can also be used effectively.

When the light receiving layer having a nitrogen-layer region (N) is formed in the invention, an intended nitrogen atom distribution in the thickness direction (depth profile) wherein the nitrogen atom concentration is varied stepwise in the thickness direction can be formed, in the case of glow discharge, by feeding a nitrogen-introducing gaseous starting material into a deposition chamber while varying the gas flow according to the intended depth profile.

The regulation of the gas flow can be performed, for instance, by varying suitably the opening of a given needle valve fitted in the gas flow line, in some way commonly used, e.g. manual operation or driving with an external motor.

When the layer region (N) is formed by sputtering, the first way to form an intended stepwise depth profile is to feed a nitrogen-introducing gaseous raw material into a deposition chamber, similarly to the case of glow discharge, while varying the gas flow according to the intended depth profile.

The second way is to use a target for sputtering, for example, a target of Si-$Si_3N_4$ mixture in which the mixing ratio of Si/$Si_3N_4$ has been varied previously in the thickness direction according to an intended depth profile.

The introduction of a substance (C) for controling electroconductive properties, for example, atoms of a group III or V element, as a constituent in the light receiving layer 102 can be performed by feeding a starting material for introducing atoms of a group III or V element, in gaseous form, into a deposition chamber along with some other starting material gas necessary to form the light receiving layer 102. Such starting materials for the introduction of group III atoms are desired to be gaseous at ordinary temperature and pressure or at least readily gasifiable under the conditions of the layer formation. Suitable compounds for introducing group III atoms include, for example, boron hydrides such as $B_2H_6$, $B_4H_{10}$, $B_5H_9$, $B_5H_{11}$, $B_6H_{10}$, $B_6H_{12}$, and $B_6H_{14}$ and boron halides such as $BF_3$, $BCl_3$, and $BBr_3$, for introducing boron, and $AlCl_3$, $GaCl_3$, $Ga(CH_3)_5$, $InCl_3$, and $TlCl_3$.

Suitable compounds for introducing group V atoms, used in the invention, include, for example, hydrogen phosphides such as $PH_3$ and $PH_2H_4$ and phosphorus halides such as $PH_4I$, $PF_3$, $PF_5$, $PCl_3$, $PCl_5$, $PBr_3$, $PBr_5$, and $PI_3$, for introducing phosphorus, and $AsH_3$, $AsF_5$, $AsCl_3$, $AsBr_3$, $AsF_5$, $SbH_3$, $SbF_3$, $SbF_5$, $SbCl_3$, $SbCl_5$, $BiCl_3$, and $BiBr_5$, for introducing other atoms of group V.

In the invention, the thickness of a layer region which contain a substance (C) for controlling electroconductive properties and is localized on the substrate 101 side in the light receiving layer 102 is stuitably chosen depending upon characteristics requested for this layer region and for other layer regions laid thereover in the light receiving layer 102. This thickness is at least desirably 30 Å, preferably 40 Å, particularly preferably 50 Å.

When the content of the substance (C) in said layer region is at least 30 atomic ppm, the upper limit of the thickness of said layer region is desirably 10μ, preferably 8μ, particularly preferably 5μ.

The substrate to be used in the present invention may be either electroconductive material or insulating material. The electroconductive material may be exemplified by metals such as NiCr, stainless steel, Al, Cr, Mo, Au, Nb, Ta, V, Ti, Pt, Pd etc. or alloys thereof.

The insulating material may be exemplified by usually used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. At least one surface of these insulating substrates should preferably be subjected to electroconductive treatment, and it is desirable to provide other layers on the surface which has been subjectted to said electroconductive treatment.

For example, the surface of a glass can be given an electroconductivity by providing a thin film of NiCr, Al, Cr, Mo, Au, Ir, Nb, Ta, V, Ti, Pt, Pd, $In_2O_3$, $SnO_2$, ITO ($In_2O_3+SnO_2$), etc. thereon. Alternatively, the surface of a synthetic resin film such as polyester film can be given an electroconductivity by vacuum vapor deposition, electron-beam deposition or sputtering of a thin film of metal such as NiCr, Al, Ag, Pd, Zn, Ni, Au, Cr, Mo, Ir, Nb, Ta, V, Ti, Pt, etc. or by laminating treatment with said metal. The substrate may be shaped in any form such as cylinders, belts, plates or others, and its form may be selected as desired. For example, when the photoconductive member 100 in FIG. 1 is to be used as an image forming member for electrophotography, it may desirably be formed into an endless belt or a cylinder for use in continuous high speed copying. The substrate may have a thickness, which can be selected as desired so that a photoconductive member as desired may be formed. When the photoconductive member is required to have a flexibility, the substrate is made as thin as possible, so far as the function of a substrate can be sufficiently exhibited. However, in such a case, the thickness is preferably $10\mu$ or more from the view points of fabrication and handling of the substrate as well as its mechanical strength.

Figure 21:
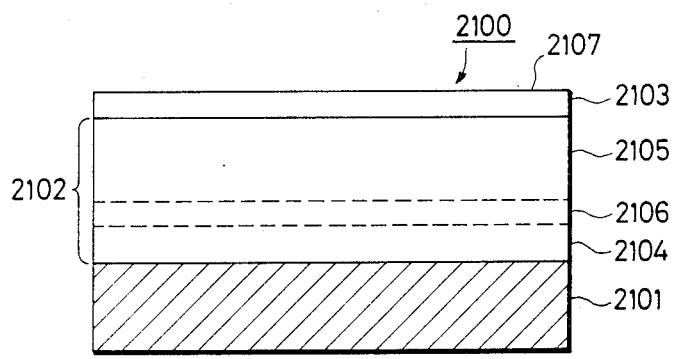

FIG. 21 is a schematic view for illustrating the layer structure of a photoconductive member as a second preferred embodiment of the invention.

The photoconductive member 2100 shown in FIG. 21 consists of a substrate 2101 suited for photoconductive members, a first layer (I) 2102 which is formed of a-SiGe(H,X) on the substrate 2101, contains nitrogen atoms, and has photoconductivity, and a second layer (II) 2103.

In the photoconductive member 2100 shown in FIG. 21, a light receiving layer is constructed with the first layer (I) 2102 and the second layer (II) 2103. This photoconductive member 2100 has the same layer structure as the photoconductive member 100 shown in FIG. 1 but having the second layer (II) 2103 on the first layer (I) 2102, that is, the first layer (I) 2102 has the same layer structure as the light receiving layer 102 shown in FIG. 1; all the matter described above in detail on the light receiving layer 102 applies to the first layer (I) 2102.

Similarly to the light receiving layer 102, the first layer (I) 2102 has a first layer region (1) 2104, second layer region (2) 2105, and third layer region (3) 2106 which have C(1), C(2), and C(3), respectively, of the thickness directional distribution concentration C(N) of nitrogen atoms.

In the photoconductive member 2100 shown in FIG. 21, the second layer (II) 2103 formed on the first layer (I) 2102 has a free surface 2104, and is provided for accomplishing the objects of the present invention primarily in humidity resistance, continuous repeated use characteristic, dielectric strength, use environment characteristic and durability.

In the present invention, the second layer (II) 2103 is made of an amorphous material containing silicon atoms (Si) and at least one of carbon atoms (C) and oxygen atoms (O), and, if necessary hydrogen atoms (H) or/and halogen atoms (X).

Thus, the respective amorphous materials constituting the first layer (I) 2102 and the second layer (II) 2103 have the common constituent of silicon atom, and therefore chemical stability is sufficiently ensured at the interface between both layers (I) 2102 and (II) 2103.

The amorphous material constituting the second layer (II) 2103 may include an amorphous material containing silicon atoms (Si) and carbon atoms (C), and if necessary, hydrogen atoms (H) and/or halogen atoms (X) (hereinafter referred to as "a-$(Si_xC_{1-x})_y(H,X)_{1-y}$", wherein $0<x, y<1$), and an morphoous material containing silicon atoms (Si) and oxygen atoms (O), and, if ncessary, hydrogen atoms (H) and/or halogen atoms (X) (hereinafter referred to as "a-$(Si_xO_{1-x})_y(H,X)_{1-y}$", wherein $0<x, y<1$).

The second amorphous layer (II) may be formed according to the glow discharge method, the sputtering method, the ion-implantation method, the ion-plating method, the electron beam method, etc. These preparation methods may be suitably selected in view of various factors such as the preparation conditions, the extent of the load for capital investment for installations, the production scale, the desirable characteristics required for the photoconductive member to be prepared, etc. With the advantages of relatively easy control of the preparation conditions for preparing photoconductive members having desired characteristics and easy introduction of silicon atoms, oxygen atoms, hydrogen atoms and halogen atoms, respectively, into the second layer (II) to be prepared, the glow discharge method or the sputtering method are preferably employed.

Further, in the present invention, the glow discharge method and the sputtering method may be used in combination in the same system to form the second layer (II).

For formation of the second layer (II) according to the glow discharge method, starting gases for formation of the second layer (II), which may, if necessary, be mixed with a dilution gas in a predetermined mixing ratio, may be introduced into a deposition chamber for vacuum deposition in which a substrate is placed, and glow discharge is excited in said deposition chamber to form gas plasma, thereby depositing the amorphous material for formation of the second layer (II) on the first layer (I) already formed on the substrate.

In the present invention, the starting gases for formation of the second layer (II) 103 may be exemplified by most of substances containing at least one of silicon atoms, carbon atoms, oxygen atoms, hydrogen atoms and halogen atoms as constituent atoms which are gaseous or gasified substances of readily gasifiable ones.

In the present invention, the starting gases which can be effectively used for formation of the second layer (II) 103 may include those which are gaseous under conditions of room temperature and atmospheric, pressure or can be readily gasified.

In the present invention, the staring gases effectively used for formation of the second amorphous layer (II) may include silicon hydride gases containing silicon atoms and hydrogen atoms as constituent atoms such as silanes, for example, $SiH_4$, $Si_2H_6$, $Si_3H_8$, $Si_4H_{10}$ etc., compounds containing carbon atoms and hydrogen atoms as constituent atoms such as saturated hydrocarbons having 1 to 4 carbon atoms, ethylenic hydrocarbons having 2 to 4 carbon atoms and acetylenic hydrocarbons having 2 to 3 carbon atoms, single substances or compound containing oxygen atoms as constituent atoms, single substances of halogen, hydrogen halides, interhalogen compounds, silicon halide, halogen substituted silicon hydride, etc.

More specifically, they may include, as the saturated hydrocarbons, methane ($CH_4$), ethane ($C_2H_6$), propane ($C_3H_8$), n-butane (n-$C_4H_{10}$), pentane ($C_5H_{12}$); as the ethylenic hydrocarbons, ethylene ($C_2H_4$), propylene ($C_3H_6$), butene-1 ($C_4H_8$), butene-2 ($C_4H_8$), isobutylene ($C_4H_8$), pentene ($C_5H_{10}$); as the acetylenic hydrocarbons, acetylene ($C_2H_2$), methyl acetylene ($C_3H_4$), butyne ($C_4H_6$); as the single substances of halogen, fluorine, chlorine, bromine and iodine; as the hydrogen halides, HF, HI, HCl and HBr; as the interhalogen compounds, BrF, ClF, ClF$_3$, ClF$_5$, BrF$_5$, BrF$_3$ IF$_5$, IF$_7$, ICl, IBr; as the silicon halides, SiF$_4$, Si$_2$F$_6$, SiCl$_4$, SiCl$_3$Br, SiCl$_2$Br$_2$, SiClBr$_3$, SiCl$_3$I, SiBr$_4$; as the halogen-substituted silicon hydride, SiH$_2$F$_2$, SiH$_2$Cl$_2$, SiHCl$_3$, SiH$_3$Cl, SiH$_3$Br, SiH$_2$Br$_2$, SiHBr$_3$, etc.; and so on.

Besides, it is also possible to use halogen-substituted paraffinic hydrocarbons such as CF$_4$, CCl$_4$, CBr$_4$, CHF$_3$, CH$_2$F$_2$, CH$_3$F, CH$_3$Cl, CH$_3$Br, CH$_3$I, C$_2$H$_5$Cl, etc.; fluorinated sulfur compounds such as SF$_4$, SF$_6$, etc.; silane derivatives, including alkyl silanes such as Si(CH$_3$)$_4$, Si(C$_2$H$_5$)$_4$, etc. and halogen-containing alkyl silanes such as SiCl(CH$_3$)$_3$, SiCl$_2$(CH$_3$)$_2$, SiCl$_3$CH$_3$, etc. as effective ones.

The starting material effectively used as the starting gas for introduction of oxygen atoms (O) to be used during the formation of the second layer (II), it is possible to use compounds containing oxygen atoms as constituent atoms or compounds containing nitrogen atoms and oxygen atoms as constituent atoms, such as oxygen (O$_2$), ozone (O$_3$), nitrogen monoxide (NO), nitrogen dioxide (NO$_2$), dinitrogen monoxide (N$_2$O), dinitrogen trioxide (N$_2$O$_3$), dinitrogen tetraoxide (N$_2$O$_4$), dinitrogen pentaoxide (N$_2$O$_5$), nitrogen trioxide (NO$_3$), and lower siloxanes containing silicon atoms, oxygen atoms and hydrogen atoms as constituent atoms such as disiloxane (H$_3$SiOSiH$_3$), trisiloxane (H$_3$SiOSiH$_2$OSiH$_3$), and the like.

These materials for formation of the second layer (II) may be selected and used as desired in formation of the second layer (II) so that silicon atoms, carbon atoms, oxygen atoms, hydrogen atoms and halogen atoms may exist in a predetermined composition ratio in the second layer (II).

For example, Si(CH$_3$)$_4$ as the material capable of easily adding silicon atoms, carbon atoms and hydrogen atoms and forming a layer having desired characteristics and SiHCl$_3$, SiCl$_4$, SiH$_2$Cl$_2$ or SiH$_3$Cl as the material for adding halogen atoms may be mixed in a predetermined mixing ratio and introduced under a gaseous state into a device for formation of a second layer (II), followed by excitation of glow discharge, whereby a second layer (II) comprising a-(Si$_x$C$_{1-x}$)$_y$(Cl+H)$_{1-y}$ can be formed.

For formation of the second layer (II) according to the sputtering method, any of single crystalline or polycrystalline Si wafer, graphite wafer, SiO$_2$ wafer and a wafer containing silicon atom, carbon atom and/or oxygen atom as mixed therein is used as a target and subjected to sputtering in an atmosphere of various gases containing, if necessary halogen atoms and/or hydrogen atoms as constituents. For example, when a silicon wafer is used as a target, starting gases for introducing carbon atoms and/or oxygen atoms, and hydrogen atoms and/or halogen atoms, which may be diluted with a dilution gas, if desired, are introduced into a deposition chamber for sputtering to form a gas plasma of these gases therein and effect sputtering of said silicon wafer.

Alternatively, silicon atoms and/or carbon atoms and/or oxygen atoms as separate targets or one target sheet of a mixture of silicon atoms, carbon atoms and/or oxygen atoms can be used and sputtering is effected in a gas atmosphere containing, if desired, hydrogen atoms and/or halogen atoms. As the starting gases for introduction of carbon atoms, oxygen atoms, hydrogen atoms and halogen atoms, substances for forming the second layer (II) as shown in the example of the glow discharge method as described above can be used as effective material also for sputtering.

In the present invention, the dilution gas to be used in formation of the second layer (II) by the glow discharge method or the sputtering method may include the so called rare gases such as He, Ne and Ar as preferable ones.

The second layer (II) in the present invention should be carefully formed so that the required characteristics may be given exactly as desired. That is, the substance containing silicon atoms, carbon atoms and/or oxygen atoms, and, if necessary, hydrogen atoms and/or halogen atoms as the constituent atoms can take structural forms ranging from crystalline to amorphous and show electrical properties ranging from conductive through semi-conductive to insulating and photoconductive properties ranging from photoconductive to non-photoconductive. Therefore, in the present invention, the preparation conditions are strictly selected as desired so as to form an amorphous material for constituting the second layer (II) having characteristics desired for the purpose. For example, when the second layer (II) is to be provided primarily for the purpose of improvement of dielectric strength, the amorphous material for constituting the second layer (II) is prepared as an amorphous material having marked electric insulating behaviours under the service environment.

Alternatively, when the primary purpose for the second layer (II) is an improvement of continuous repeated use characteristics or service environmental characteristics, the degree of the above electric insulating property may be alleviated to some extent and the aforesaid amorphous material may be prepared as an amorphous material having a sensitivity to some extent to the irradiation light.

In forming the second layer (II) on the surface of the first layer (I), the substrate temperature during the layer formation is an important factor having influences on the constitution and the characteristics of the layer to be formed, and it is desired in the present invention to strictly control the substrate temperature during the layer formation so as to obtain the second layer (II) having the desired characteristics.

For forming the second layer (II), an optimum temperature range is selected in conformity with the method for forming the second layer (II) to effectively attain the desired objects of the present invention. During this formation of the layer, the substrate temperature is preferably 20° to 400° C., more preferably 50° to 350° C., and most preferably 100° to 300° C. For the formation of the second layer (II), the glow discharge method or the sputtering method may be advantageously used, because fine control of the composition ratio of atoms existing in the layer or control of layer thickness can be conducted with relative ease as compared with other methods. In case that the second layer (II) is formed according to these layer forming methods, the discharging power during the formation of the layer is one of important factors influencing the characteristics of the second layer (II) similarly to the aforesaid substrate temperature.

The discharging power condition for the effective preparation with a good productivity of the second layer (II) having characteristics for accomplishing the objects of the present invention may preferably be 10 to 300 W, more preferably 20 to 250 W, and most preferably 50 to 200 W.

The gas pressure in a deposition chamber may preferably be 0.01 to 1 Torr, and more preferably 0.1 to 0.5 Torr.

In the present invention, the above numerical ranges can be mentioned as preferable ones for the substrate temperature, discharging power for the preparation of the second layer (II). However, these factors for the formation of the layer are not selected separately and independently of each other, but it is desirable that the optimum values of respective layer forming factors are selected on the basis of mutual organic relationships so that the second layer (II) having desired characteristics may be formed.

The contents of carbon atoms, and/or oxygen atoms existing in the second layer (II) are important factors for obtaining the desired characteristics to accomplish the objects of the present invention, similarly to the conditions for preparation of the second layer (II). The contents of carbon atoms, and/or oxygen atoms existing in the second layer (II) in the present invention are selected as desired in view of the species of amorphous material constituting the second layer (II) and its characteristics.

More specifically, the amorphous material represented by the above formula $a\text{-}(Si_xC_{1-x})_y(H,X)_{1-y}$ may be roughly classified into an amorphous material constituted of silicon atoms and carbon atoms (hereinafter referred to as "$a\text{-}Si_aC_{1-a}$", where $0<a<1$), an amorphous material constituted of silicon atoms, carbon atoms and hydrogen atoms (hereinafter referred to as $a\text{-}(Si_bC_{1-b})_cH_{1-c}$, where $0<b$, $c<1$) and an amorphous material constituted of silicon atoms, carbon atoms, halogen atoms, and, if necessary, hydrogen atoms (hereinafter referred to as "$a\text{-}Si_dC_{1-d})_e(H,X)_{1-e}$", where $0<d$, $e<1$).

In the present invention, when the second layer (II) is made of $a\text{-}Si_aC_{1-a}$, the content of carbon atoms in the second layer (II) may be preferably $1\times10^{-3}$ to 90 atomic %, more preferably 1 to 80 atomic %, and most preferably 10 to 75 atomic %, namely in terms of representation by a in the above $a\text{-}Si_aC_{1-a}$, a being preferably 0.1 to 0.99999, more preferably 0.2 to 0.99, and most preferably 0.25 to 0.9.

In the present invention, when the second layer (II) is made of $a\text{-}(Si_bC_{1-b})_cH_{1-c}$, the content of carbon atoms in the second layer (II) may be preferably $1\times10^{-3}$ to 90 atomic %, more preferably 1 to 90 atomic %, and most preferably 10 to 80 atomic %, the content of hydrogen atoms preferably 1 to 40 atomic %, more preferably 2 to 35 atomic %, and most preferably 5 to 30 atomic %, and the photoconductive member formed when the hydrogen content is within these ranges can be sufficiently applicable as excellent one in the practical aspect.

That is, in terms of the representation by the above $a\text{-}(Si_bC_{1-b})_cH_{1-c}$, b is preferably 0.1 to 0.99999, more preferably 0.1 to 0.99, and most preferably 0.15 to 0.9, and c preferably 0.6 to 0.99, more preferably 0.65 to 0.98, and most preferably 0.7 to 0.95.

When the second layer (II) is made of $a\text{-}(Si_dC_{1-d})_e(H,X)_{1-e}$, the content of carbon atoms in the second layer (II) may be preferably $1\times10^{-3}$ to 90 atomic %, more preferably 1 to 90 atomic %, and most preferably 10 to 80 atomic %, the content of halogen atoms preferably 1 to 20 atomic %, more preferably 1 to 18 atomic %, and most preferably 2 to 15 atomic %. When the content of halogen atoms is within these ranges, the photoconductive member thus prepared is sufficiently applicable in the practical aspect. The content of hydrogen atoms contained, if desired, may be preferably 19 atomic % or less, and more preferably 13 atomic % or less.

That is, in terms of representation by d and e in the above $a\text{-}(Si_dC_{1-d})_e(H,X)_{1-e}$, d is preferably 0.1 to 0.99999, more preferably 0.1 to 0.99, and most preferably 0.15 to 0.9, and e preferably 0.8 to 0.99, more preferably 0.82–0.99, and most preferably 0.85 to 0.98.

On the other hand, the amorphous material represented by the above formula $a\text{-}(Si_xO_{1-x})_y(H,X)_{1-y}$ may be roughly classified into an amorphous material constituted of silicon atoms and oxygen atoms (hereinafter referred to as "$a\text{-}Si_aO_{1-a}$", where $0<a<1$), an amorphous material constituted of silicon atoms, oxygen atoms and hydrogen atoms (hereinafter referred to as $a\text{-}(Si_bO_{1-b})_cH_{1-c}$, where $0<b$, $c<1$) and an amorphous material constituted of silicon atoms, oxygen atoms, halogen atoms and, if desired, hydrogen atoms (hereinafter referred to as "$a\text{-}Si_dO_{1-d})_e(H,X)_{1-e}$", where $0<d$, $e<1$).

In the present invention, when the second layer (II) is to be constituted of $a\text{-}Si_aO_{1-a}$, the content of oxygen atoms in the second layer (II) may be preferably 0.33 to 0.99999, more preferably 0.5 to 0.99, and most preferably 0.6 to 0.9 in terms of a in the above formula $a\text{-}Si_aO_{1-a}$.

In the present invention, when the second layer (II) is made of $a\text{-}(Si_bO_{1-b})_cH_{1-c}$, the content of oxygen atoms in the second layer (II) may be preferably such that b in the above formula $a\text{-}(Si_bO_{1-b})_cH_{1-c}$ may be preferably 0.33 to 0.99999, more preferably 0.5 to 0.9, and most preferably 0.6 to 0.9, and c preferably 0.6 to 0.99, more preferably 0.65 to 0.98, and most preferably 0.7 to 0.95.

When the second layer (II) is made of $a\text{-}(Si_dO_{1-d})_e(H,X)_{1-e}$, the content of oxygen atoms in the second layer (II) may be preferably such that d in the above formula $a\text{-}(Si_dO_{1-d})_e(H,X)_{1-e}$ may be preferably 0.33 to 0.99999, more preferably be 0.5 to 0.99, and most preferably 0.6 to 0.9, and e preferably 0.8 to 0.99, more preferably 0.82 to 0.99, and most preferably 0.85 to 0.98.

H is preferably 90 atomic % or less, more preferably 80 atomic % or less, and most preferably 70 atomic % or less on the basis of sum total of (H+X).

The range of the numerical value of layer thickness of the second layer (II) is one of the important factors for effectively accomplishing the object of the present invention, and is selected as desired in view of the intended purpose so as to effectively accomplish the objects of the present invention.

The layer thickness of the second layer (II) must be also selected as desired with due considerations about the relationships with the contents of carbon atoms, and/or oxygen atoms, the relationship with the layer thickness of the first layer (I), as well as other organic relationships to the characteristics required for respective layer regions.

In addition, the layer thickness is desirably given considerations from economical view point such as productivity or capability of mass production.

The second layer (II) in the present invention desirably has a layer thickness preferably of 0.003 to 30μ, more preferably 0.004 to 20μ, and most preferably 0.005 to 10μ.

The halogen atoms existing in the second layer (II) of the present invention are preferably fluorine, chlorine, bromine and iodine, among which fluorine and chlorine are desirable.

Figure 22:
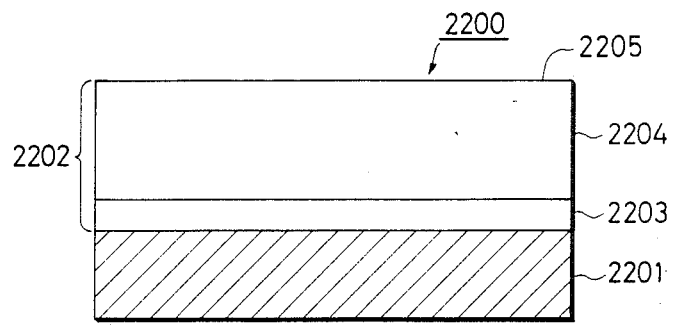

FIG. 22 is a schematic sectional view showing the layer constitution of a photoconductive member according a preferable third embodiment of the present invention.

The photoconductive member 2200 shown in FIG. 22 has a light receiving layer 2202 on a substrate 2201 for the photoconductive member, the light receiving layer 2202 having a free surface 2205 on its one end.

The light receiving layer 2202 has a layer structure comprising a first layer region (G) 2503 made of a-Ge(-Si,H,X) and a photoconductive second layer region (S) 2204 made of a-Si(H,X), the first layer region and the second layer region being laid on each other in this order from the substrate 2201 side.

The germanium atoms existing in the first layer region (G) 2203 may be uniformly distributed without exception in the first layer region (G) 2203, or may be distributed without exception in the layer thickness direction but not uniformly in the content of germanium atoms in depth profile. In any case, however, it is necessary that the germanium atoms are distributed uniformly and contained without exception in the interplanar direction, i.e. the direction in parallel to the substrate surface, to make the characteristics uniform in the interplanar direction. The germanium atoms are particularly so contained in the first layer region (G) 2203 that they should be contained without exception in the layer thickness direction of the light receiving layer 2202 and should be more distributed toward the substrate 2201 side than the side opposite to the substrate 2201 provide side (i.e. the free surface 2205 side of the light receiving layer 2202), or they should take quite a reversed depth profile.

In the photoconductive member shown in FIG. 15, it is desirable that the germanium atoms existing in said first layer region (G) 2203 can take said depth profile in the layer thickness direction and a uniform distribution state in the interplanar direction in parallel to the substrate surface.

In the photoconductive member shown in FIG. 22, no germanium atoms exist in the second layer region (S) 2204 provided on the first layer region (G) 2203. By making the light receiving layer having such a layer constitution, a photoconductor member having a distinguished photosensitivity to the whole region of wavelength ranging from the relatively short wavelength to the relatively long wavelength, including the visible light region can be obtained.

In a preferable embodiment, the depth profile of germanium atoms in the first layer region (G) 2203 is such that the germanium ions are continuously distributed without exception in the whole layer region and the content C of the germanium atoms is decreased toward the second layer region (S) 2204 from the substrate 2201 side, and thus a distinguished affinity can be obtained between the first layer region (G) 2203 and the second layer region (S) 2204. When a semi-conductor laser is used, the long-wavelength light is hardly absorbed in the second layer region (S) 2204, but such a light can be substantially completely absorbed in the first layer region (G) 2203. Thus, interference by the reflection on the substrate surface can be prevented.

When the silicon atoms exist in the first layer region (G) 2203 in the photoconductive member 2200 shown in FIG. 22, the amorphous materials for the first layer region (G) 2203 and the second layer region (S) 2204 have such a common constitution factor that the silicon atoms are common thereto. Thus, a chemical stability can be ensured at the interface therebetween.

Typical examples that the depth profile in the layer thickness direction of germanium ions existing in the first layer region (G) 2203 in the photoconductive member 2200 is non-uniform are shown in FIG. 2 through FIG. 10 for the illustration of the photoconductive member 100 shown in FIG. 1.

For the illustration of the photoconductive member 2200 shown in FIG. 22, the ordinate of FIG. 2 through FIG. 10 will show the thickness of the first layer region (G) 2203, $t_B$ the position of the end surface of the first layer region (G) 2203 on the substrate side, and $t_T$ the position of the end surface of the first layer region (G) 2203 on the opposite side to the substrate side.

In the photoconductive member 2200 shown in FIG. 22, the content of germanium atoms existing in the first layer region (G) 2203 can be selected as desired so as to effectively accomplish the objects of the present invention, and is preferably 1 to $1 \times 10^6$ atomic ppm, more preferably 100 to $9.5 \times 10^5$ atomic ppm, and most preferably 500 to $8 \times 10^5$ atomic ppm, on the basis of sum total with the silicon atoms existing in the first layer region (G) 2203.

The thickness each of the first layer region (G) 2203 and the second layer region (S) 2204 is one of important factors for effectively accomplishing the objects of the present invention, and must be carefully selected is designing the photoconductive member to thoroughly give the desired characteristics to the photoconductive member.

In the present invention, the thickness $T_B$ of the first layer region (G) 2203 is preferably 30 Å to 50μ, more preferably 40 Å to 40μ, and most preferably 50 Å to 30μ. The thickness T of the second layer region (S) 2204 is preferably 0.5 to 90μ, more preferably 1 to 80μ, and most preferably 2 to 50μ.

Sum total of the thickness $T_B$ of the first layer region (G) 2203 and the thickness T of the second layer region (S) 2204, i.e. ($T_B+T$) is selected as desired in view of mutual organic relationships between the characteristics required for both layer regions and the characteristics required for the whole light receiving layer 2202.

In the photoconductive member shown in FIG. 22, the numerical range for ($T_B+T$) is preferably 1 to 100μ, more preferably 1 to 80μ, and most preferably 2 to 50μ.

In a more preferable embodiment of the present invention, the thickness $T_B$ and thickness T is selected as desired so as to satisfy, a relationship of preferably $T_B/T \leq 1$, more preferably $T_B/T \leq 0.9$ and most preferably $T_B/T \leq 0.8$.

When the content of germanium atoms existing in the first layer region (G) is $1 \times 10^5$ atomic ppm or more, the thickness $T_B$ of the first layer region (G) 2203 is desireably as small as possible, and is preferably 30μ or less, more preferably 25μ or less, and most preferably 20μ or less.

The halogen atoms (X) existing in the first layer region (G) 2203 and/or the second layer region (S) 2204 for the light receiving layer 2202 may include, for example, fluorine, chlorine, bromine, and iodine, among which fluorine and chlorine are preferable.

Figure 23:
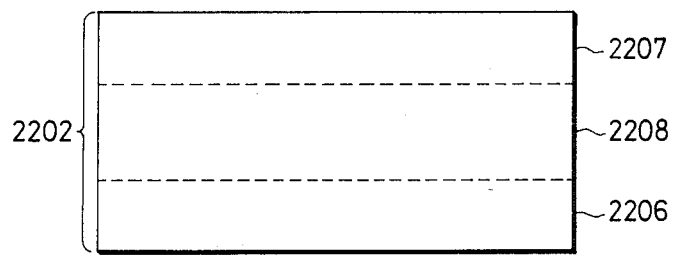

In the photoconductive member 2200 shown in FIG. 22, a layer region (N) containing nitrogen atoms is provided in the light receiving layer 2202 to attain a higher photosensitization, and a higher dark resistance and to improve the adhesion between the substrate 2201 and the light receiving layer 2202, where the depth profile of nitrogen atoms existing in the light receiving layer and the manner to provide the layer region (N) are the same as those for the photoconductive member 100 shown in FIG. 1. Namely, as shown in FIG. 23, the light receiving layer 2202 comprises the first layer region (1) 2206, the third layer region (3) 2208, the second layer region (2) 2207, each layer region having concentration distributions C(N) of C(1), C(3) and C(2), respectively.

Quite same explanation as made as to the layer region (N) in the photoconductive member 100 shown in FIG. 1 can be applied to other than those already made as to the layer region (N) in the photoconductive member 2200 shown in FIG. 22.

In the present invention, the first layer region (G) made of a-Ge(Si,H,X) can be formed according to a vacuum deposition method utilizing an electric discharge phenomenon as that for a-SiGe(H,X). For example, the first layer region (G) made of a-Ge(Si,H,X) can be formed according to a glow discharge method basically by introducing a starting gas for Ge supply capable of supplying germanium ions (Ge), and if necessary, a starting gas for Si supply capable of supplying silicon atoms (Si), a starting gas for introducing hydrogen atoms (H) and/or a starting gas for introducing halogen atomss (X) into a deposition chamber, whose inside can be made subatmospheric, under a desired gas pressure, and exciting glow discharge in the deposition chamber, thereby forming a layer made of a-Ge(Si,H,X) on a predetermined substrate surface placed at the predetermined position.

To contain the germanium atoms in a non-uniform depth profile, a layer made of a-Ge(Si,H,X) is formed while controlling the content of germanium atoms according to a change rate lines.

The layer can be also formed according to the sputtering method, for example, by using a target made of Si, or two targets i.e. said target and a target made of Ge, or a target made of Si and Ge as a mixture in an inert gas of Ar, He, etc. or in an atmosphere of a gas mixture based on said gases, and if necessary, introducing a starting gas for Ge supply, diluted with a dilution gas such as He, Ar, etc., or if necessary, a gas for introducing hydrogen atoms (H) and/or halogen atoms (X) into a deposition chamber for sputtering, followed by generating a plasma atmosphere of desired gas. To make non-uniform distribution of germanium atoms, for example, the target is sputtered while controlling the gas flow rate of the starting gas for Ge supply according to a desired change rate lines.

All the starting gases already described as to the formation of the layer made of a-SiGe(H,X) can be used as the starting gas for forming the first layer region (G).

In the photoconductive member 2200 shown in FIG. 22, the second layer region (S) 2204 made of a-Si(H,X) can be formed according to the same procedure and conditions as used for forming the first layer region (G) 2203 by using the starting materials excluding the starting material that can serve as the starting gas for Ge supply from the starting materials (I) for forming said first layer region (S) [starting materials (II) for forming the second layer region (S) 2204].

That is, in the present invention, the second layer region (S) 2204 made of a-Si(H,X) can be formed according to a vacuum deposition method utilizing an electric discharge phenomenon, for example, a glow discharge method, a sputtering method, an ion-plating method, etc. For example, the second layer region (S) 2204 made of a-Si(H,X) can be formed according to a glow discharge method basically by introducing said starting gas for Si supply capable of supplying silicon atoms (Si), if necessary, together with a starting gas for introducing hydrogen atoms and/or a starting gas for introducing halogen atoms (X) into a deposition chamber, whose inside can be made subatmospheric, and exciting glow discharge in the deposition chamber, thereby forming a layer made of a-Si(H,X) on the predetermined substrate surface placed at the predetermined position.

The layer can be also formed according to a sputtering method, for example, by introducing a gas for introducing hydrogen atoms (H) and/or halogen atoms (X) into a deposition chamber for sputtering, when a target made of Si is sputtered in an inlet gas of Ar, He, etc., or in an atmosphere of a gas mixture based on said gases.

The content of hydrogen atoms (H), or halogen atoms (X) or sum total of hydrogen atoms and halogen atoms (H+X) existing in the second layer region (S) 2204 is preferably 1 to 40 atomic %, more preferably 5 to 30 atomic %, and most preferably 5 to 25 atomic %.

Descriptions made as to the photoconductive member 100 shown in FIG. 1 can be also applied to the corresponding parts of the photoconductive member 2200 shown in FIG. 22. Thus, those so far omitted from the descriptions of the photoconductive member 2200 should be referred to the descriptions of the photoconductive member 100 shown in FIG. 1.

Figure 24:
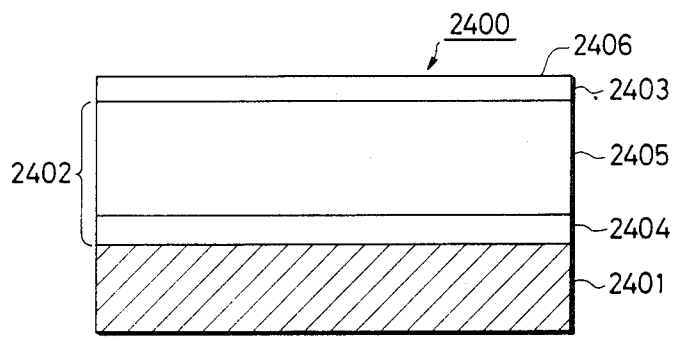

FIG. 24 is a schematic cross-sectional view showing the layer constitution of a photoconductive member according to a preferable fourth embodiment of the present invention.

The photoconductive member 2400 shown in FIG. 24 has a substrate 2401 for the photoconductive member, a first layer (I) 2402 provided on the substrate 2401, and a second layer (II) 2403 provided on the first layer (I) 2402, and has the same constitution as that of the photoconductive member 2200 shown in FIG. 22 except for the second layer (II) 2403 in the photoconductive member 2400. That is, the first layer (I) 2402 corresponds to the light receiving layer 2202; the first layer region (G) 2404 to the first layer region (G) 2203; and the second layer region (S) 2405 to the second layer region (S) 2204, and all the descriptions so far made as to the light receiving layer 2202 in FIG. 22 are also applicable to the first layer (I) 2402. The second layer (II) 2403 is the same layer as the second layer (II) of the photoconductive member 2100 shown in FIG. 21, and all the descriptions so far made as to the second layer (II) 2103 can be also applied to the second layer (II) 2403.

The photoconductive member of the present invention so designed as to have the layer structure so far described in detail can solve all of the afore-mentioned problems, and shows very distinguished electrical, optical and photoconductive characteristics and also distinguished dielectric strength and service environmental characteristics.

Particularly when applied to an image-forming member for the electrophotography, the present photoconductive member has no influence of residual potential on the image formation, stable electric characteristics, a higher sensitivity, a high SN ratio, a high light fatigue resistance, longer repeated use characteristics, a clear halftone, and a high resolution, and can produce high quality images stably and repeatedly.

Furthermore, the present photoconductive member can be used continuously and repeatedly at a high speed for a long time, since the light receiving layer itself formed on the substrate is tough and considerably distinguished in the adhesion to the substrate.

Still furthermore, the present photoconductive member has a high photosensitivity in the whole visible light region, a good matching particularly to semi-conductor laser and a high response to light.

The process for producing the photoconductive member of the invention is outlined below by way of an example.

Figure 25:
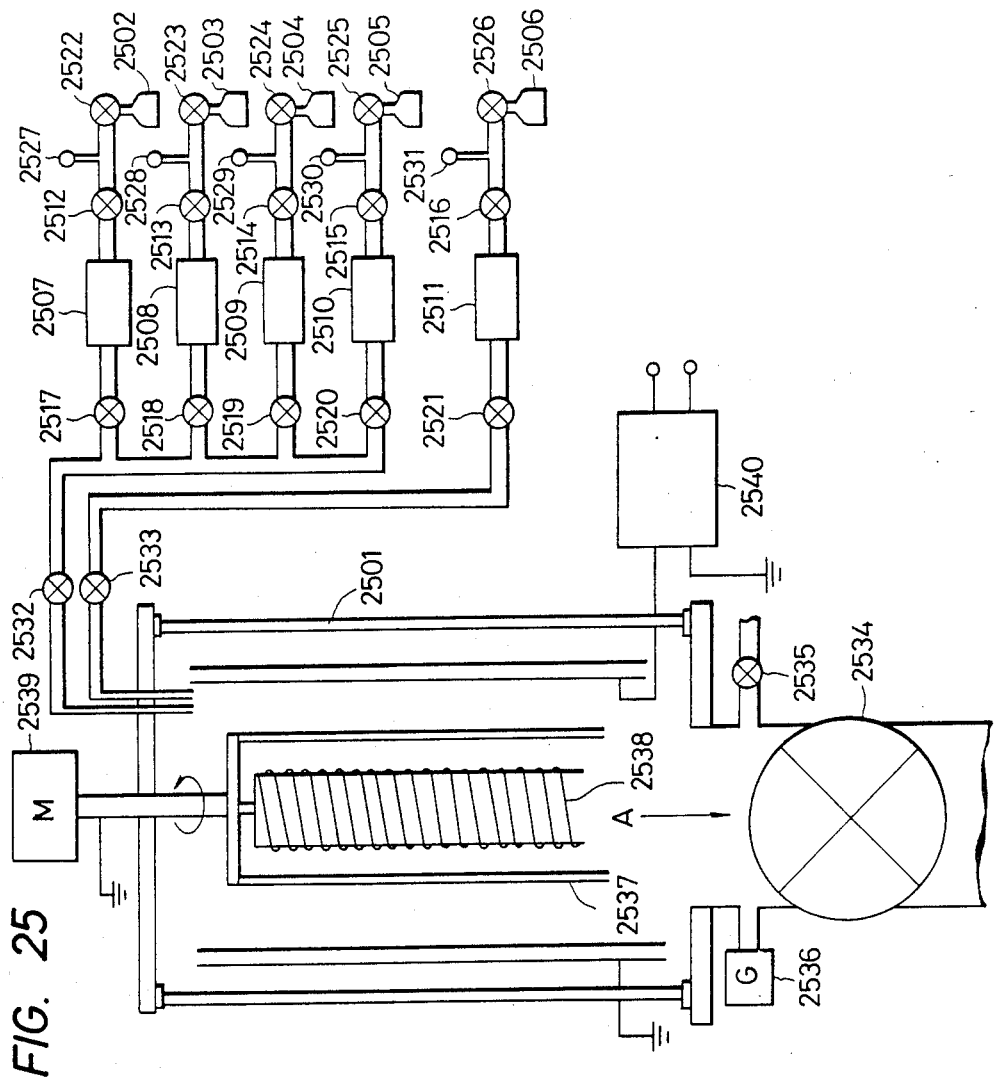
FIG. 25 is a schematic illustration of the apparatus used for preparing photoconductive members in the invention.

FIG. 25 shows an apparatus for the production of the photoconductive member.

Bombs 2502–2506 are filled with gaseous starting materials for the formation of photoconductive members of the invention. For example, the bomb 2502 is filled with He-diluted $SiH_4$ gas (99.999% purity, hereinafter designated as $SiH_4$/He), bomb 2503 with He-diluted $GeH_4$ gas (99.999% purity, hereinafter designated as $GeH_4$/He), bomb 2504 with He-diluted $SiF_4$ gas (99.999% purity, hereinafter designated as $SiF_4$/He), bomb 2505 with $NH_3$ gas (99.999% purity), and bomb 2506 with $H_2$ gas (99.999% purity).

For passing these gas into the reaction chamber 2501; the valves 2522–2506 of the bombs 2502–2506 and the leak valve 2535 are confirmed to be closed; inflow valve 2512–2516, outflow valves 2517–2521, and auxiliary valves 2532 and 2533 are confirmed to be opened; then the main valve 2534 is opened to evacuate the reaction chamber 2501 and all the gas pipes; and when the vacuum gage 2536 indicates a vacuum of about $5 \times 10^{-6}$ Torr, the auxiliary valves 2532 and 2533 and the outflow valves 2517–2521 are closed An example of the formation of a light receiving layer on a cylindrical substrate 2537 is given below. The valves 2522, 2523, and 2525 are opened, pressures at outlet pressure gages 2527, 2528, and 2530 are adjusted to 1 $Kg/cm^2$, and the inflow valves 2512, 2513, and 2515 are gradually opened to flow $SiH_4$/He gas from the bomb 2502, $GeH_4$/He gas from the bomb 2503, and $NH_3$ gas from the bomb 2505 into mass-flow controllers 2507, 2508, and 2510, respectively. Then, the outflow valves 2517, 2518, and 2520 and the auxiliary valve 2532 are gradually opened to flow each gas into the reaction chamber 2501. At this time, the outflow valves 2517, 2518, and 2520 are manipulated to adjust these gas flows to prescribed valves and while reading the indication of the vacuum gage 2536, the valve 2534 is manipulated to adjust the pressure in the reaction chamber 2501 to a prescribed valve. After confirmation that the substrate 2537 is heated by the heater 2538 at a prescribed temperature between 50° and 400° C., the power source 2540 is set to a prescribed power to generate a glow discharge in the reaction chamber 2501. During the glow discharge, the flow of $NH_3$ gas is controlled according to a predetermined nitrogen atom distribution curve (concentration change in the thickness direction) by regulating the valve 2520 manually or with an external driving motor, whereby the distribution concentration of nitrogen atoms in the resulting layer is controlled.

The formation of the second layer (II) on the first layer (I) thus formed to an intended thickness is carried out by feeding, for example, $SiH_4$ gas and $C_2H_4$ gas or/and NO gas, diluted with an inert gas such as He if necessary, into the reaction chamber 2501 and generating a glow discharge under prescribed conditions, wherein the valve operations are similar to those in the formation of the first layer.

In corporation of halogen atoms in the second layer (II) is accomplished by forming the layer using $SiF_4$ gas and $C_2H_4$ gas or/and NO gas or using $SiH_4$ gas in addition to the above gases.

Needless to say, the outflow valves except those for the gases necessary to the formation of each layer are all closed during operation. In order to avoid the remaining of the gases used for the preceding formation of a layer, in the reaction chamber 2501 and in the lines from the outflow valves 2517–2521 to the reaction chamber 2501, the outflow valves 2517–2521 are closed and the auxiliary valves 2532 and 2533 and the main valve 2534 are fully opened to evacuate once said space to a high vacuum. This procedure is performed as occasion demands.

Contents of carbon atoms or/and oxygen atoms in the second layer can be controlled as desired in the case of glow discharge, by suitable setting of the $SiH_4/C_2H_4$ gas flow ration or/and the $SiH_4$/NO gas flow ratio fed into the reaction chamber 2501, and in the case of sputtering, by suitable choice of the area ratio of a silicon wafer to a graphite wafer or/and to an SiO wafer or the silicon powder/graphite powder mixing ratio or/and the silicon powder/$SiO_2$ powder mixing ratio at the preparation of these targets. The content of halogen atoms (X) in the second layer (II) can be controlled as desired by regulating the flow of a halogen-introducing starting gas, for example, $SiF_4$ gas, fed into the reaction chamber 2501.

During layer formation, the substrate 2537 is desirably rotated at a constant speed by means of a motor 2539 for the purpose of uniforming the layer formation.

The following Examples illustrate the invention in more detail.

EXAMPLE 1

By the use of preparation device shown in FIG. 25, samples of image forming members for electrophotography (Sample Nos. 11-1A to No. 13-4A, Table 2A) were prepared on a cylindrical aluminum substrate under the condition shown in Table 1A.

Figure 26:
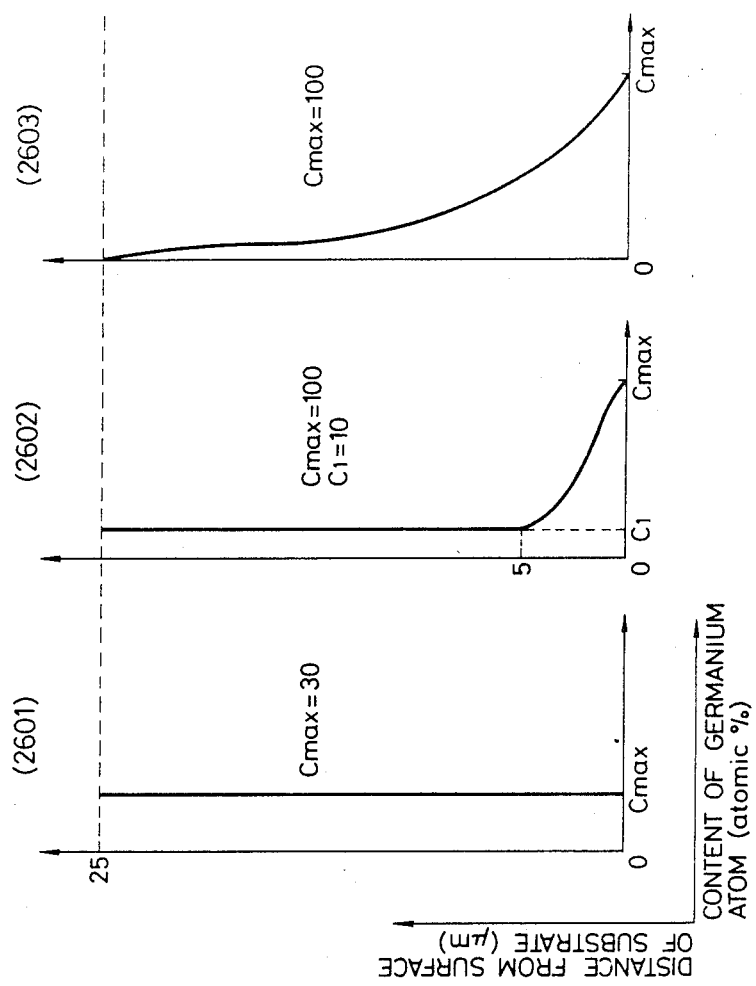
FIGS. 26-29 show the distribution states of germanium atoms or nitrogen atoms in Examples.
Figure 27:
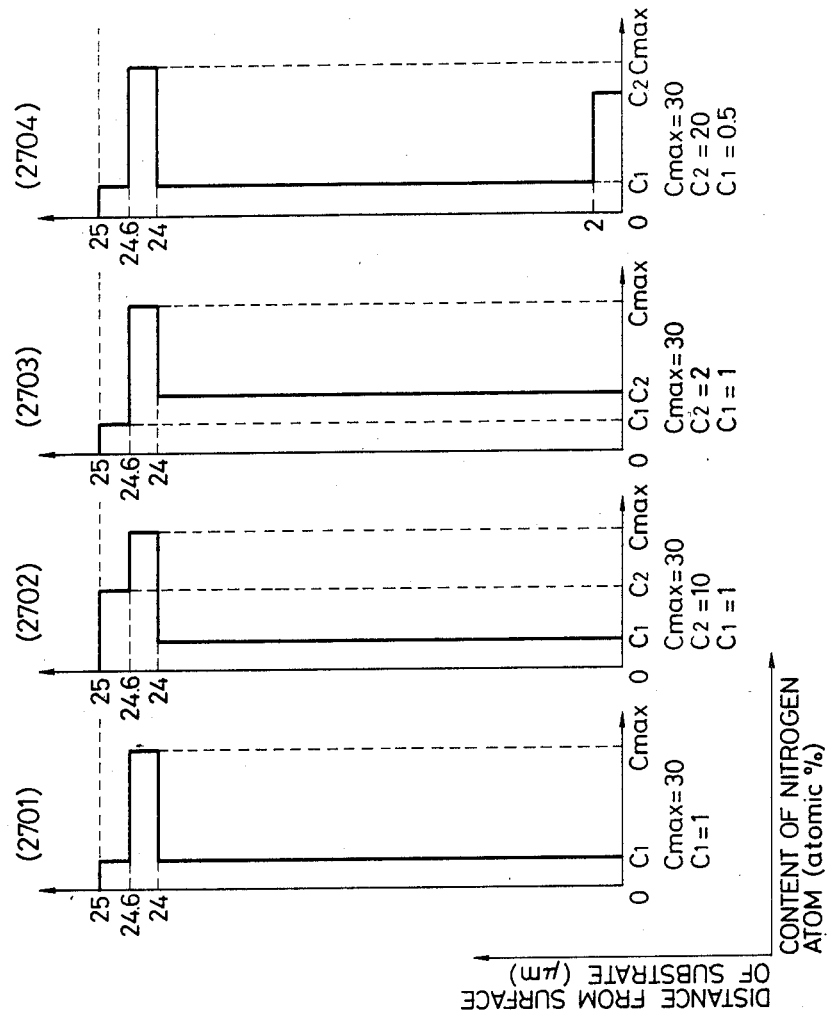

The concentration distributions of germanium atoms and nitrogen atoms in the sample are shown in FIG. 26, and FIG. 27, respectively.

The sample thus prepared was set on an experimental charge-exposure device, and corona charging was effected at +5.0 KV for 0.3 second, followed by immediate irradiation of a light image of a transmissive test chart with a tungsten lamp light at an irradiation dose of 2 lux-sec.

Immediately thereafter, a negatively chargeable developer (containing a toner and a carrier) was cascaded onto the surface of the image forming member, thus giving a good toner image thereon. The toner image was transferred onto a transfer paper by corona charging of +5.0 KV, giving a clear image of high density with excellent resolution and sufficient gradation reproducibility.

The evaluation of quality of the transferred toner image was repeated in the same manner as described above except that a semi-conductor laser of GaAs type of 810 nm (10 mW) was used in place of the tungsten lamp. The sample all gave a clear image having an excellent resolution and satisfactory gradation reproducibility.

EXAMPLE 2

By the use of the preparation device shown in FIG. 25, samples of image forming members for electrophotography (Sample Nos. 21-1A to No. 23-4A, Table 4A) were prepared on a cylindrical aluminum substrate under the condition shown in Table 3A.

The concentration distributions of germanium atoms and nitrogen atoms in the sample are shown in FIG. 26, and FIG. 27, respectively.

Each sample was subjected to image quality evaluation test in the same manner as in Example 1. Every sample tested gave a transferred toner image of high quality, and did not show deterioration in the image quality after 200,000 times repetitive use under the operation condition of 38° C. and 80% RH.

EXAMPLE 3

By the use of the preparation device shown in FIG. 25, samples of image forming members for electrophotography (Sample Nos. 11-1B to No. 13-4B, Table 2B) were prepared on a cylindrical aluminum substrate under the condition shown in Table 1A.

The concentration distributions of germanium atoms and nitrogen atoms in the sample are shown in FIG. 26, and FIG. 27, respectively.

The sample thus prepared was set on an experimental charge-exposure device, and corona charging was effected at +0.5 KV for 0.3 second, followed by immediate irradiation of a light image of a transmissive test chart with a tungsten lamp light at an irradiation dose of 2 lux-sec.

Immediately thereafter, a negatively chargeable developer (containing a toner and a carrier) was cascaded onto the surface of the image forming member, thus giving a good toner image thereon. The toner image was transferred onto a transfer paper by corona charging of +5.0 KV, giving a clear image of high density with excellent resolution and sufficient gradation reproducibility.

The evaluation of quality of the transferred toner image was repeated in the same manner as described above except that a semi-conductor laser of GaAs type of 810 nm (10 mW) was used in place of the tungsten lamp. The samples all gave a clear image having an excellent resolution and satisfactory gradation reproducibility.

EXAMPLE 4

By the use of the preparation device shown in FIG. 25, samples of image forming members for electrophotography (Sample Nos. 21-1A to No. 23-4A, Table 4A) were prepared on a cylindrical aluminum substrate under the condition shown in Table 3A.

The concentration distributions of germanium atoms and nitrogen atoms in the sample are shown in FIG. 26, and FIG. 27, respectively.

Each sample was subjected to an image quality evaluation test in the same manner as in Example 3. Every sample tested gave a transferred toner image of high quality, and did not show deterioration in the image quality after 200,000 times repetitive use under the operation condition of 38° C. and 80% RH.

EXAMPLE 5

Samples of an image forming member for electrophotography (Sample No. 11-1-1B-11-1-8B, 12-1-1B-12-1-8B, 13-1-1B-13-1-8B: 24 samples) were prepared under the same conditions and in the same manner as for Sample 11-1B, 12-1B, and 13-1B in Example 3 except that the layer (II) was prepared under the conditions shown in Table 5B.

Each sample thus prepared was set separately on a copying machine and was evaluated generally for quality of transferred image and durability of the member in continuous repetitive copying under the conditions described in the Examples regarding to each of the image forming member for electrophotography.

The evaluation of overall quality of the transferred image and the durability in continuous repetitive copying are shown in Table 6B.

EXAMPLE 6

Image forming members were prepared in the same manner as for Sample No. 11-1B in Example 3 except that the ratio of the content of silicon atoms and carbon stoms in the layer (II) was modified by changing the target area ratio of silicon wafer to graphite in forming the layer (II).

Each of the image forming member thus obtained was tested for the qaulity of the image formed after the 50,000 repetitions of image forming, developing, and cleaning processes as described in Example 3. The results are shown in Table 7B.

EXAMPLE 7

Each of the image forming members was prepared in the same manner as for the Sample No. 12-1B in Example 3 except that the content ratio of silicon atoms to carbon atoms in layer (II) was modified by changing the flow rate ratio of $SiH_4$ gas to $C_2H_4$ gas in forming the layer (II).

The image forming members thus obtained were evaluated for the image quality after 50,000 repetitions of the copying process including image transfer according to the procedure described in Example 3. The results are shown in Table 8B.

EXAMPLE 8

Each of the image forming members was prepared in the same manner as for the Sample No. 13-1B in Example 3 except that the content ratio of silicon atoms to carbon atoms in layer (II) was modified by changing the flow rate ratio of $SiH_4$ gas, $SiF_4$ gas, and $C_2H_4$ gas on forming the layer (II).

Each of the image forming members thus obtained was evaluated for the image quality after 50,000 repetitions of the image-forming, developing, and cleaning process according to precedure described in Table 3. The results are shown in Table 9B.

EXAMPLE 9

Each of the image forming members was prepared in the same manner as for the Sample No. 11-1B in Example 3 except that the layer thickness of the layer (II) was changed. After the repetition of image forming, developing, and cleaning process as described in Example 3, the results shown in Table 10B were obtained.

EXAMPLE 10

By the use of the preparation device shown in FIG. 25, samples of image forming members for electrophotography (Sample Nos. 11-1C to No. 13-4C, Table 2C) were prepared on a cylindrical aluminum substrate under the condition shown in Table 1C.

The concentration distributions of germanium atoms and nitrogen atoms in the sample are shown in FIG. 26, and FIG. 27, respectively.

The sample thus prepared was set on an experimental charge-exposure device, and corona charging was effected at +5.0 KV for 0.3 second, followed by immediate irradiation of a light image of a transmissive test chart with a tungsten lamp light at an irradiation dose of 2 lux-sec.

Immediately thereafter, a negatively chageable developer (containing a toner and a carrier) was cascaded onto the surface of the sample (the image forming member), thus giving a good toner image thereon. The toner image was transferred onto a transfer paper by corona charging of +5.0 KV, giving a clear image of high density with excellent resolution and sufficient gradation reproducibility.

The evaluation of quality of the transferred toner image was repeated in the same manner as described above except that a semi-conductor laser source of GaAs type of 810 nm (10 mW) was used in place of the tungsten lamp. The sample all gave a clear image having an excellent resolution and satisfactory gradation reproducibility.

EXAMPLE 11

By the use of the preparation device shown in FIG. 25, samples of image forming members for electrophotography (Sample Nos. 21-1C to No. 23-4C, Table 4C) were prepared on a cylindrical aluminum substrate under the condition shown in Table 3C in which the first layer region was formed on the aluminum substrate and the second layer region was formed on the first layer region.

The concentration distributions of germanium atoms and nitrogen atoms in the sample are shown in FIG. 26, and FIG. 27, respectively.

Each sample was subjected to image quality evaluation test in the same manner as in Example 10. Every sample tested gave a transferred toner image of high quality, and did not show deterioration in the image quality after 200,000 times repetitive use under the operation condition of 38° C. and 80% RH.

EXAMPLE 12

Samples of an image forming member for electrophotography (Sample No. 11-1-1C-11-1-8C, 12-1-1C-12-1-8C, 13-1-1C-13-1-8C: 24 samples) were prepared under the same conditions and in the same manner as for Sample 11-1C, 12-1C, and 13-1C in Example 10 except that the layer (II) was prepared under the conditions shown in Table 5C.

Each sample thus prepared was set separately on a copying machine and was evaluated generally for quality of transferred image and durability of the member in continuous repetitive copying under the conditions described in the Examples regarding to each of the image forming member for electrophotography.

The evaluation of overall quality of the transferred image and the durability in continuous repetitive copying are shown in Table 6C.

EXAMPLE 13

Image forming members were prepared in the same manner as for Sample No. 11-1C in Example 10 except that the ratio of the content of silicon atoms and carbon atoms in the layer (II) was modified by changing the target area ratio of silicon wafer to $SiO_2$ wafer in forming layer (II).

Each of the image forming member thus obtained was tested for the quality of the image formed after the 50,000 repetitions of image forming, developing, and cleaning processes as described in Example 10. The results are shown in Table 7C.

EXAMPLE 14

Each of the image forming members was prepared in the same manner as for the Sample No. 12-1C in Example 10 except that the content ratio of silicon atoms to oxygen atoms in layer (II) was modified by changing the flow rate ratio of $SiH_4$ gas to NO gas in forming the layer (II).

The image forming members thus obtained were evaluated for the image quality after 50,000 repetitions of the copying process including image transfer according to the procedure described in Example 10. The results are shown in Table 8C.

EXAMPLE 15

Each of the image forming members was prepared in the same manner as for the Sample No. 13-1C in Example 10 except that the ratio of silicon atoms to oxygen atoms in layer (II) was modified by changing the flow rate ratio of $SiH_4$ gas $SiF_4$ gas, and NO gas in forming the layer (II).

Each of the image forming member thus obtained was tested for the quality of the image formed after the 50,000 repetitions of image forming, developing, and cleaning processes. The results are shown in Table 9C.

EXAMPLE 16

Each of the image forming members was prepared in the same manner as for the Sample No. 11-1C in Example 10 except that the layer thickness of the layer (II) was changed. After the repetition of image forming, developing, and cleaning process as described in Example 10, the results shown in Table 10C were obtained.

EXAMPLE 17

By the use of the preparation device shown in FIG. 25, samples of image forming members for electrophotography (Sample Nos. 11-1D to 17-6D. Table 2D) were prepared on a cylindrical aluminum substrate under the condition shown in Table 1D.

The concentration distributions of germanium atoms and nitrogen atoms in the sample are shown in FIG. 26, and FIG. 27, respectively.

The sample thus prepared was set on an experimental charge-exposure device, and corona charging was effected at +5.0 KV for 0.3 second, followed by immediate irradiation of a light image of a transmissive test chart with a tungsten lamp light at an irradiation dose of 2 lux-sec.

Immediately thereafter, a negatively chargeable developer (containing a toner and a carrier) was cascaded onto the surface of the image forming member, thus giving a good toner image thereon. The toner image was transferred onto a transfer paper by corona charging of +5.0 KV, giving a clear image of high density with excellent resolution and sufficient gradation reproducibility.

The evaluation of quality of the transferred toner image was repeated in the same manner as described above except that a semi-conductor light source of GaAs type of 810 nm (10 mW) was used in place of the tungsten lamp. The sample all gave a clear image having an excellent resolution and satisfactory gradation reproducibility.

EXAMPLE 18

By the use of the preparation device shown in FIG. 25, the samples of image forming members for electrophotography (Sample Nos. 21-1D to 27-6D, Table 4D) were prepared on a cylindrical aluminum substrate under the condition shown in Table 3D.

Figure 28:
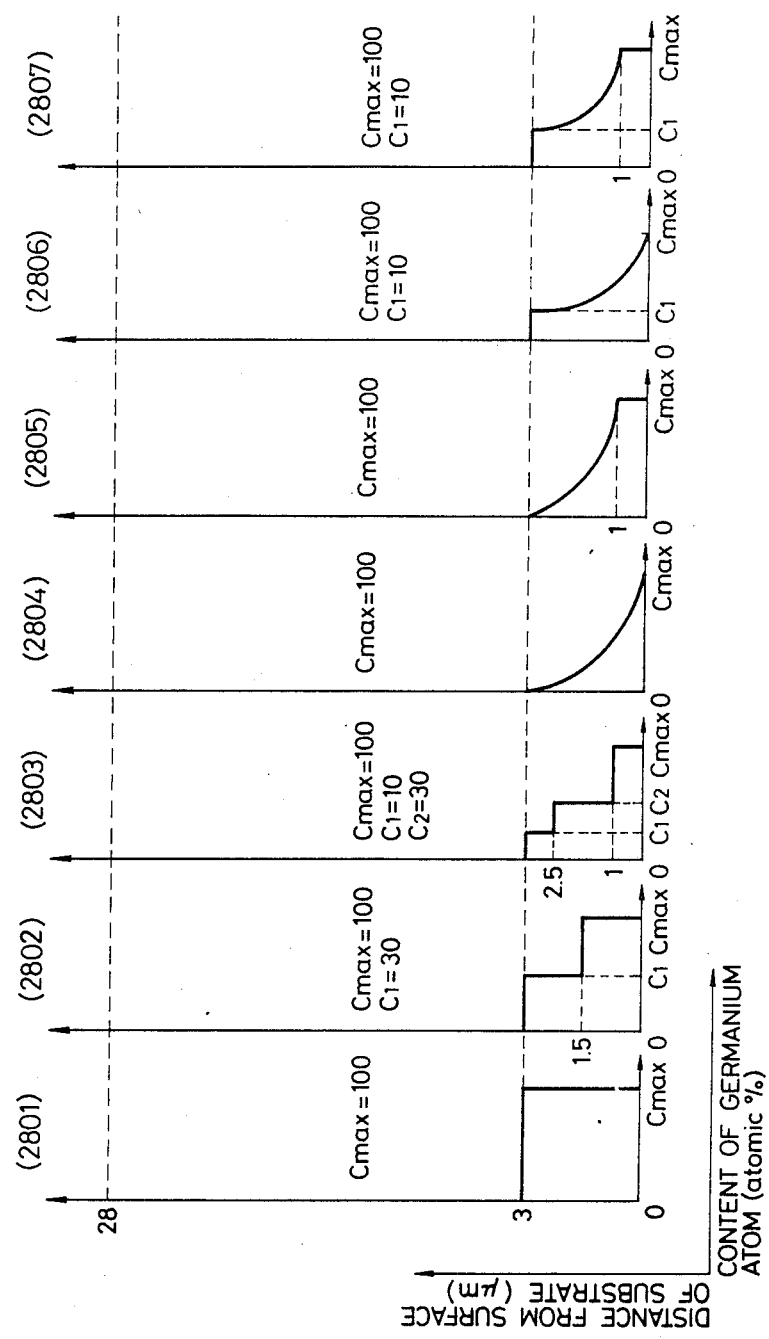
Figure 29:
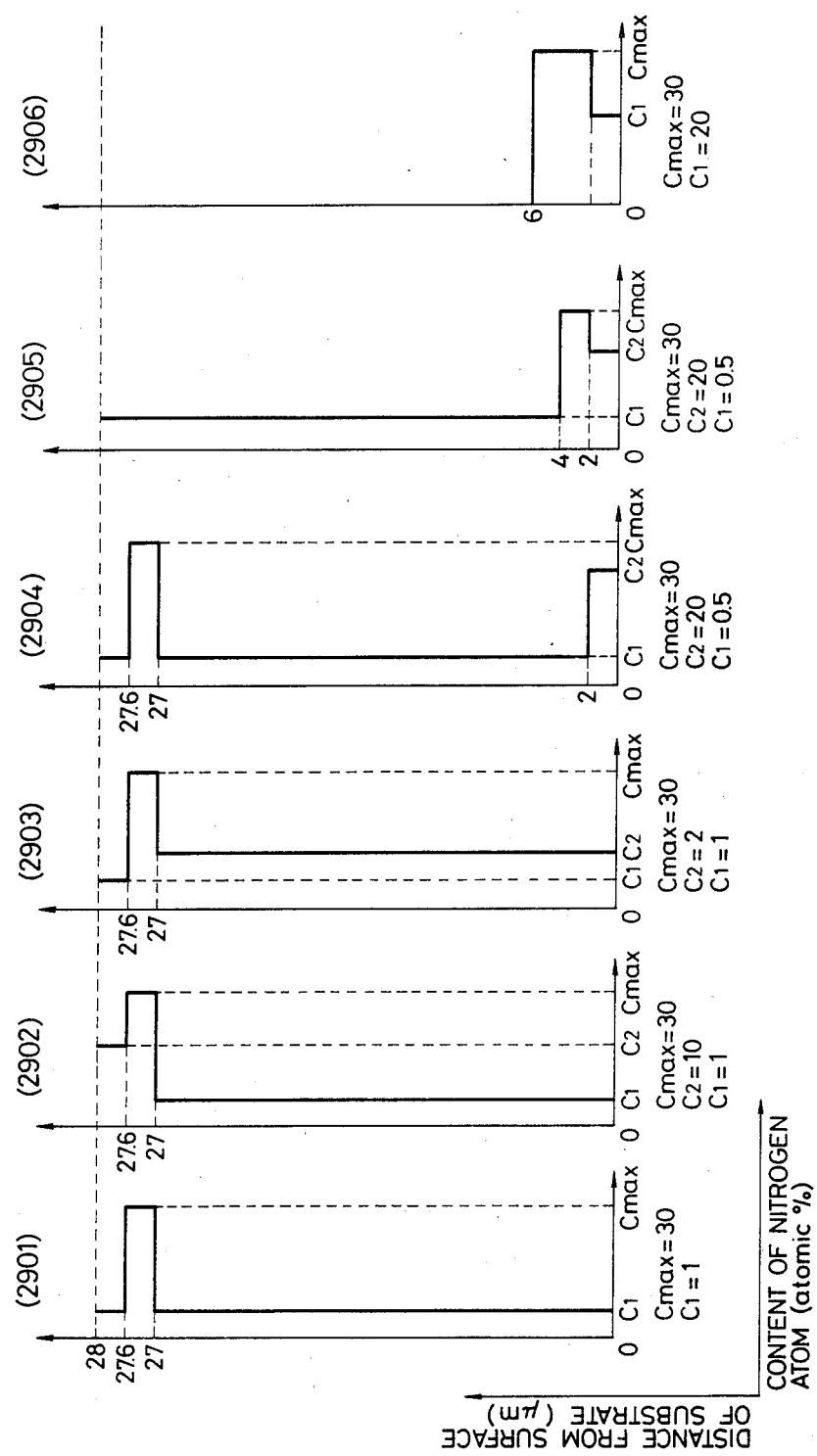

The concentrations distributions of germanium atoms and nitrogen atoms in the sample are shown in FIG. 28, and FIG. 29, respectively.

Each sample was subjected to image quality evaluation test in the same manner as in Example 17. Every sample tested gave a transferred toner image of high quality, and did not show deterioration in the image quality after 200,000 times repetitive use under the operation condition of 38° C. and 80% RH.

EXAMPLE 19

By the use of the preparation device shown in FIG. 25, samples of image forming members for electrophotography (Sample Nos. 31-1D to 37-6D, Table 6D) were prepared on a cylindrical aluminum substrate under the condition shown in Table 5D.

The concentration distributions of germanium atoms and nitrogen atoms in the sample are shown in FIG. 28, and FIG. 29, respectively.

Each sample was subjected to image quality evaluation test in the same manner as in Example 17. Every sample tested gave a transferred toner image of high quality, and did not show deterioration in the image quality after 200,000 times repetitive use under the operation condition of 38° C. and 80% RH.

EXAMPLE 20

By the use of the preparation device shown in FIG. 25, samples of image forming members for elecrohotography (Sample Nos. 41-1D to 47-6D, Table 8D) were prepared on a cylindrical aluminum substrate under the condition shown in Table 7D.

The concentration distributions of germanium atoms and nitrogen atoms in the sample are shown in FIG. 28, and FIG. 29, respectively.

Each sample was subjected to image quality evaluation test in the same manner as in Example 17. Every sample tested gave a transferred toner image of high quality, and did not show deterioration in the image quality after 200,000 times repetitive use under the operation condition of 38° C. and 80% RH.

EXAMPLE 21

By the use of the preparation device shown in FIG. 12, samples of image forming members for electrophotography (Sample Nos. 11-1E to 17-6E, Table 2E) were prepared on a cylindrical aluminum substrate under the condition shown in Table 1E.

The concentration distributions of germanium atoms and nitrogen atoms in the sample are shown in FIG. 28, and FIG. 29, respectively.

The sample thus prepared was set on an experimental charge-exposure device, and corona charging was effected at +5.0 KV for 0.3 second, followed by immediate irradiation of a light image of a transmissive test chart with a tungsten lamp light at an irradiation dose of 2 lux-sec.

Immediately thereafter, a negatively chargeable developer (containing a toner and a carrier) was cascaded onto the surface of the image forming member, thus giving a good toner image thereon. The toner image was transferred onto a transfer paper by corona charging of +5.0 KV, giving a clear image of high density with excellent resolution and sufficient gradation reproducibility.

The evaluation of quality of the transferred toner image was repeated in the same manner as described above except that a semi-conductor light source of GaAs type of 810 nm (10 mW) was used in place of the tungsten lamp. The sample all gave a clear image having an excellent resolution and satisfactory gradation reproducibility.

EXAMPLE 22

By the use of the preparation device shown in FIG. 25, samples of image forming members for electrophotography (Sample Nos. 21-1E to 27-6E, Table 4E) were prepared on a cylindrical aluminum substrate under the condition shown in Table 3E.

The concentration distributions of germanium atoms and nitrogen atoms in the sample are shown in FIG. 28, and FIG. 29, respectively.

Each sample was subjected to image quality evaluation test in the same manner as in Example 21. Every sample tested gave a transferred toner image of high quality, and did not show deterioration in the image quality after 200,000 times repetitive use under the operation condition of 38° C. and 80% RH.

EXAMPLE 23

By the use of the preparation device shown in FIG. 25, samples of image forming members for electrophotography (Sample Nos. 31-1E to 37-6E, Table 6E) were prepared on a cylindrical aluminum substrate under the condition shown in Table 3A.

The concentration distributions of germanium atoms and nitrogen atoms in the sample are shown in FIG. 28, and FIG. 29, respectively.

Each sample was subjected to image quality evaluation test in the same manner as in Example 21. Every sample tested gave a transferred toner image of high quality, and did not show deterioration in the image quality after 200,000 times repetitive use under the operation condition of 38° C. and 80% RH.

EXAMPLE 24

By the use of the preparation device shown in FIG. 25, samples of image forming members for electrophotography (Sample Nos. 41-1E to 47-6E, Table 8E) were prepared on a cylindrical aluminum substrate under the condition shown in Table 7E.

The concentration distributions of germanium atoms and nitrogen atoms in the sample are shown in FIG. 28, and FIG. 29, respectively.

Each sample was subjected to image quality evaluation test in the same manner as in Example 21. Every sample tested gave a transferred toner image of high quality, and did not show deterioration in the image quality after 200,000 times repetitive use under the operation condition of 38° C. and 80% RH.

EXAMPLE 25

Samples of an image forming member for electrophotography (Sample No. 11-1-1E - 11-1-8E, 12-1-1E - 12-1-8E, 13-1-1E - 13-1-8E: 24 samples) were prepared under the same conditions and in the same manner as for Sample 11-1E, 12-1E, and 13-1E in Example 21 except that the layer (II) was prepared under the conditions shown in Table 9E.

Each sample thus prepared was set separately on a copying machine and was evaluated generally for image quality of transferred image and durability of the member in continuous repetitive copying under the conditions described in the Examples regarding to each of the image forming member for electrophotography.

The evaluation of overall quality of the transferred image and the durability in continuous repetitive copying are shown in Table 10E.

EXAMPLE 26

Image forming members were prepared in the same manner as for Sample No. 11-1E in Example 21 except that the ratio of the content of silicon atoms and carbon atoms in the layer (II) was modified by changing the target area ratio of silicon wafer to graphite, in forming the layer (II).

Each of the image forming members thus obtained was tested for image quality formed after the 50,000 repetitions of image forming, developing, and cleaning processes. The results ae shown in Table 11E.

EXAMPLE 27

Each of the image forming members was prepared in the same manner as for the Sample No. 12-1E in Example 21 except that the content ratio of silicon atoms to carbon atoms in layer (II) was modified by changing the flow rate ratio of $SiH_4$ gas to $C_2H_4$ gas in forming the layer (II).

The image forming members thus obtained were evaluated for the image quality after 50,000 repetitions of the copying process including image transfer according to the procedure described in Example 21. The results are shown in Table 12E.

EXAMPLE 28

Each of the image forming members was prepared in the same manner as for the Sample No. 13-1E in Example 21 except that the content ratio of silicon atoms to carbon atoms in layer (II) was modified by changing the flow rate ratio of $SiH_4$ gas, $SiF_4$ gas and $C_2H_4$ gas in forming the layer (II).

Each of the image forming members thus obtained was tested for the quality of the image formed after the 50,000 repetitions of image forming, developing, and cleaning processes as described in Example 21. The results are shown in Table 13E.

EXAMPLE 29

Each of the image forming members was prepared in the same manner as for the Sample No. 11-1E in Example 21 except that the layer thickness of the layer (II) was changed. After the repetition of image forming, developing, and cleaning process as described in Example 21, the results shown in Table 14E were obtained.

EXAMPLE 30

By the use of the preparation device shown in FIG. 25, samples of image forming members for electrophotography (Sample Nos. 11-1F to No. 17-6F, Table 2F) were prepared on a cylindrical aluminum substrate under the condition shown in Table 1F.

The concentration distributions of germanium atoms and nitrogen atoms in the sample are shown in FIG. 28, and FIG. 29, respectively.

The sample thus prepared was set on an experimental charge-exposure device, and corona charging was effected at +5.0 KV for 0.3 second, followed by immediate irradiation of a light image of a transmissive test chart with a tungsten lamp light at an irradiation dose of 2 lux-sec.

Immediately thereafter, a negatively chargeable developer (containing a toner and a carrier) was cascaded onto the surface of the image forming member, thus giving a good toner image thereon. The toner image was transferred onto a transfer paper by a corona charging of +5.0 KV, giving a clear image of high density with excellent resolution and sufficient gradation reproducibility.

The evaluation of quality of the transferred toner image was repeated in the same manner as described above except that a semi-conductor light source of GaAs type of 810 nm (10 mW) was used in place of the tungsten lamp. The sample all gave a clear image having an excellent resolution and satisfactory gradation reproducibility.

EXAMPLE 31

By the use of the preparation device shown in FIG. 25, samples of image forming members for electrophotography (Sample Nos. 21-1F to No. 27-6F, Table 4F) were prepared on a cylindrical aluminum substrate under the condition shown in Table 3F.

The concentration distributions of germanium atoms and nitrogen atoms in the sample are shown in FIG. 28, and FIG. 29, respectively.

Each sample ws subjected to image quality evaluation test in the same manner as in Example 30. Every sample tested gave a transferred toner image of high quality, and did not show deterioration in the image quality after 200,000 times repetitive use under the operation condition of 38° C. and 80% RH.

EXAMPLE 32

By the use of the preparation device shown in FIG. 25, samples of image forming members for electrophotography (Sample Nos. 31-1F to 37-6F, Table 6F) were prepared on a cylindrical aluminum substrate under the condition shown in Table 5F.

The concentration distributions of germanium atoms and nitrogen atoms in the sample are shown in FIG. 28, and FIG. 29, respectively.

Each sample was subjected to image quality evaluation test in the same manner as in Example 30. Every sample tested gave a transferred toner image of high quality, and did not show deterioration in the image quality after 200,000 times repetitive use under the operation condition of 38° C. and 80% RH.

EXAMPLE 23

By the use of the preparation device shown in FIG. 25, samples of image forming members for electrophotography (Samples Nos. 41-1F to No. 47-6F, Table 8F) were prepared on cylindrical aluminum substrate under the condition shown in Table 7F.

The concentration distributions of germanium atoms and nitrogen atoms in the sample are shown in FIG. 28, and FIG. 29, respectively.

Each samples were subjected to image quality evaluation test in the same manner as in Example 30. Every sample tested gave a transferred toner image of high quality, and did not show deterioration in the image quality after 200,000 times repetitive use under the operation condition of 38° C. and 80% RH.

EXAMPLE 34

Samples of an image forming member for electrophotography (Sample No. 11-1-1F - 11-1-8F, 12-1-1F - 12-1-8F, 13-1-1F: 24 samples) were prepared under the same conditions and in the same manner as for Sample 11-1F, 12-1F and 13-1F in Example 30 except that the layer (II) was prepared under the conditions shown in Table 9F.

Each sample thus prepared was set separately on a copying machine and was evaluated generally for quality of transferred image and durability of the member in continuous repetitive copying under the conditions described in the Examples regarding to each of the image forming member for electrophotography.

The evaluation of overall quality of the transferred image and the durability in continuous repetitive copying are shown in Table 10F.

EXAMPLE 35

Image forming members were prepared in the same manner as for Sample No. 11-1F in Example 30 except that the ratio of the content of silicon atoms and oxygen atoms in the layer (II) was modified by changing the target area ratio of silicon wafer to $SiO_2$ wafer, in forming the layer (II).

Each of the image forming members thus obtained was tested for the quality of the image formed after the 50,000 repetitions of image forming, developing, and cleaning processes as described in Example 30. The results are shown in Table 11F.

EXAMPLE 36

Each of the image forming members was prepared in the same manner as for the Sample No. 12-1F in Example 30 except that the content ratio of silicon atoms to oxygen atoms in layer (II) was modified by changing the flow rate ratio of $SiH_4$ gas to NO gas in forming the layer (II).

The image forming members thus obtained were evaluated for the image quality after 50,000 repetitions of the copying process including image transfer according to the procedure described in Example 30. The results are shown in Table 12F.

EXAMPLE 37

Each of the image forming members was prepared in the same manner as for the Sample No. 13-1F in Example 30 except that the content ratio of silicon atoms to oxygen atoms in layer (II) was modified by changing the flow rate ratio of $SiH_4$ gas, $SiF_4$ gas, NO gas in forming the layer (II).

Each of the image forming members thus obtained was tested for the quality of the image formed after the 50,000 repetitions of image forming, developing, and cleaning processes as described in Example 30. The results are shown in Table 13F.

EXAMPLE 38

Each of the image forming members was prepared in the same manner as for the Sample No. 11-1F in Example 30 except that the layer thickness of the layer (II) was changed. After the repetition of image forming, developing, and cleaning process, the results shown in Table 14F were obtained.

The condition of the layer formation in the Examples of the present invention is as below:
Substrate temperature:
  approximately 200° C. for the layer containing germanium
  approximately 250° C. for the layer not containing germanium
Discharge frequency: 13.56 MHz
Inner pressure of reaction chamber during reaction: 0.3 Torr

TABLE 1A

| Layer constitution | Gases employed | Flow rate (SCCM) | Flow rate ratio | Discharging power (W/cm$^2$) | Layer formation rate (Å/sec) | Layer thickness (μm) |
|---|---|---|---|---|---|---|
| Light receiving layer | $SiF_4/He$ = 0.5<br>$GeF_4/He$ = 0.5<br>$NH_3$<br>$H_2$ | $SiF_4 + GeF_4$ = 200 | $\dfrac{(SiF_4 + GeF_4)}{(H_2 + SiF_4 + GeF_4)} =$ 7/10 | 0.18 | 15 | 25 |

TABLE 2A

| | Figure of Ge distribution Sample No. | | |
|---|---|---|---|
| Figure of N distribution | 2601 | 2602 | 2603 |
| 2701 | 11-1A | 12-1A | 13-1A |
| 2702 | 11-2A | 12-2A | 13-2A |
| 2703 | 11-3A | 12-3A | 13-3A |
| 2704 | 11-4A | 12-4A | 13-4A |

TABLE 3A

| Layer constitution | Gases employed | Flow rate (SCCM) | Flow rate ratio | Discharging power (W/cm$^2$) | Layer formation rate (Å/sec) | Layer thickness (μm) |
|---|---|---|---|---|---|---|
| Layer region (I) | $SiF_4/He$ = 0.5<br>$GeF_4/He$ = 0.5<br>$NH_3$<br>$H_2$<br>$B_2H_6/He$ = $10^{-3}$ | $SiF_4 + GeF_4$ = 200 | $\dfrac{(SiF_4 + GeF_4)}{(H_2 + SiF_4 + GeF_4)} =$ 7/10<br>$\dfrac{B_2H_6}{(SiF_4 + GeF_4)} =$ $2 \times 10^{-3}$ | 0.18 | 15 | 5 |
| Layer region (II) | $SiF_4/He$ = 0.5<br>$GeF_4/He$ = 0.5<br>$NH_3$<br>$H_2$ | $SiF_4 + GeF_4$ = 200 | $\dfrac{(SiF_4 + GeF_4)}{(H_2 + SiF_4 + GeF_4)} =$ 7/10 | 0.18 | 15 | 20 |

TABLE 4A

| Figure of N distribution | Figure of Ge distribution Sample No. | | |
|---|---|---|---|
| | 2601 | 2602 | 2603 |
| 2701 | 21-1A | 22-1A | 23-1A |
| 2702 | 21-2A | 22-2A | 23-2A |
| 2703 | 21-3A | 22-3A | 23-3A |
| 2704 | 21-4A | 22-4A | 23-4A |

TABLE 4B

| Figure of N distribution | Figure of Ge distribution Sample No. | | |
|---|---|---|---|
| | 2601 | 2602 | 2603 |
| 2701 | 21-1B | 22-1B | 23-1B |
| 2702 | 21-2B | 22-2B | 23-2B |
| 2703 | 21-3B | 22-3B | 23-3B |
| 2704 | 21-4B | 22-4B | 23-4B |

TABLE 1B

| Layer constitution | Gases employed | Flow rate (SCCM) | Flow rate ratio | Discharging power (W/cm$^2$) | Layer formation rate (Å/sec) | Layer thickness (μm) |
|---|---|---|---|---|---|---|
| Layer (I) | $SiF_4/He = 0.5$ $GeF_4/He = 0.5$ $NH_3$ $H_2$ | $SiF_4 + GeF_4 = 200$ | $\dfrac{(SiF_4 + GeF_4)}{(H_2 + SiF_4 + GeF_4)} = 7/10$ | 0.18 | 15 | 25 |
| Layer (II) | $SiH_4/He = 0.5$ | $SiH_4 = 100$ | $SiH_4/C_2H_4 = 3/7$ | 0.18 | 10 | 0.5 |

TABLE 5B

| Conditions | Gases employed | Flow rate (SCCM) | Flow rate ratio or area ratio | Discharging power (W/cm$^2$) | Layer thickness (μ) |
|---|---|---|---|---|---|
| 5-1B | Ar | 200 | Si wafer:graphite = 1.5:8.5 | 0.3 | 0.5 |
| 5-2B | Ar | 200 | Si wafer:graphite = 0.5:9.5 | 0.3 | 0.3 |
| 5-3B | Ar | 200 | Si wafer:graphite = 6.4 | 0.3 | 1.0 |
| 5-4B | $SiH_4/He = 1$ $C_2H_4$ | $SiH_4 = 15$ | $SiH_4:C_2H_4 = 0.4:9.6$ | 0.18 | 0.3 |
| 5-5B | $SiH_4/He = 0.5$ $C_2H_4$ | $SiH_4 = 100$ | $SiH_4:C_2H_4 = 5:5$ | 0.18 | 1.5 |
| 5-6B | $SiH_4/He = 0.5$ $SiF_4/He = 0.5$ $C_2H_4$ | $SiH_4 + SiF_4 = 150$ | $SiH_4:SiF_4:C_2H_4 = 1.5:1.5:7$ | 0.18 | 0.5 |
| 5-7B | $SiH_4/He = 0.5$ $SiF_4/He = 0.5$ $C_2H_4$ | $SiH_4 + SiF_4 = 15$ | $SiH_4:SiF_4:C_2H_4 = 0.3:0.1:9.6$ | 0.18 | 0.3 |
| 5-8B | $SiH_4/He = 0.5$ $SiF_4/He = 0.5$ $C_2H_4$ | $SiH_4 + SiF_4 = 150$ | $SiH_4:SiF_4:C_2H_4 = 3:3:4$ | 0.18 | 1.5 |

TABLE 2B

| Figure of N distribution | Figure of Ge distribution Sample No. | | |
|---|---|---|---|
| | 2601 | 2602 | 2603 |
| 2701 | 11-1B | 12-1B | 13-1B |
| 2702 | 11-2B | 12-2B | 13-2B |
| 2703 | 11-3B | 12-3B | 13-3B |
| 2704 | 11-4B | 12-4B | 13-4B |

TABLE 6B

| Layer (II) formation conditions | Sample No./Evaluation | | |
|---|---|---|---|
| 5-1B | 11-1-1B ○ ○ | 12-1-1B ○ ○ | 13-1-1B ○ ○ |
| 5-2B | 11-1-2B ○ ○ | 12-1-2B ○ ○ | 13-1-2B ○ ○ |
| 5-3B | 11-1-3B ○ ○ | 12-1-3B ○ ○ | 13-1-3B ○ ○ |
| 5-4B | 11-1-4B ⊙ ⊙ | 12-1-4B ⊙ ⊙ | 13-1-4B ⊙ ⊙ |
| 5-5B | 11-1-5B ⊙ ⊙ | 12-1-5B ⊙ ⊙ | 13-1-5B ⊙ ⊙ |
| 5-6B | 11-1-6B ⊙ ⊙ | 12-1-6B ⊙ ⊙ | 13-1-6B ⊙ ⊙ |

TABLE 3B

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer region | $SiF_4/He = 0.5$ $GeF_4/He = 0.5$ $NH_3$ $H_2$ $B_2H_6/He = 1 \times 10^{-3}$ | $SiF_4 + GeF_4 = 200$ | $\dfrac{(SiF_4 + GeF_4)}{(H_2 + SiF_4 + GeF_4)} = 7/10$ $\dfrac{B_2H_6}{(SiF_4 + GeF_4)} = 2 \times 10^{-3}$ | 0.18 | 15 | 5 |
| | Second layer region | $SiF_4/He = 0.5$ $GeF_4/He = 0.5$ $NH_3$ $H_2$ | $SiF_4 + GeF_4 = 200$ | $\dfrac{(SiF_4 + GeF_4)}{(H_2 + SiF_4 + GeF_4)} = 7/10$ | 0.18 | 15 | 20 |
| Layer (II) | | $SiH_4/He = 0.5$ $C_2H_4$ | $SiH_4 = 100$ | $SiH_4/C_2H_4 = 3/7$ | 0.18 | 10 | 0.5 |

TABLE 6B-continued

| Layer (II) formation conditions | Sample No./Evaluation | | | |
|---|---|---|---|---|
| 5-7B | 11-1-7B ○ ○ | 12-1-7B ○ ○ | 13-1-7B ○ ○ | |
| 5-8B | 11-1-8B ○ ○ | 12-1-8B ○ ○ | 13-1-8B ○ ○ | |

TABLE 10B

| Sample No. | Thickness of layer (II) (μ) | Result |
|---|---|---|
| 1601B | 0.001 | Image defect liable to occur |
| 1602B | 0.02 | No image defect during 20,000 repetitions |
| 1603B | 0.05 | Stable for 50,000 repetitions |
| 1604B | 1 | Stable for 200,000 repetitions |

TABLE 1C

| Layer constitution | Gases employed | Flow rate (SCCM) | Flow rate ratio | Discharging power (W/cm$^2$) | Layer formation rate (Å/sec) | Layer thickness (μm) |
|---|---|---|---|---|---|---|
| Layer (I) | $SiF_4/He = 0.5$<br>$GeF_4/He = 0.5$<br>$NH_3$<br>$H_2$ | $SiF_4 + GeF_4 = 200$ | $\dfrac{GeF_4}{(H_2 + SiF_4 + GeF_4)} = *$<br>$\dfrac{NH_3}{SiF_4 + GeF_4} = **$ | 0.18 | 15 | 25 |
| Layer (II) | $SiH_4/He = 0.5$<br>NO | $SiH_4 = 100$ | $SiH_4/NO = 3/7$ | 0.18 | 10 | 0.5 |

*, ** ... Flow rate ratio was changed by automatically controlling the valve opening according to the predetermined flow rate change curve.

Sample No.
Overall image evaluation   Durability evaluation
Evaluation standard:
⊚ Excellent
○ Good

TABLE 2C

| Figure of N distribution | Figure of Ge distribution Sample No. | | |
|---|---|---|---|
| | 2601 | 2602 | 2603 |
| 2701 | 11-1C | 12-1C | 13-1C |
| 2702 | 11-2C | 12-2C | 13-2C |
| 2703 | 11-3C | 12-3C | 13-3C |
| 2704 | 11-4C | 12-4C | 13-4C |

TABLE 7B

| Sample No. | 1301B | 1302B | 1303B | 1304B | 1305B | 1306B | 1307B |
|---|---|---|---|---|---|---|---|
| Si:C Target (area ratio) | 9:1 | 6.5:3.5 | 4:6 | 2:8 | 1:9 | 0.5:9.5 | 0.2:9.8 |
| Si:C (content ratio) | 9.7:0.3 | 8.8:1.2 | 7.3:2.7 | 4.8:5.2 | 3:7 | 2:8 | 0.8:9.2 |
| Image evaluation | Δ | ○ | ○ | ○ | ○ | Δ | X |

⊚: Very good
○: Good
Δ: Practically satisfactory
X: Image defect formed

TABLE 8B

| Sample No. | 1401B | 1402B | 1403B | 1404B | 1405B | 1406B | 1407B | 1408B |
|---|---|---|---|---|---|---|---|---|
| $SiH_4:C_1H_4$ (Flow rate ratio) | 9:1 | 6:4 | 4:6 | 2:8 | 1:9 | 0.5:9.5 | 0.35:9.65 | 0.2:9.8 |
| Si:C (Content ratio) | 9:1 | 7:3 | 5.5:4.5 | 4:6 | 3:7 | 2:8 | 1.2:8.8 | 0.8:9.2 |
| Image evaluation | Δ | ○ | ⊚ | ⊚ | ⊚ | ○ | Δ | X |

⊚: Very good
○: Good
Δ: Practically satisfactory
X: Image defect formed

TABLE 9B

| Sample No. | 1501B | 1502B | 1503B | 1504B | 1505B | 1506B | 1507B | 1508B |
|---|---|---|---|---|---|---|---|---|
| $SiH_4:SiF_4:C_2H_4$ (Flow rate ratio) | 5.4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (Content ratio) | 9:1 | 7:3 | 5.5:4.5 | 4:6 | 3:7 | 2:8 | 1.2:8.8 | 0.8:9.2 |
| Image evaluation | Δ | ○ | ⊚ | ⊚ | ⊚ | ○ | Δ | X |

⊚: Very good
○: Good
Δ: Practically satisfactory
X: Image defect formed

TABLE 3C

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer region | SiF$_4$/He = 0.5<br>GeF$_4$/He = 0.5<br>NH$_3$<br>H$_2$<br>B$_2$H$_6$/He = 1 × 10 | SiF$_4$ + GeF$_4$ = 200 | $\frac{GeF_4}{(H_2 + SiF_4 + GeF_4)}$ = (*)<br>$\frac{B_2H_6}{(SiF_4 + GeF_4)}$ = 1 × 10$^{-3}$ | 0.18 | 15 | 5 |
| | Second layer region | SiF$_4$/He = 0.5<br>GeF$_4$/He = 0.5<br>NH$_3$<br>H$_2$ | SiF$_4$ + GeF$_4$ = 200 | $\frac{GeF_4}{(H_2 + SiF_4 + GeF_4)}$ = (*) | 0.18 | 15 | 20 |
| Layer (II) | | SiH$_4$/He = 0.5<br>NO | SiH$_4$ = 100 | SiH$_4$/NO = 3/7 | 0.18 | 10 | 0.5 |

(*) ... Flow rate ratio was changed by automatically controlling the valve opening according to the predetermined flow rate changed curve.

TABLE 4C

| Figure of N distribution | Figure of Ge distribution Sample No. | | |
|---|---|---|---|
| | 2601 | 2602 | 2603 |
| 2701 | 21-1C | 22-1C | 23-1C |
| 2702 | 21-2C | 22-2C | 23-2C |
| 2703 | 21-3C | 22-3C | 23-3C |
| 2704 | 21-4C | 22-4C | 23-4C |

TABLE 5C

| Conditions | Gases employed | Flow rate (SCCM) | Flow rate ratio or area ratio | Discharging power (W/cm$^2$) | Layer thickness ($\mu$) |
|---|---|---|---|---|---|
| 5-1C | Ar | 200 | Si wafer:SiO$_2$ = 1:30 | 0.3 | 0.5 |
| 5-2C | Ar | 200 | Si wafer:SiO$_2$ = 1:60 | 0.3 | 0.3 |
| 5-3C | Ar | 200 | Si wafer:SiO$_2$ = 6:4 | 0.3 | 1.0 |
| 5-4C | SiH$_4$/He = 1<br>NO | SiH$_4$ = 15 | SiH$_4$:NO = 5:1 | 0.18 | 0.3 |
| 5-5C | SiH$_4$/He = 0.5<br>NO | SiH$_4$ = 100 | SiH$_4$:NO = 1:1 | 0.18 | 1.5 |
| 5-6C | SiH$_4$/He = 0.5<br>SiF$_4$/He = 0.5<br>NO | SiH$_4$ + SiF$_4$ = 150 | SiH$_4$:SiF$_4$:NO = 1:1:1 | 0.18 | 0.5 |
| 5-7C | SiH$_4$/He = 0.5<br>SiF$_4$/He = 0.5<br>NO | SiH$_4$ + SiF$_4$ = 15 | SiH$_4$:SiF$_4$:NO = 2:1:4 | 0.18 | 0.3 |
| 5-8C | SiH$_4$/He = 0.5<br>SiF$_4$/He = 0.5<br>NO | SiH$_4$ + SiF$_4$ = 150 | SiH$_4$:SiF$_4$:NO = 1:1:3 | 0.18 | 1.5 |

TABLE 6C

| Layer (II) formation conditions | Sample No./Evaluation | | |
|---|---|---|---|
| 5-1C | 11-1-1C ○ ○ | 12-1-1C ○ ○ | 13-1-1C ○ ○ |
| 5-2C | 11-1-2C ○ ○ | 12-1-2C ○ ○ | 13-1-2C ○ ○ |
| 5-3C | 11-1-3C ○ ○ | 12-1-3C ○ ○ | 13-1-3C ○ ○ |
| 5-4C | 11-1-4C ⊙ ⊙ | 12-1-4C ⊙ ⊙ | 13-1-4C ⊙ ⊙ |
| 5-5C | 11-1-5C ⊙ ⊙ | 12-1-5C ⊙ ⊙ | 13-1-5C ⊙ ⊙ |
| 5-6C | 11-1-6C ⊙ ⊙ | 12-1-6C ⊙ ⊙ | 13-1-6C ⊙ ⊙ |
| 5-7C | 11-1-7C ○ ○ | 12-1-7C ○ ○ | 13-1-7C ○ ○ |
| 5-8C | 11-1-8C ○ ○ | 12-1-8C ○ ○ | 13-1-8C ○ ○ |

Sample No. Overall image evaluation Durability evaluation
Evaluation standard:
⊙ Excellent
○ Good

TABLE 7C

| Sample No. | 1301C | 1302C | 1303C | 1304C | 1305C | 1306C | 1307C |
|---|---|---|---|---|---|---|---|
| Si:SiO$_2$ Target (area ratio) | 9:1 | 6.5:3.5 | 4:10 | 2:60 | 1:100 | 1:100 | 1:100 |
| (NO/Ar) | (0/1) | (1/1) | (1/1) | (1/1) | (2/1) | (3/1) | (4/1) |
| Si:O (content ratio) | 9.7:0.3 | 8.8:1.2 | 7.3:2.7 | 5.0:5.0 | 4.5:5.5 | 4:6 | 3:7 |

TABLE 7C-continued

| Sample No. | 1301C | 1302C | 1303C | 1304C | 1305C | 1306C | 1307C |
|---|---|---|---|---|---|---|---|
| Image evaluation | Δ | ⊚ | ⊚ | ○ | ○ | Δ | X |

⊚: Very good
○: Good
Δ: Practically satisfactory
X: Image defect formed

TABLE 8C

| Sample No. | 1401C | 1402C | 1403C | 1404C | 1405C | 1406C | 1407C |
|---|---|---|---|---|---|---|---|
| $SiH_4$:NO (Flow rate ratio) | 1000:1 | 99:1 | 5:1 | 1:1 | 1:2 | 3:10 | 1:1000 |
| Si:O (Content ratio) | 9.9999:0.0001 | 9.9:0.1 | 9:1 | 6:4 | 5:5 | 3.3:6.7 | 2:8 |
| Image evaluation | Δ | ○ | ⊚ | ⊚ | ○ | Δ | X |

⊚ : Very good
○: Good
Δ: Practically satisfactory
X: Image defect formed

TABLE 9C

| Sample No. | 1501C | 1502C | 1503C | 1504C | 1505C | 1506C | 1507C |
|---|---|---|---|---|---|---|---|
| $SiH_4$:$SiF_4$:NO (Flow rate ratio) | 500:400:1 | 50:50:1 | 5:5:2 | 5:5:10 | 1:1:4 | 3:3:20 | 1:1:2000 |
| Si:O (Content ratio) | 9.9998:0.0002 | 9.8:0.2 | 8.8:1:2 | 6.3:3.7 | 5.1:4.9 | 3.5:6.5 | 2.3:7.7 |
| Image evaluation | Δ | ○ | ⊚ | ⊚ | ○ | Δ | X |

⊚: Very good
○: Good
Δ: Practically satisfactory
X: Image defect formed

TABLE 10C

| Sample No. | Thickness of layer (II) (μ) | Result |
|---|---|---|
| 1601C | 0.001 | Image defect liable to occur |
| 1602C | 0.02 | No image defect during 20,000 repetitions |
| 1603C | 0.05 | Stable for 50,000 repetitions |
| 1604C | 1 | Stable for 200,000 repetitions |

TABLE 1D

| Layer constitution | Gases employed | Flow rate (SCCM) | Flow rate ratio | Discharging power (W/cm²) | Layer formation rate (Å/sec) | Layer thickness (μm) |
|---|---|---|---|---|---|---|
| Layer region (I) | $SiH_4$/He = 0.5 $GeH_4$/He = 0.5 $NH_3$ | $SiH_4$ + $GeH_4$ = 200 | — | 0.18 | 15 | 5 |
| Layer region (II) | $SiH_4$/He = 0.5 $NH_3$ | $SiH_4$ = 200 | — | 0.18 | 15 | 23 |

TABLE 2D

| | Figure of Ge distribution Sample No. | | | | | | |
|---|---|---|---|---|---|---|---|
| Figure of N distribution | 2801 | 2802 | 2803 | 2804 | 2805 | 2806 | 2807 |
| 2901 | 11-1D | 12-1D | 13-1D | 14-1D | 15-1D | 16-1D | 17-1D |
| 2902 | 11-2D | 12-2D | 13-2D | 14-2D | 15-2D | 16-2D | 17-2D |
| 2903 | 11-3D | 12-3D | 13-3D | 14-3D | 15-3D | 16-3D | 17-3D |
| 2904 | 11-4D | 12-4D | 13-4D | 14-4D | 15-4D | 16-4D | 17-4D |
| 2905 | 11-5D | 12-5D | 13-5D | 14-5D | 15-5D | 16-5D | 17-5D |
| 2906 | 11-6D | 12-6D | 13-6D | 14-6D | 15-6D | 16-6D | 17-6D |

TABLE 3D

| Layer constitution | Gases employed | Flow rate (SCCM) | Flow rate ratio | Discharging power (W/cm²) | Layer formation rate (Å/sec) | Layer thickness (μm) |
|---|---|---|---|---|---|---|
| Layer region (I) | $SiH_4$/He = 0.5 $GeH_4$/He = 0.5 $NH_3$ $B_2H_6$/He = $10^{-3}$ | $SiH_4$ + $GeH_4$ = 200 | — | 0.18 | 15 | 3 |
| Layer region (II) | $SiH_4$/He = 0.5 $NH_3$ | $SiH_4$ = 200 | — | 0.18 | 15 | 25 |

TABLE 4D

| Figure of N distribution | Figure of Ge distribution Sample No. | | | | | | |
|---|---|---|---|---|---|---|---|
| | 2801 | 2802 | 2803 | 2804 | 2805 | 2806 | 2807 |
| 2901 | 21-1D | 22-1D | 23-1D | 24-1D | 25-1D | 26-1D | 27-1D |
| 2902 | 21-2D | 22-2D | 23-2D | 24-2D | 25-2D | 26-2D | 27-2D |
| 2903 | 21-3D | 22-3D | 23-3D | 24-3D | 25-3D | 26-3D | 27-3D |
| 2904 | 21-4D | 22-4D | 23-4D | 24-4D | 25-4D | 26-4D | 27-4D |
| 2905 | 21-5D | 22-5D | 23-5D | 24-5D | 25-5D | 26-5D | 27-5D |
| 2906 | 21-6D | 22-6D | 23-6D | 24-6D | 25-6D | 26-6D | 27-6D |

TABLE 5D

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer region (I) | SiH$_4$/He = 0.5<br>GeF$_4$/He = 0.5<br>NH$_3$<br>B$_2$H$_6$/He = 10$^{-3}$ | SiH$_4$ + GeF$_4$ = 200 | | 0.18 | 15 | 2.5 |
| Layer region (II) | SiH$_4$/He = 0.5<br>NH$_3$<br>GeF$_4$/He = 0.5 | SiH$_4$ + GeF$_4$ = 200 | | 0.18 | | 0.5 |
| Layer region (III) | SiH$_4$/He = 0.5<br>NH$_3$ | SiH$_4$ = 200 | | 0.18 | 15 | 25 |

TABLE 6D

| Figure of N distribution | Figure of Ge distribution Sample No. | | | | | | |
|---|---|---|---|---|---|---|---|
| | 2801 | 2802 | 2803 | 2804 | 2805 | 2806 | 2807 |
| 2901 | 31-1D | 32-1D | 33-1D | 34-1D | 35-1D | 36-1D | 37-1D |
| 2902 | 31-2D | 32-2D | 33-2D | 34-2D | 35-2D | 36-2D | 37-2D |
| 2903 | 31-3D | 32-3D | 33-3D | 34-3D | 35-3D | 36-3D | 37-3D |
| 2904 | 31-4D | 32-4D | 33-4D | 34-4D | 35-4D | 36-4D | 37-4D |
| 2905 | 31-5D | 32-5D | 33-5D | 34-5D | 35-5D | 36-5D | 37-5D |
| 2906 | 31-6D | 32-6D | 33-6D | 34-6D | 35-6D | 36-6D | 37-6D |

TABLE 7D

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer region (I) | SiF$_4$/He = 0.5<br>GeF$_4$/He = 0.5<br>NH$_3$<br>H$_2$<br>B$_2$H$_6$/He = 10$^{-3}$ | SiF$_4$ + GeF$_4$ = 200 | $\dfrac{SiF_4 + GeF_4}{H_2 + SiF_4 + GeF_4} = 7/10$ | 0.18 | 15 | 2.5 |
| Layer region (II) | SiF$_4$/He = 0.5<br>NH$_3$<br>H$_2$<br>GeF$_4$/He = 0.5 | SiF$_4$ = 200 | | 0.18 | 15 | 0.5 |
| Layer region (III) | SiF$_4$/He = 0.5<br>H$_2$<br>NH$_3$ | SiF$_4$ = 200 | | 0.18 | 15 | 25 |

TABLE 8D

| Figure of N distribution | Figure of Ge distribution Sample No. | | | | | | |
|---|---|---|---|---|---|---|---|
| | 2801 | 2802 | 2803 | 2804 | 2805 | 2806 | 2807 |
| 2901 | 41-1D | 42-1D | 43-1D | 44-1D | 45-1D | 46-1D | 47-1D |
| 2902 | 41-2D | 42-2D | 43-2D | 44-2D | 45-2D | 46-2D | 47-2D |
| 2903 | 41-3D | 42-3D | 43-3D | 44-3D | 45-3D | 46-3D | 47-3D |
| 2904 | 41-4D | 42-4D | 43-4D | 44-4D | 45-4D | 46-4D | 47-4D |
| 2905 | 41-5D | 42-5D | 43-5D | 44-5D | 45-5D | 46-5D | 47-5D |
| 2906 | 41-6D | 42-6D | 43-6D | 44-6D | 45-6D | 46-6D | 47-6D |

TABLE 1E

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer region (G) | SiH$_4$/He = 0.5<br>GeH$_4$/He = 0.5<br>NH$_3$ | SiH$_4$ + GeH$_4$ = 200 | $\dfrac{GeH_4}{SiH_4 + GeH_4} = (*)$<br>$\dfrac{NH_3}{SiH_4 + NH_3} = (**)$ | 0.18 | 15 | 3 |

TABLE 1E-continued

| Layer constitution | | Gases employed | Flow rate (SCCM) | Flow rate ratio | Discharging power (W/cm²) | Layer formation rate (Å/sec) | Layer thickness (μ) |
|---|---|---|---|---|---|---|---|
| | Second layer region (S) | SiH₄/He = 0.5 NH₃ | SiH₄ = 200 | $\frac{NH_3}{SiH_4 + NH_3}$ = (**) | 0.18 | 15 | 25 |
| Layer (II) | | SiH₄/He = 0.5 C₂H₄ | SiH₄ = 100 | SiH₄/C₂H₄ = 3/7 | 0.18 | 10 | 0.5 |

(*), (**) ... Flow rate ratio was changed by automatically controlling the valve opening according to the predetermined flow rate changed curve.

TABLE 2E

| | Figure of Ge distribution Sample No. | | | | | | |
|---|---|---|---|---|---|---|---|
| Figure of N distribution | 2801 | 2802 | 2803 | 2804 | 2805 | 2806 | 2807 |
| 2901 | 11-1E | 12-1E | 13-1E | 14-1E | 15-1E | 16-1E | 17-1E |
| 2902 | 11-2E | 12-2E | 13-2E | 14-2E | 15-2E | 16-2E | 17-2E |
| 2903 | 11-3E | 12-3E | 13-3E | 14-3E | 15-3E | 16-3E | 17-3E |
| 2904 | 11-4E | 12-4E | 13-4E | 14-4E | 15-4E | 16-4E | 17-4E |
| 2905 | 11-5E | 12-5E | 13-5E | 14-5E | 15-5E | 16-5E | 17-5E |
| 2906 | 11-6E | 12-6E | 13-6E | 14-6E | 15-6E | 16-6E | 17-6E |

TABLE 3E

| Layer constitution | | Gases employed | Flow rate (SCCM) | Flow rate ratio | Discharging power (W/cm²) | Layer formation rate (Å/sec) | Layer thickness (μ) |
|---|---|---|---|---|---|---|---|
| Layer (I) | First layer region (G) | SiH₄/He = 0.5 GeH₄/He = 0.5 NH₃ B₂H₆/He = 10⁻³ | SiH₄ + GeH₄ = 200 | $\frac{GeH_4}{SiH_4 + GeH_4}$ = (*) $\frac{NH_3}{SiH_4 + NH_3}$ = (**) $\frac{B_2H_6}{SiH_4 + GeH_4}$ = 3 × 10⁻³ | 0.18 | 15 | 3 |
| | Second layer region (S) | SiH₄/He = 0.5 NH₃ | SiH₄ = 200 | $\frac{NH_3}{SiH_4 + NH_3}$ = (**) | 0.18 | 15 | 25 |
| Layer (II) | | SiH₄/He = 0.5 C₂H₄ | SiH₄ = 100 | SiH₄/C₂H₄ = 3/7 | 0.18 | 10 | 0.5 |

(*), (**) ... Flow rate ratio was changed by automatically controlling the valve opening according to the predetermined flow rate changed curve.

TABLE 4E

| | Figure of Ge distribution Sample No. | | | | | | |
|---|---|---|---|---|---|---|---|
| Figure of N distribution | 2801 | 2802 | 2803 | 2804 | 2805 | 2806 | 2807 |
| 2901 | 21-1E | 22-1E | 23-1E | 24-1E | 25-1E | 26-1E | 27-1E |
| 2902 | 21-2E | 22-2E | 23-2E | 24-2E | 25-2E | 26-2E | 27-2E |
| 2903 | 21-3E | 22-3E | 23-3E | 24-3E | 25-3E | 26-3E | 27-3E |
| 2904 | 21-4E | 22-4E | 23-4E | 24-4E | 25-4E | 26-4E | 27-4E |
| 2905 | 21-5E | 22-5E | 23-5E | 24-5E | 25-5E | 26-5E | 27-5E |
| 2906 | 21-6E | 22-6E | 23-6E | 24-6E | 25-6E | 26-6E | 27-6E |

TABLE 5E

| Layer constitution | | Gases employed | Flow rate (SCCM) | Flow rate ratio | Discharging power (W/cm²) | Layer formation rate (Å/sec) | Layer thickness (μ) |
|---|---|---|---|---|---|---|---|
| Layer (I) | First layer region | SiH₄/He = 0.5 GeF₄/He = 0.5 NH₃ B₂H₆/He = 1 × 10⁻³ | SiH₄ + GeF₄ = 200 | $\frac{GeH_4}{SiH_4 + GeH_4}$ = (*) $\frac{NH_3}{SiH_4 + NH_3}$ = (**) $\frac{B_2H_6}{SiH_4 + GeH_4}$ = 3 × 10⁻³ | 0.18 | 15 | 2.5 |
| | Second layer region | SiH₄/He = 0.5 NH₃ GeF₄/He = 0.5 | SiH₄ + GeF₄ = 200 | $\frac{GeH_4}{SiH_4 + GeH_4}$ = (*) $\frac{NH_3}{SiH_4 + NH_3}$ = (**) | 0.18 | 15 | 0.5 |
| | Third layer region | SiH₄/He = 0.5 NH₃ | SiH₄ = 200 | $\frac{NH_3}{SiH_4 + NH_3}$ = (**) | 0.18 | 15 | 25 |
| Layer (II) | | SiH₄/He = 0.5 C₂H₄ | SiH₄ = 100 | SiH₄/C₂H₄ = 3/7 | 0.18 | 10 | 0.5 |

TABLE 5E-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| | C$_2$H$_4$ | | | | | |

(*), (**) ... Flow rate ratio was changed by automatically controlling the valve opening according to the predetermined flow rate changed curve.

TABLE 6E

| | Figure of Ge distribution Sample No. | | | | | | |
|---|---|---|---|---|---|---|---|
| Figure of N distribution | 2801 | 2802 | 2803 | 2804 | 2805 | 2806 | 2807 |
| 2901 | 31-1E | 32-1E | 33-1E | 34-1E | 35-1E | 36-1E | 37-1E |
| 2902 | 31-2E | 32-2E | 33-2E | 34-2E | 35-2E | 36-2E | 37-2E |
| 2903 | 31-3E | 32-3E | 33-3E | 34-3E | 35-3E | 36-3E | 37-3E |
| 2904 | 31-4E | 32-4E | 33-4E | 34-4E | 35-4E | 36-4E | 37-4E |
| 2905 | 31-5E | 32-5E | 33-5E | 35-5E | 35-5E | 36-5E | 37-5E |
| 2906 | 31-6E | 32-6E | 33-6E | 34-6E | 35-6E | 36-6E | 37-6E |

TABLE 7E

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer region | SiF$_4$/He = 0.5<br>GeF$_4$/He = 0.5<br>NH$_3$<br>H$_2$<br>B$_2$H$_6$/He = 10$^{-3}$ | SiF$_4$ + GeF$_4$ = 200 | $\frac{GeF_4}{H_2 + SiF_4 + GeF_4} = (*)$<br>$\frac{NH_3}{SiF_4 + NH_3} = (**)$<br>$\frac{B_2H_6}{SiF_4 + GeH_4} = 3 \times 10^{-3}$ | 0.18 | 15 | 2.5 |
| | Second layer region | SiF$_4$/He = 0.5<br>NH$_3$<br>H$_2$<br>GeF$_4$/He = 0.5 | SiF$_4$ + GeF$_4$ = 200 | $\frac{GeF_4}{H_2 + SiF_4 + GeF_4} = (*)$<br>$\frac{NH_3}{SiF_4 + NH_3} = (**)$ | 0.18 | 15 | 0.5 |
| | Third layer region | SiF$_4$/He = 0.5<br>H$_2$<br>NH$_3$ | SiF$_4$ = 200 | $\frac{NH_3}{SiF_4 + NH_3} = (**)$ | 0.18 | 15 | 25 |
| Layer (II) | | SiH$_4$/He = 0.5<br>C$_2$H$_4$ | SiH$_4$ = 100 | SiH$_4$/C$_2$H$_4$ = 3/7 | 0.18 | 10 | 0.5 |

(*), (**) ... Flow rate ratio was changed by automatically controlling the valve opening according to the predetermined flow rate changed curve.

TABLE 8E

| | Figure of Ge distribution Sample No. | | | | | | |
|---|---|---|---|---|---|---|---|
| Figure of N distribution | 2801 | 2802 | 2803 | 2804 | 2805 | 2806 | 2807 |
| 2901 | 41-1E | 42-1E | 43-1E | 44-1E | 45-1E | 46-1E | 47-1E |
| 2902 | 41-2E | 42-2E | 43-3E | 44-2E | 45-2E | 46-2E | 47-2E |
| 2903 | 41-3E | 42-3E | 43-3E | 44-3E | 45-3E | 46-3E | 47-3E |
| 2904 | 41-4E | 42-4E | 43-4E | 44-4E | 45-4E | 46-4E | 47-4E |
| 2905 | 41-5E | 42-5E | 43-5E | 44-5E | 45-5E | 46-5E | 47-5E |
| 2906 | 41-6E | 42-6E | 43-6E | 44-6E | 45-6E | 46-6E | 47-6E |

TABLE 9E

| Conditions | Gases employed | Flow rate (SCCM) | Flow rate ratio or area ratio | Discharging power (W/cm$^2$) | Layer thickness ($\mu$) |
|---|---|---|---|---|---|
| 5-1E | Ar | 200 | Si wafer:graphite = 1.5:8.5 | 0.3 | 0.5 |
| 5-2E | Ar | 200 | Si wafer:graphite = 0.5:9.5 | 0.3 | 0.3 |
| 5-3E | Ar | 200 | Si wafer:graphite = 6.4 | 0.3 | 1.0 |
| 5-4E | SiH$_4$/He = 1<br>C$_2$H$_4$ | SiH$_4$ = 15 | SiH$_4$:C$_2$H$_4$ = 0.4:9.6 | 0.18 | 0.3 |
| 5-5E | SiH$_4$/He = 0.5<br>C$_2$H$_4$ | SiH$_4$ = 100 | SiH$_4$:C$_2$H$_4$ = 5:5 | 0.18 | 1.5 |
| 5-6E | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 1.5:1.5:7 | 0.18 | 0.5 |
| 5-7E | SiH$_4$/He = 0.5<br>SiF$_4$/He = 0.5<br>C$_2$H$_4$ | SiH$_4$ + SiF$_4$ = 15 | SiH$_4$:SiF$_4$:C$_2$H$_4$ = 0.3:0.1:9.6 | 0.18 | 0.3 |
| 5-8E | SiH$_4$/He = 0.5<br>SiF$_4$/He = 0.5 | SiH$_4$ + SiF$_4$ = 150 | SiH$_4$:SiF$_4$:C$_2$H$_4$ = 3:3:4 | 0.18 | 1.5 |

TABLE 9E-continued

| Conditions | Gases employed | Flow rate (SCCM) | Flow rate ratio or area ratio | Discharging power (W/cm$^2$) | Layer thickness ($\mu$) |
|---|---|---|---|---|---|
| | C$_2$H$_4$ | | | | |

TABLE 10E

| Layer (II) formation conditions | Sample No./Evaluation | | |
|---|---|---|---|
| 5-1E | 11-1-1E ○ ○ | 12-1-1E ○ ○ | 13-1-1E ○ ○ |
| 5-2E | 11-1-2E ○ ○ | 12-1-2E ○ ○ | 13-1-2E ○ ○ |
| 5-3E | 11-1-3E ○ ○ | 12-1-3E ○ ○ | 13-1-3E ○ ○ |
| 5-4E | 11-1-4E ⊙ ⊙ | 12-1-4E ⊙ ⊙ | 13-1-4E ⊙ ⊙ |
| 5-5E | 11-1-5E ⊙ ⊙ | 12-1-5E ⊙ ⊙ | 13-1-5E ⊙ ⊙ |
| 5-6E | 11-1-6E ⊙ ⊙ | 12-1-6E ⊙ ⊙ | 13-1-6E ⊙ ⊙ |
| 5-7E | 11-1-7E ○ ○ | 12-1-7E ○ ○ | 13-1-7E ○ ○ |
| 5-8E | 11-1-8E ○ ○ | 12-1-8E ○ ○ | 13-1-8E ○ ○ |

Overall image evaluation / Durability evaluation

Evaluation standard:
⊙ Excellent
○ Good

TABLE 11E

| Sample No. | 1301E | 1302E | 1303E | 1304E | 1305E | 1306E | 1307E |
|---|---|---|---|---|---|---|---|
| Si:C Target (area ratio) | 9:1 | 6.5:3.5 | 4:6 | 2:8 | 1:9 | 0.5:9.5 | 0.2:9.8 |
| Si:C (content ratio) | 9.7:0.3 | 8.8:1.2 | 7.3:2.7 | 4.8:5.2 | 3:7 | 2:8 | 0.8:9.2 |
| Image evaluation | Δ | ○ | ⊙ | ⊙ | ○ | Δ | X |

⊙: Very good
○: Good
Δ: Practically satisfactory
X: Image defect formed

TABLE 12E

| Sample No. | 1401E | 1402E | 1403E | 1404E | 1405E | 1406E | 1407E | 1408E |
|---|---|---|---|---|---|---|---|---|
| SiH:C$_2$H$_4$ (Flow rate ratio) | 9:1 | 6:4 | 4:6 | 2:8 | 1:9 | 0.5:9.5 | 0.35:9.65 | 0.2:9.8 |
| Si:C (Content ratio) | 9:1 | 7:3 | 5.5:4.5 | 4:6 | 3:7 | 2:8 | 1.2:8.8 | 0.8:9.2 |
| Image evaluation | Δ | ○ | ⊙ | ⊙ | ⊙ | ○ | Δ | X |

○ : Very good
○ : Good
Δ: Practically satisfactory
X: Image defect formed

TABLE 13E

| Sample No. | 1501E | 1502E | 1503E | 1504E | 1505E | 1506E | 1507E | 1508E |
|---|---|---|---|---|---|---|---|---|
| SiH$_4$:SiF$_4$:C$_2$H$_4$ (Flow rate ratio) | 5.4:1 | 3:3.5:3:5 | 2:2:6 | 1:1:8 | 0.6:0.4:9 | 0.2:0.3:9.5 | 0.2:0.15:9.65 | 0.1:0.1:9.8 |
| Si:C (Content ratio) | 9:1 | 7:3 | 5.5:4.5 | 4:6 | 3:7 | 2:8 | 1.2:8.8 | 0.8:9.2 |
| Image evaluation | Δ | ○ | ⊙ | ⊙ | ⊙ | ○ | Δ | X |

○: Very good
○ : Good
Δ: Practically satisfactory
X: Image defect formed

TABLE 14E

| Sample No. | Thickness of layer (II) ($\mu$) | Result |
|---|---|---|
| 1601E | 0.001 | Image defect liable to occur |
| 1602E | 0.02 | No image defect during 20,000 repetitions |
| 1603E | 0.05 | Stable for 50,000 repetitions |
| 1604E | 1 | Stable for 200,000 repetitions |

TABLE 1F

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer region (G) | SiH$_4$/He = 0.5 GeH$_4$/He = 0.5 NH$_3$ | SiH$_4$ + GeH$_4$ = 200 | $\frac{GeH_4}{SiH_4 + GeH_4}$ = (*)  $\frac{NH_3}{SiH_4 + NH_3}$ = (**) | 0.18 | 15 | 3 |

TABLE 1F-continued

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| | Second layer region (S) | SiH$_4$/He = 0.5<br>NH$_3$ | SiH$_4$ = 200 | $\frac{NH_3}{SiH_4 + NH_3}$ = (**) | 0.18 | 15 | 25 |
| Layer (II) | | SiH$_4$/He = 0.5<br>NO | SiH$_4$ = 100 | SiH$_4$/NO = 3/7 | 0.18 | 10 | 0.5 |

(*), (**) ... Flow rate ratio was changed by automatically controlling the valve opening according to the predetermined flow rate changed curve.

TABLE 2F

| | Figure of Ge distribution Sample No. | | | | | | |
|---|---|---|---|---|---|---|---|
| Figure of N distribution | 2801 | 2802 | 2803 | 2804 | 2805 | 2806 | 2807 |
| 2901 | 11-1F | 12-1F | 13-1F | 14-1F | 15-1F | 16-1F | 17-1F |
| 2902 | 11-2F | 12-2F | 13-2F | 14-2F | 15-2F | 16-2F | 17-2F |
| 2903 | 11-3F | 12-3F | 13-3F | 14-3F | 15-3F | 16-3F | 17-3F |
| 2904 | 11-4F | 12-4F | 13-4F | 14-4F | 15-4F | 16-4F | 17-4F |
| 2905 | 11-5F | 12-5F | 13-5F | 14-5F | 15-5F | 16-5F | 17-5F |
| 2906 | 11-6F | 12-6F | 13-6F | 14-6F | 15-6F | 16-6F | 17-6F |

TABLE 3F

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer region (G) | SiH$_4$/He = 0.5<br>GeH$_4$/He = 0.5<br>NH$_3$<br>B$_2$H$_6$/He = 10$^{-3}$ | SiH$_4$ + GeH$_4$ = 200 | $\frac{GeH_4}{SiH_4 + GeH_4}$ = (*)<br>$\frac{NH_3}{SiH_4 + NH_3}$ = (**)<br>$\frac{B_2H_6}{SiH_4 + GeH_4}$ = 3 × 10$^{-3}$ | 0.18 | 15 | 3 |
| | Second layer region (S) | SiH$_4$/He = 0.5<br>NH$_3$ | SiH$_4$ = 200 | $\frac{NH_3}{SiH_4 + NH_3}$ = (**) | 0.18 | 15 | 25 |
| Layer (II) | | SiH$_4$/He = 0.5<br>NO | SiH$_4$ = 100 | SiH$_4$/NO = 3/7 | 0.18 | 10 | 0.5 |

(*), (**) ... Flow rate ratio was changed by automatically controlling the valve opening according to the predetermined flow rate changed curve.

TABLE 4F

| | Figure of Ge distribution Sample No. | | | | | | |
|---|---|---|---|---|---|---|---|
| Figure of N distribution | 2801 | 2802 | 2803 | 2804 | 2805 | 2806 | 2807 |
| 2901 | 21-1F | 22-1F | 23-1F | 24-1F | 25-1F | 26-1F | 27-1F |
| 2902 | 21-2F | 22-2F | 23-2F | 24-2F | 25-2F | 26-2F | 27-2F |
| 2903 | 21-3F | 22-3F | 23-3F | 24-3F | 25-3F | 26-3F | 27-3F |
| 2904 | 21-4F | 22-4F | 23-4F | 24-4F | 25-4F | 26-4F | 27-4F |
| 2905 | 21-5F | 22-5F | 23-5F | 24-5F | 25-5F | 26-5F | 27-5F |
| 2906 | 21-6F | 22-6F | 23-6F | 24-6F | 25-6F | 26-6F | 27-6F |

TABLE 5F

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer region | SiH$_4$/He = 0.5<br>GeF$_4$/He = 0.5<br>NH$_3$<br>B$_2$H$_6$/He = 1 × 10$^{-3}$ | SiH$_4$ + GeF$_4$ = 200 | $\frac{GeH_4}{SiH_4 + GeH_4}$ = (*)<br>$\frac{NH_3}{SiH_4 + NH_3}$ = (**)<br>$\frac{B_2H_6}{SiH_4 + GeH_4}$ = 3 × 10$^{-3}$ | 0.18 | 15 | 2.5 |
| | Second layer region | SiH$_4$/He = 0.5<br>NH$_3$<br>GeF$_4$/He = 0.5 | SiH$_4$ + GeF$_4$ = 200 | $\frac{GeH_4}{SiH_4 + GeH_4}$ = (*)<br>$\frac{NH_3}{SiH_4 + NH_3}$ = (**) | 0.18 | 15 | 0.5 |
| | Third layer region | SiH$_4$/He = 0.5<br>NH$_3$ | SiH$_4$ = 200 | $\frac{NH_3}{SiH_4 + NH_3}$ = (**) | 0.18 | 15 | 25 |
| Layer (II) | | SiH$_4$/He = 0.5<br>NO | SiH$_4$ = 100 | SiH$_4$/NO = 3/7 | 0.18 | 10 | 0.5 |

TABLE 5F-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| | NO | | | | | |

(*), (**) ... Flow rate ratio was changed by automatically controlling the valve opening according to the predetermined flow rate changed curve.

TABLE 6F

| Figure of N distribution | Figure of Ge distribution Sample No. | | | | | | |
|---|---|---|---|---|---|---|---|
| | 2801 | 2802 | 2803 | 2804 | 2805 | 2806 | 2807 |
| 2901 | 31-1F | 32-1F | 33-1F | 34-1F | 35-1F | 36-1F | 37-1F |
| 2902 | 31-2F | 32-2F | 33-2F | 34-2F | 35-2F | 36-2F | 37-2F |
| 2903 | 31-3F | 32-3F | 33-3F | 34-3F | 35-3F | 36-3F | 37-3F |
| 2904 | 31-4F | 32-4F | 33-4F | 34-4F | 35-4F | 36-4F | 37-4F |
| 2905 | 31-5F | 32-5F | 33-5F | 34-5F | 35-5F | 36-5F | 37-5F |
| 2906 | 31-6F | 32-6F | 33-6F | 34-6F | 35-6F | 36-6F | 37-6F |

TABLE 7F

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer region | SiF$_4$/He = 0.5<br>GeF$_4$/He = 0.5<br>NH$_3$<br>H$_2$<br>B$_2$H$_6$/He = 10$^{-3}$ | SiF$_4$ +<br>GeF$_4$ = 200 | $\frac{GeF_4}{H_2 + SiF_4 + GeF_4}$ = (*)<br>$\frac{NH_3}{SiF_4 + NH_3}$ = (**)<br>$\frac{B_2H_6}{SiF_4 + GeF_4}$ = 3 × 10$^{-3}$ | 0.18 | 15 | 2.5 |
| | Second layer region | SiF$_4$/He = 0.5<br>NH$_3$<br>H$_2$<br>GeF$_4$/He = 0.5 | SiF$_4$ +<br>GeF$_4$ = 200 | $\frac{GeF_4}{H_2 + SiF_4 + GeF_4}$ = (*)<br>$\frac{NH_3}{SiF_4 + NH_3}$ = (**) | 0.18 | 15 | 0.5 |
| | Third layer region | SiF$_4$/He = 0.5<br>N$_2$<br>NH$_3$ | SiF$_4$ = 200 | $\frac{NH_3}{SiF_4 + NH_3}$ = (**) | 0.18 | 15 | 25 |
| Layer (II) | | SiH$_4$/He = 0.5<br>NO | SiF$_4$ = 100 | SiH$_4$/NO = 3/7 | 0.18 | 10 | 0.5 |

(*), (**) ... Flow rate ratio was changed by automatically controlling the valve opening according to the predetermined flow rate changed curve.

TABLE 8F

| Figure of N distribution | Figure of Ge distribution Sample No. | | | | | | |
|---|---|---|---|---|---|---|---|
| | 2801 | 2802 | 2803 | 2804 | 2805 | 2806 | 2807 |
| 2901 | 41-1F | 42-1F | 43-1F | 44-1F | 45-1F | 46-1F | 47-1F |
| 2902 | 41-2F | 42-2F | 43-2F | 44-2F | 45-2F | 46-2F | 47-2F |
| 2903 | 41-3F | 42-3F | 43-3F | 44-3F | 45-3F | 46-3F | 47-3F |
| 2904 | 41-4F | 42-4F | 43-4F | 44-4F | 45-4F | 46-4F | 47-4F |
| 2905 | 41-5F | 42-5F | 43-5F | 44-5F | 45-5F | 46-5F | 47-5F |
| 2906 | 41-6F | 42-6F | 43-6F | 44-6F | 45-6F | 46-6F | 47-6F |

TABLE 9F

| Conditions | Gases employed | Flow rate (SCCM) | Flow rate ratio or area ratio | Discharging power (W/cm$^2$) | Layer thickness ($\mu$) |
|---|---|---|---|---|---|
| 5-1F | Ar | 200 | Si wafer:SiO$_2$ = 1:30 | 0.3 | 0.5 |
| 5-2F | Ar | 200 | Si wafer:SiO$_2$ = 1:60 | 0.3 | 0.3 |
| 5-3F | Ar | 200 | Si wafer:SiO$_2$ = 6:4 | 0.3 | 1.0 |
| 5-4F | SiH$_4$/He = 1<br>NO | SiH$_4$ = 15 | SiH$_4$:NO = 5:1 | 0.18 | 0.3 |
| 5-5F | SiH$_4$/He = 0.5<br>NO | SiH$_4$ = 100 | SiH$_4$:NO = 1:1 | 0.18 | 1.5 |
| 5-6F | SiH$_4$/He = 0.5<br>SiF$_4$/He = 0.5<br>NO | SiH$_4$ + SiF$_4$ = 150 | SiH$_4$:SiF$_4$:NO = 1:1:1 | 0.18 | 0.5 |
| 5-7F | SiH$_4$/He = 0.5<br>SiF$_4$/He = 0.5<br>NO | SiH$_4$ + SiF$_4$ = 15 | SiH$_4$:SiF$_4$:NO = 2:1:4 | 0.18 | 0.3 |
| 5-8F | SiH$_4$/He = 0.5<br>SiF$_4$/He = 0.5 | SiH$_4$ + SiF$_4$ = 150 | SiH$_4$:SiF$_4$:NO = 1:1:3 | 0.18 | 1.5 |

TABLE 9F-continued

| Conditions | Gases employed | Flow rate (SCCM) | Flow rate ratio or area ratio | Discharging power (W/cm$^2$) | Layer thickness ($\mu$) |
|---|---|---|---|---|---|
| | NO | | | | |

TABLE 10F

| Layer (II) formation conditions | Sample No./Evaluation | | |
|---|---|---|---|
| 5-1F | 11-1-1F ○ ○ | 12-1-1F ○ ○ | 13-1-1F ○ ○ |
| 5-2F | 11-1-2F ○ ○ | 12-1-2F ○ ○ | 13-1-2F ○ ○ |
| 5-3F | 11-1-3F ○ ○ | 12-1-3F ○ ○ | 13-1-3F ○ ○ |
| 5-4F | 11-1-4F ◉ ◉ | 12-1-4F ◉ ◉ | 13-1-4F ◉ ◉ |
| 5-5F | 11-1-5F ◉ ◉ | 12-1-5F ◉ ◉ | 13-1-5F ◉ ◉ |
| 5-6F | 11-1-6F ◉ ◉ | 12-1-6F ◉ ◉ | 13-1-6F ◉ ◉ |
| 5-7F | 11-1-7F ○ ○ | 12-1-7F ○ ○ | 13-1-7F ○ ○ |
| 5-8F | 11-1-8F ○ ○ | 12-1-8F ○ ○ | 13-1-8F ○ ○ |

Sample No.
Overall image evaluation    Durability evaluation
Evaluation standard:
◉ Excellent
○ Good

TABLE 11F

| Sample No. | 1301F | 1302F | 1303F | 1304F | 1305F | 1306F | 1307F |
|---|---|---|---|---|---|---|---|
| Si:SiO$_2$ Target (area ratio) | 9:1 | 6.5:3.5 | 4:10 | 2:60 | 1:100 | 1:100 | 1:100 |
| (NO/Ar) | (0/1) | (1/1) | (1/1) | (1/1) | (2/1) | (3/1) | (4/1) |
| Si:O (content ratio) | 9.7:0.3 | 8.8:1.2 | 7.3:2.7 | 5.0:5.0 | 4.5:5.5 | 4:6 | 3:7 |
| Image evaluation | Δ | ◉ | ◉ | ○ | ○ | Δ | X |

◉: Very good
○: Good
Δ: Practically satisfactory
X: Image defect formed

TABLE 12F

| Sample No. | 1401F | 1402F | 1403F | 1404F | 1405F | 1406F | 1407F |
|---|---|---|---|---|---|---|---|
| SiH$_4$:NO (Flow rate ratio) | 1000:1 | 99:1 | 5:1 | 1:1 | 1:2 | 3:10 | 1:1000 |
| Si:O (Content ratio) | 9.9999:0.0001 | 9.9:0.1 | 9:1 | 6:4 | 5:5 | 3.3:6.7 | 2:8 |
| Image evaluation | Δ | ○ | ◉ | ◉ | ○ | Δ | X |

◉: Very good
○: Good
Δ: Practically satisfactory
X: Image defect formed

TABLE 13F

| Sample No. | 1501F | 1502F | 1503F | 1504F | 1505F | 1506F | 1507F |
|---|---|---|---|---|---|---|---|
| SiH$_4$:SiF$_4$:NO (Flow rate ratio) | 500:400:1 | 50:50:1 | 5:5:2 | 5:5:10 | 1:1:4 | 3:3:20 | 1:1:2000 |
| Si:O (Content ratio) | 9.9998:0.0002 | 9.8:0.2 | 8.8:1.2 | 6.3:3.7 | 5.1:4.9 | 3.5:6.5 | 2.3:7.7 |
| Image evaluation | Δ | ○ | ◉ | ◉ | ○ | Δ | X |

◉: Very good
○: Good
Δ: Practically satisfactory
X: Image defect formed

TABLE 14F

| Sample No. | Thickness of layer (II) ($\mu$) | Result |
|---|---|---|
| 1601F | 0.001 | Image defect liable to occur |
| 1602F | 0.02 | No image defect during 20,000 repetitions |
| 1603F | 0.05 | Stable for 50,000 repetitions |
| 1604F | 1 | Stable for 200,000 repetitions |

What we claim is:

1. A photoconductive member comprising a substrate for a photoconductive member and a light receiving layer having photoconductivity comprising an amorphous material containing silicon atoms and germanium atoms, the light receiving layer containing nitrogen atoms and having a first layer region (1), a third layer region (S), and a second layer region (2) of nitrogen atom distribution concentrations C(1), C(3), and C(2), respectively, in the layer thickness direction, in that order from the substrate side to the opposite side, wherein C(3) is higher than any of C(2) and C(1) and one of C(1) and C(2) is not zero.

2. The photoconductive member of claim 1, wherein the light receiving layer contains hydrogen atoms.

3. The photoconductive member of claim 1, wherein the light receiving layer contains halogen atoms.

4. The photoconductive member of claim 1, wherein the distribution of germanium atoms in the light receiving layer is nonuniform in the layer thickness direction.

5. The photoconductive member of claim 1, wherein the distribution of germanium atoms in the light receiving layer is uniform in the layer thickness direction.

6. The photoconductive member of claim 1, wherein the light receiving layer contains a p-type or n-type impurity (C) which controls electroconductive properties.

7. The photoconductive member of claim 6, wherein the p-type or n-type impurity (C) controlling electroconductive properties is atoms of group IIIA of the periodic table.

8. The photoconductive member of claim 6, wherein the p-type or n-type impurity (C) controlling electroconductive properties is atoms of group VA in the periodic table.

9. The photoconductive member of claim 1, wherein the thickness of the first layer region is 0.003–100$\mu$.

10. The photoconductive member of claim 1, wherein the thickness of the second layer region is 0.003–100$\mu$.

11. The photoconductive member of claim 1, wherein the thickness of the third layer region is 0.003–80$\mu$.

12. The photoconductive member of claim 1, wherein the distribution concentration C(3) is not more than 67 atomic % based on the total quantity T(Si Ge N) of silicon germanium, and nitrogen atoms.

13. The photoconductive member of claim 1, wherein the content of germanium atoms in the amorphous material is $1-9.5 \times 10^5$ atomic ppm based on the total quantity of silicon atoms and germanium atoms.

14. The photoconductive member of claim 1, wherein the content of nitrogen atoms in a layer region (N) containing nitrogen atoms is 0.001–50 atomic % based on the total quantity of silicon, germanium and nitrogen atoms.

15. The photoconductive member of claim 6, wherein the content of the p-type or n-type impurity (C) controlling electroconductive properties is $0.01-5 \times 10^4$ atomic ppm.

16. The photoconductive member of claim 6, wherein the p-type or n-type impurity (C) controlling electroconductive properties is more contained at the substrate side interfacial part of the light receiving layer.

17. A photoconductive member comprising a substrate for a photoconductive member and a light receiving layer composed of a layer (G) which, provided on the substrate, comprises an amorphous material containing germanium atoms and a layer (S) having photoconductivity which, provided on the layer (G), comprises an amorphous material containing silicon atoms, the light receiving layer containing nitrogen atoms and having a first layer region (1), a third layer region (3), and a second layer region (2) of nitrogen atoms distribution concentrations C(1), C(3), and C(2), respectively, in the thickness direction, in that order from the substrate side to the opposite side, wherein C(3) is higher than any of C(2) and C(1) and one of C(1) and C(2) is not zero.

18. The photoconductive member of claim 17, wherein at least one of the layers (S) and (G) contains hydrogen atoms.

19. The photoconductive member of claim 17, wherein at least one of the layers (S) and (G) contains halogen atoms.

20. The photoconductive member of claim 17, wherein the distribution of germanium atoms in the layer (G) is nonuniform in the layer thickness direction.

21. The photoconductive member of claim 17, wherein the distribution of germanium atoms in the layer (G) is uniform.

22. The photoconductive member of claim 17, wherein the light receiving layer contains a p-type or n-type impurity (C) controlling electroconductive properties.

23. The photoconductive member of claim 22, wherein the p-type or n-type impurity (C) controlling electroconductive properties is atoms of group IIIA of the periodic table.

24. The photoconductive member of claim 22, wherein the p-type or n-type impurity (C) controlling electroconductive properties is atoms of groups VA of the periodic table.

25. The photoconductive member of claim 17, wherein the thickness of the first layer region is 0.003–100$\mu$.

26. The photoconductive member of claim 17, wherein the thickness of the second layer region is 0.003–100$\mu$.

27. The photoconductive member of claim 17, wherein the thickness of the third layer region is 0.003–80$\mu$.

28. The photoconductive member of claim 17, wherein the distribution concentration C(3) is not more than 67 atomic % based on the total quantity of silicon, germanium, and nitrogen atoms.

29. The photoconductive member of claim 17, wherein the content of germanium atoms is $1-9.5 \times 10^5$ atomic ppm based on the total quantity of silicon atoms and germanium atoms.

30. The photoconductive member of claim 17, wherein the content of nitrogen atoms in a layer region containing nitrogen atoms is 0.001–50 atomic % based on the total quantity of silicon, germanium, nitrogen atoms.

31. The photoconductive member of claim 22, wherein the content of the p-type or n-type impurity (C) controlling electroconductive properties is $0.01-5 \times 10^4$ atomic ppm.

32. The photoconductive member of claim 22, wherein the p-type or n-type impurity (C) controlling electroconductive properties is more contained at the substrate side of the light receiving layer.

33. A photoconductive member comprising a substrate for a photoconductive member and a light receiving layer consisting of a first layer (I) which comprises an amorphous material containing silicon atoms and germanium atoms and has photoconductivity and a second layer (II) which comprises an amorphous material containing silicon atoms and at least one species of carbon atoms and oxygen atoms, the first layer (I) containing nitrogen atoms and having a first layer region (1), a third layer region (3), and a second layer region (2) of nitrogen atom distribution concentrations C(1), C(3), and C(2), respectively, in the layer thickness direciton, in that order form the substrate side to the opposite side, wherein C(3) is higher than any of C(2) and C(1) and one of C(1) and C(2) is not zero.

34. The photoconductive member of claim 33, wherein the first layer(I) contains hydrogen atoms.

35. The photoconductive member of claim 33, wherein the first layer contains halogen atoms.

36. The photoconductive member of claim 33, wherein the distribution of germanium atoms in the first layer (I) is nonuniform in the layer thickness direction.

37. The photoconductive member of claim 33, wherein the distribution of germanium atoms in the first layer (I) is uniform in the layer thickness direction.

38. The photoconductive member of claim 33, wherein the first layer (I) contains a p-type or n-type impurity (C) controlling electroconductive properties.

39. The photoconductive member of claim 38, wherein the p-type or n-type impurity (1) controlling electroconductive properties is atoms of group IIIA of the periodic table.

40. The photoconductive member of claim 38, wherein the p-type or n-type impurity (C) controlling electroconductive properties is atoms of group VA of the periodic table.

41. The photoconductive member of claim 33, wherein the thickness of the first layer region (1) is $0.003$–$100\mu$.

42. The photoconductive member of claim 33, wherein the thickness of the second layer region (2) is $0.003$–$100\mu$.

43. The photoconductive member of claim 33, wherein the thickness of the third layer region (3) is $0.003$–$80\mu$.

44. The photoconductive member of claim 33, wherein the distribution concentration C(3) is up to 67 atomic % on the total quantity T(Si Ge N) of silicon, germanium, and nitrogen atoms.

45. The photoconductive member of claim 33, wherein the content of germanium atoms is $1$–$9.5\times10^5$ atomic ppm based on the total quantity of silicon atoms and germanium atoms.

46. The photoconductive member of claim 33, wherein the content of nitrogen atoms in a layer region (N) containing nitrogen atoms is 0.001–50 atomic % based on the total quantity T(Si Ge N) of silicon, germanium, and nitrogen atoms.

47. The photoconductive member of of claim 38, wherein the content of the p-type or n-type impurity (C) controlling electroconductive properties is $0.01$–$5\times10^4$ atomic ppm.

48. The photoconductive member of claim 38, wherein the p-type or n-type impurity (C) controlling electroconductive properties is more contained at the substrate side of the light receiving layer.

49. The photoconductive member of claim 33, wherein the thickness of the second layer (II) is $0.003$–$30\mu$.

50. The photoconductive member comprising a substrate for a photoconductive member and a light receiving layer comprising a first layer (I) laid on the substrate and a second layer (II) laid on the first layer (I), the first layer (I) comprising a first layer region (G) which, provided on the substrate, comprises an amorphous material containing germanium atoms and a second layer region (S) which, laid on the first layer region (G), comprises an amorphous material containing silicon atoms and has photoconductivity, the second layer (II) comprising an amorphous material containing silicon atoms and at least one species of carbon atoms and oxygen atoms, the first layer (I) containing nitrogen atoms and having a first layer region (1), a third layer region (3), and a second layer region (2) of nitrogen atom distribution concentrations C(1), C(3), and C(2), respectively, in the thickness direction, in that order from the substrate side to the opposite side, wherein C(3) is higher than any of C(2) and C(1) and at least one of C(1) and C(2) is not zero.

51. The photoconductive member of claim 50, wherein at least one of the first layer region (G) and the second layer region (S) contains hydrogen atoms.

52. The photoconductive member of claim 50, wherein at least one of the first layer region (G) and the second layer region (S) contains halogen atoms.

53. The photoconductive member of claim 50, wherein the distribution of germanium atoms in the first layer region (G) nonuniform in layer thickness direction.

54. The photoconductive member of claim 50, wherein the distribution of germanium atoms in the first layer region (G) is uniform.

55. The photoconductive member of claim 50, wherein the first layer (I) contains a p-type or n-type impurity (C) controlling electroconductive properties.

56. The photoconductive member of claim 55, wherein the p-type or n-type impurity (C) controlling electroconductive properties is atoms of group IIIA in the periodic table.

57. The photoconductive member of claim 55, wherein the p-type or n-type impurity (C) controlling electroconductive properties is atoms of group VA in the periodic table.

58. The photoconductive member of claim 50, wherein the thickness of the first layer region (1) is $0.003$–$100\mu$.

59. The photoconductive member of claim 50, wherein the thickness of the second layer region (2) is $0.003$–$100\mu$.

60. The photoconductive member of claim 50, wherein the thickness of the third layer region (3) is $0.003$–$100\mu$.

61. The photoconductive member of claim 50, wherein the distribution concentration C(3) is not more than 67 atomic % based on the total quantity of silicon, germanium, and nitrogen atoms.

62. The photoconductive member of claim 50, wherein the content of germanium atoms is $1$–$9.5\times10^5$ atomic ppm based on the total quantity of silicon atoms and germanium atoms.

63. The photoconductive member of claim 50, wherein the content of nitrogen atoms in a layer section (N) containing nitrogen atoms is 0.001–50 atomic % based on the total quantity of silicon, germanium, and nitrogen atoms.

64. The photoconductive member of claim 55, wherein the content of the p-type or n-type impurity (C) controlling electroconductive properties is $0.01$–$5\times10^4$ atomic ppm.

65. The photoconductive member of claim 55, wherein the p-type or n-type impurity (C) controlling electroconductive properties is more contained at the substrate side of the light receiving layer.

66. The photoconductive member of claim 50, wherein the thickness of the second layer (II) is $0.003$–$30\mu$.

67. The photoconductive member of claim 7, wherein the atoms of group IIIA of the periodic table are selected from B, Al, Ga, In and Tl.

68. The photoconductive member of claim 23, wherein the atoms of Group IIIA of the periodic table are selected from B, Al, Ga, In and Tl.

69. The photoconductive member of claim 39 wherein the atoms of group IIIA of the periodic table are selected from B, Al, Ga, In and Tl.

70. The photoconductive member of claim 56 wherein the atoms of Group IIIA of the periodic table are selected from B, Al, Ga, Tl and In.

71. The photoconductive member of claim 8, wherein the atoms of group VA of the periodic table are selected from P, As, Sb and Bi.

72. The photoconductive member of claim 24 wherein the atoms of Group VA of the periodic table are selected from P, As, Sb and Bi.

73. The photoconductive member of claim 40 wherein the atoms of Group Va of the periodic table are selected from P, As, Sb and Bi.

74. The photoconductive member of claim 57 wherein the atoms of Group VA of the periodic table are selected from P, As, Sb and Bi.

* * * * *

UNITED STATES PATENT AND TRADEMARK OFFICE
CERTIFICATE OF CORRECTION

PATENT NO. : 4,572,882
DATED : February 25, 1986    Page 1 of 4
INVENTOR(S) : KEISHI SAITOH It is certified that error appears in the above-identified patent and that said Letters Patent is hereby corrected as shown below:

COLUMN 7

Line 29, "beteen" should read --between--.

COLUMN 9

Line 11, "$C_{21}$ from to $t_9$," should read --$C_{21}$ from $T_B$ to $t_9$,--.
Line 12, "$t_{11}$," should read --$t_{10}$,--.

COLUMN 15

Line 46, "or" should read --of--.

COLUMN 19

Line 2, "$BrF_3 IF_5$," should read --$BrF_3$, $IF_5$,--.

COLUMN 21

Line 34, " "a-$Si_d C_{1-d})_e (H,X)_{1-e}$", " should read
--"a-$(Si_d C_{1-d})_e (H,X)_{1-e}$",--.

COLUMN 22

Line 19, " "a-$Si_d O_{1-d})_e (H,X)_{1-e}$", " should read
--"a-$(Si_d O_{1-d})_e (H,X)_{1-e}$",--.

COLUMN 26

Line 56, "afore-mentioned" should read --aforementioned--.

COLUMN 27

Line 26, "2522-2506" should read --2522-2526--.

UNITED STATES PATENT AND TRADEMARK OFFICE
CERTIFICATE OF CORRECTION

PATENT NO. : 4,572,882
DATED : February 25, 1986
INVENTOR(S) : KEISHI SAITOH, ET AL.

It is certified that error appears in the above-identified patent and that said Letters Patent is hereby corrected as shown below:

COLUMN 27

Line 51, "valve" should read --value--.

COLUMN 32

Line 27, "$SiH_4$ gas $SiF_4$ gas," should read --$SiH_4$ gas, $SiF_4$ gas,--.

COLUMN 36

Line 57, "EXAMPLE 23" should read --EXAMPLE 33--.
Line 62, "on cylindrical" should read --on a cylindrical--

COLUMN 37

Line 9, "13-1-1F: 24" should read --13-1-1F-13-1-8F: 24--.

COLUMN 39

Line 18, "$SiH_4$/He=0.5" should read --$SiH_4$/He=0.5--.
$C_2H_4$

COLUMN 40

Line 53, "11-1-5B" should read --11-1-5B--.

COLUMN 41

Line 35, "cc⊙c" should read --⊙c⊙⊙ --.

UNITED STATES PATENT AND TRADEMARK OFFICE
CERTIFICATE OF CORRECTION

PATENT NO. : 4,572,882
DATED : February 25, 1986          Page 3 of 4
INVENTOR(S) : KEISHI SAITOH, ET AL.

It is certified that error appears in the above-identified patent and that said Letters Patent is hereby corrected as shown below:

COLUMN 41

Line 45, "$SiH_4:C_1H_4$" should read --$SiH_4:C_2H_4$--.

COLUMN 51

Line 57, "Si wafer:graph-ite = 6.4" should read --Si wafer:graph-ite = 6:4--.

COLUMN 53

Line 32, "$SiH:C_2H_4$" should read --$SiH_4:C_2H_4$--.

COLUMN 61

Line 29, "silicon germanium," should read --silicon, germanium,--.

COLUMN 62

Line 17, "groups VA" should read --group VA--.
Line 39, "germanium, nitrogen" should read --germanium, and nitrogen--.
Line 62, "direciton," should read --direction,--.
Line 62, "form" should read --from--.
Line 68, "layer contains" should read --layer (I) contains--.

COLUMN 63

Line 11, "(1)" should read --(C)--.
Line 29, "% on" should read --% based on--.
Line 40, "of of" should read --of--.

UNITED STATES PATENT AND TRADEMARK OFFICE
CERTIFICATE OF CORRECTION

PATENT NO. : 4,572,882
DATED : February 25, 1986.   Page 4 of 4
INVENTOR(S) : KEISHI SAITOH, ET AL.

It is certified that error appears in the above-identified patent and that said Letters Patent is hereby corrected as shown below:

COLUMN 63

Line 51,   "50. The photoconductive" should read
--50. A photoconductive--.

COLUMN 64

Line 11,   "(G) nonuniform" should read --(G) is nonuniform--.

COLUMN 66

Line 4,    "Va" should read --VA--.

Signed and Sealed this

Thirty-first Day of March, 1987

Attest:

DONALD J. QUIGG

Attesting Officer   Commissioner of Patents and Trademarks